(12) United States Patent
Stone et al.

(10) Patent No.: US 10,261,263 B2
(45) Date of Patent: Apr. 16, 2019

(54) NON-LINE-OF-SIGHT OPTICAL POWER TRANSFER SYSTEM FOR LAUNCHING A SPACECRAFT INTO LOW EARTH ORBIT

(71) Applicant: Stone Aerospace, Inc., Del Valle, TX (US)

(72) Inventors: William C. Stone, Del Valle, TX (US); Bartholomew P. Hogan, Rockville, MD (US)

(73) Assignee: Stone Aerospace, Inc., Del Valle, TX (US)

( * ) Notice: Subject to any disclaimer, the term of this patent is extended or adjusted under 35 U.S.C. 154(b) by 85 days.

(21) Appl. No.: 14/723,138

(22) Filed: May 27, 2015

(65) Prior Publication Data

US 2015/0256033 A1 Sep. 10, 2015

Related U.S. Application Data

(63) Continuation of application No. 13/303,449, filed on Nov. 23, 2011, now Pat. No. 9,090,315.
(Continued)

(51) Int. Cl.
*G02B 6/36* (2006.01)
*G02B 6/42* (2006.01)
(Continued)

(52) U.S. Cl.
CPC ............ *G02B 6/3604* (2013.01); *B64D 33/00* (2013.01); *E21B 41/0085* (2013.01);
(Continued)

(58) Field of Classification Search
CPC .. G02B 6/3604; G02B 6/4268; G02B 6/4296; G02B 6/4415; G02B 6/4436;
(Continued)

(56) References Cited

U.S. PATENT DOCUMENTS

| 3,688,992 A | 9/1972 | Schallis |
| 3,753,537 A * | 8/1973 | Karpa ................. F42B 15/04 244/3.12 |

(Continued)

FOREIGN PATENT DOCUMENTS

| EP | 0325583 A4 * | 12/1989 | ............... G21B 1/23 |
| JP | 2001132542 A * | 5/2001 | |

(Continued)

OTHER PUBLICATIONS

Dughaish, Z.H., Lead telluride as a thermoelectric material for thermoelectric power generation, Physica 8: Condensed Matter, vol. 322, Issues 1-2, 2002, pp. 205-223.

(Continued)

*Primary Examiner* — Peter Radkowski
(74) *Attorney, Agent, or Firm* — Miguel Villarreal, Jr.; Gunn, Lee & Cave, P.C.

(57) ABSTRACT

An optical power transfer system for launching a spacecraft into low Earth orbit comprising a ground-based laser power generation station and a launch vehicle optically connected thereto. The generation station is capable of generating high optical power in the range of kilowatts to tens of megawatts and transferring the optical power generated to a launch vehicle to generate thrust. The generation station comprises a high power source, a chilling station, a laser, optical fiber, and at least one coupler. The launch vehicle comprises an actively cooled fiber spooler mounted thereon with a length of fiber for transmission of high optical energy circumscribing at least part thereof. The launch vehicle also contains a working fluid and fluid reservoir, a thruster assembly, an air intake and a storage chamber. In alternative embodiments, the launch vehicle may contain a beam switch assembly, multiple fiber spoolers and multiple thruster assemblies wherein at least one thruster assembly is gimbaled.

26 Claims, 34 Drawing Sheets

Related U.S. Application Data

(60) Provisional application No. 61/416,676, filed on Nov. 23, 2010.

(51) Int. Cl.

| | |
|---|---|
| *G02B 6/44* | (2006.01) |
| *H02J 7/02* | (2016.01) |
| *H02J 50/90* | (2016.01) |
| *H02J 17/00* | (2006.01) |
| *B64D 33/00* | (2006.01) |
| *E21B 41/00* | (2006.01) |
| *E21B 47/12* | (2012.01) |
| *H01L 35/30* | (2006.01) |
| *H02J 50/30* | (2016.01) |

(52) U.S. Cl.
CPC .......... *E21B 47/123* (2013.01); *G02B 6/4268* (2013.01); *G02B 6/4296* (2013.01); *G02B 6/4415* (2013.01); *G02B 6/4436* (2013.01); *G02B 6/4458* (2013.01); *H01L 35/30* (2013.01); *H02J 7/025* (2013.01); *H02J 17/00* (2013.01); *H02J 50/30* (2016.02); *H02J 50/90* (2016.02)

(58) Field of Classification Search
CPC ... G02B 6/4458; B64D 33/00; E21B 41/0085; E21B 47/123; H01L 35/30; H02J 17/00; H02J 50/30; H02J 50/90; H02J 7/025
See application file for complete search history.

(56) References Cited

U.S. PATENT DOCUMENTS

| | | | |
|---|---|---|---|
| 3,815,511 A | 5/1974 | Staal | |
| 3,825,211 A | 7/1974 | Minovitch | |
| 4,767,271 A * | 8/1988 | Catlow | F01D 5/3053 415/65 |
| 4,860,968 A * | 8/1989 | Pinson | F41G 7/32 244/3.12 |
| 5,022,603 A | 6/1991 | Maree et al. | |
| 5,039,193 A * | 8/1991 | Snow | G02B 6/262 385/25 |
| 5,044,573 A | 9/1991 | LeCompte | |
| 5,058,969 A | 10/1991 | Peterson et al. | |
| 5,074,489 A * | 12/1991 | Gamzon | B64C 37/02 136/292 |
| 5,099,144 A | 3/1992 | Sai | |
| 5,248,931 A | 9/1993 | Flesner et al. | |
| 5,260,639 A | 11/1993 | DeYoung et al. | |
| 5,310,134 A * | 5/1994 | Hsu | F41G 7/32 244/3.12 |
| 5,436,553 A | 7/1995 | Pepper et al. | |
| 5,502,356 A | 3/1996 | McGeoch | |
| 5,564,649 A * | 10/1996 | von Hoessle | F41G 7/32 102/504 |
| 5,685,505 A * | 11/1997 | Meckler | B64G 1/428 244/169 |
| 5,686,694 A | 11/1997 | Hillenbrand et al. | |
| 5,748,102 A | 5/1998 | Barron | |
| 6,167,831 B1 | 1/2001 | Watt et al. | |
| 6,223,675 B1 | 5/2001 | Watt et al. | |
| 6,257,162 B1 | 7/2001 | Watt et al. | |
| 6,262,357 B1 | 7/2001 | Johnson et al. | |
| 6,307,156 B1 | 10/2001 | Avellanet | |
| 6,390,012 B1 | 5/2002 | Watt et al. | |
| 6,407,535 B1 * | 6/2002 | Friedman | B64G 1/428 244/1 R |
| 6,411,565 B1 | 6/2002 | Sirmalis et al. | |
| 6,488,233 B1 * | 12/2002 | Myrabo | B64C 39/001 244/51 |
| 6,491,258 B1 * | 12/2002 | Boyd | B64G 1/007 244/158.1 |
| 6,534,705 B2 * | 3/2003 | Berrios | H02J 7/35 136/243 |
| 6,669,126 B1 | 12/2003 | Albert et al. | |
| 6,828,579 B2 | 12/2004 | Ghamaty et al. | |
| 6,910,658 B1 | 6/2005 | Hart et al. | |
| 6,914,343 B2 | 7/2005 | Hiller et al. | |
| 6,964,509 B2 | 11/2005 | Gozum et al. | |
| 6,968,112 B2 | 11/2005 | Zamel et al. | |
| 7,263,245 B2 | 8/2007 | Delcher et al. | |
| 7,342,170 B2 | 3/2008 | Ghamaty et al. | |
| 7,356,209 B2 | 4/2008 | Delcher et al. | |
| 7,540,265 B2 | 6/2009 | Willems et al. | |
| 7,786,419 B2 * | 8/2010 | Hyde | H02J 17/00 250/201.1 |
| 8,835,823 B2 * | 9/2014 | Hyde | H02J 17/00 250/201.1 |
| 9,328,559 B2 | 5/2016 | Schwartz | |
| 2002/0046763 A1 * | 4/2002 | Berrios | H02J 7/35 136/244 |
| 2003/0111660 A1 | 6/2003 | Ghamaty et al. | |
| 2004/0149485 A1 | 8/2004 | Edwards | |
| 2004/0163709 A1 | 8/2004 | Baugh et al. | |
| 2004/0163802 A1 | 8/2004 | Baugh et al. | |
| 2004/0182732 A1 | 9/2004 | Zamel et al. | |
| 2004/0238022 A1 | 12/2004 | Hiller et al. | |
| 2005/0028857 A1 | 2/2005 | Ghamaty et al. | |
| 2005/0126624 A1 | 6/2005 | Pellizzari | |
| 2006/0289724 A1 | 12/2006 | Skinner et al. | |
| 2007/0056262 A1 * | 3/2007 | Leach | B64G 1/405 60/204 |
| 2008/0056642 A1 | 3/2008 | Byer | |
| 2008/0134952 A1 * | 6/2008 | Tull | B63G 8/32 114/321 |
| 2008/0197238 A1 * | 8/2008 | Bae | F03H 3/00 244/171.1 |
| 2009/0086309 A1 * | 4/2009 | Moosburger | G02B 6/0008 359/326 |
| 2009/0206697 A1 | 8/2009 | Marshal et al. | |
| 2009/0251271 A1 | 10/2009 | Stelzer et al. | |
| 2009/0296746 A1 | 12/2009 | Heaton et al. | |
| 2010/0044103 A1 | 2/2010 | Moxley et al. | |
| 2010/0044106 A1 | 2/2010 | Zediker et al. | |
| 2010/0215326 A1 | 8/2010 | Zediker et al. | |
| 2010/0275576 A1 * | 11/2010 | Gutman | F02K 9/805 60/204 |
| 2012/0068086 A1 * | 3/2012 | DeWitt | E21B 7/14 250/492.1 |
| 2012/0266803 A1 | 10/2012 | Zediker et al. | |
| 2012/0298850 A1 | 11/2012 | Ford | |
| 2014/0345276 A1 | 11/2014 | Kosamana | |

FOREIGN PATENT DOCUMENTS

| | | | |
|---|---|---|---|
| JP | 2002193555 A * | 7/2002 | |
| WO | WO2012131021 A2 | 10/2012 | |

OTHER PUBLICATIONS

Hecht, Jeff, Photonic Frontiers: Photonic power delivery: Photonic power conversion delivers power via laser beams, 2006, Laser Focus World, available at https://www.laserfocusworld.com/articles/print!volume-42/issue-1/features/photonic-frontiersphotonic-power-delivery-photonic-power-conversion-delivers-power-via-laser-beams.html.

Hussein, H., A novel delivery for laser thermal recanalization, Images of the Twenty-First Century. Proceedings of the Annual International Engineering in Medicine and Biology Society, Seattle, WA, 1989, pp. 1190-1191 vol. 4.

Lorenz, R.D., Subsurface ambient thermoelectric power for moles and penetrators, 2003 IEEE Aerospace Conference Proceedings, 2003, pp. 2_637-2_642.

(56) References Cited

OTHER PUBLICATIONS

Ritz et al., Multi-mission radioisotope thermoelectric generator (MMRTG) program overview, 2004 IEEE Aerospace Conference Proceedings, 2004, pp. 2957 vol. 5.

* cited by examiner

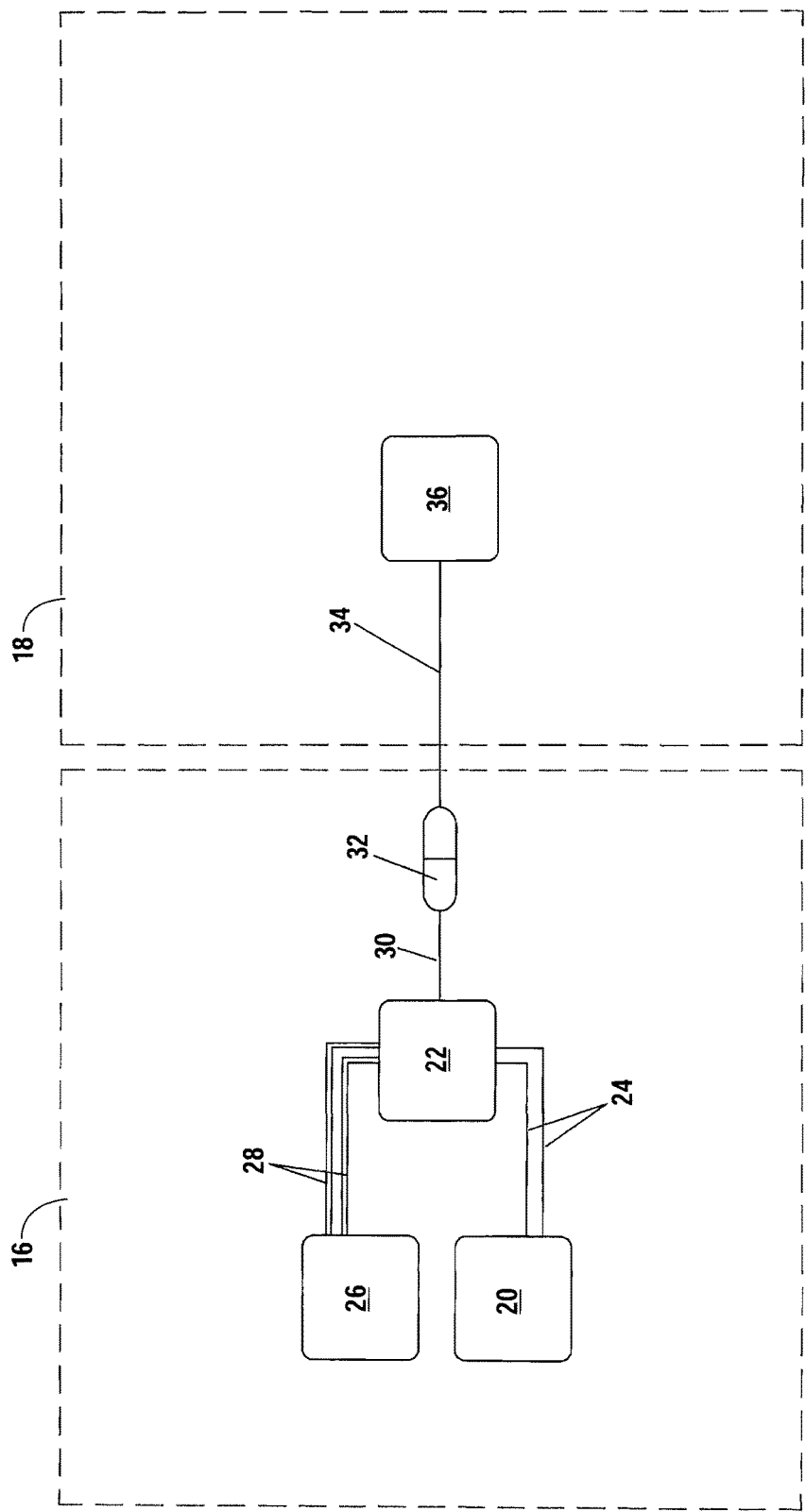

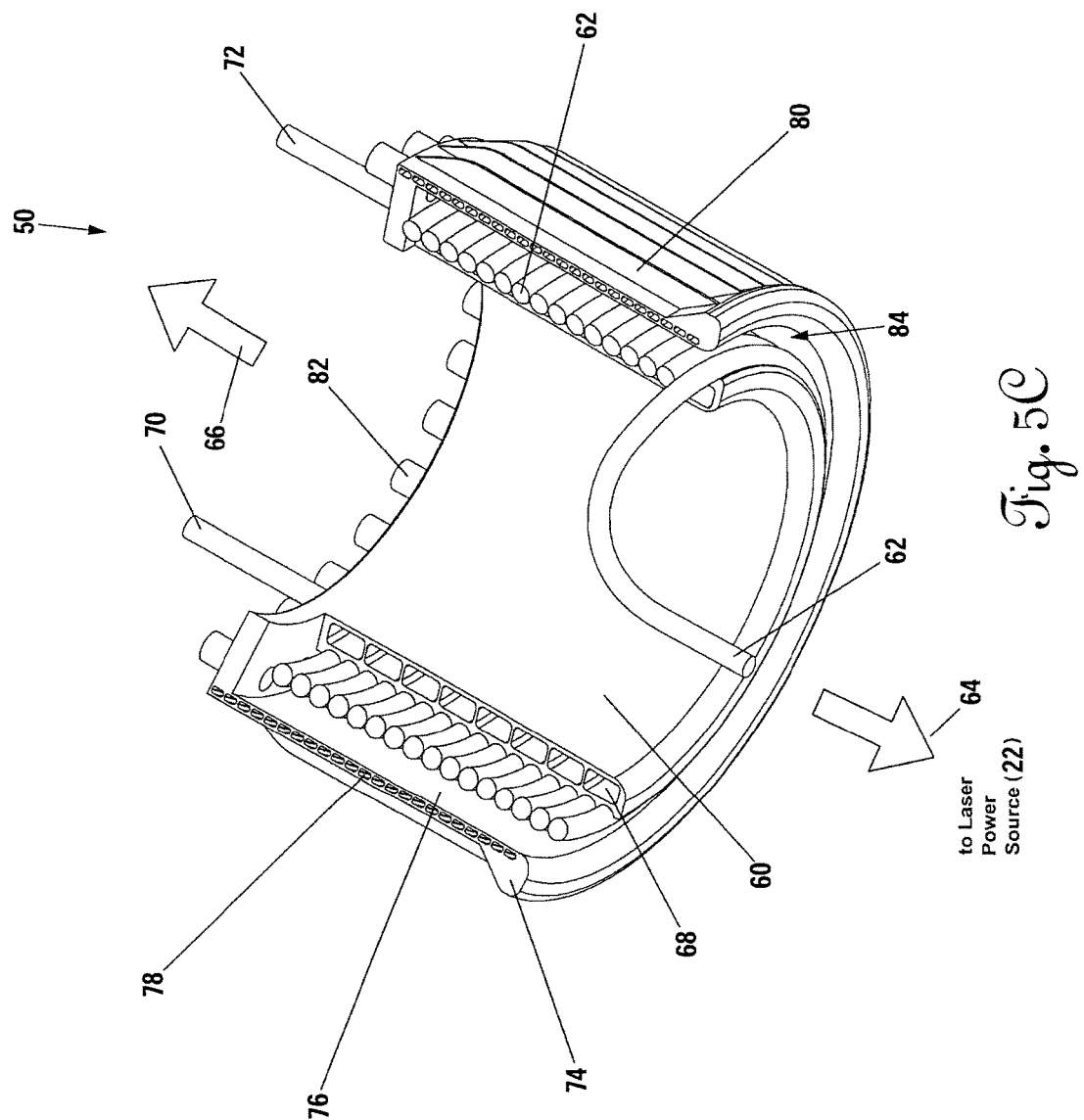

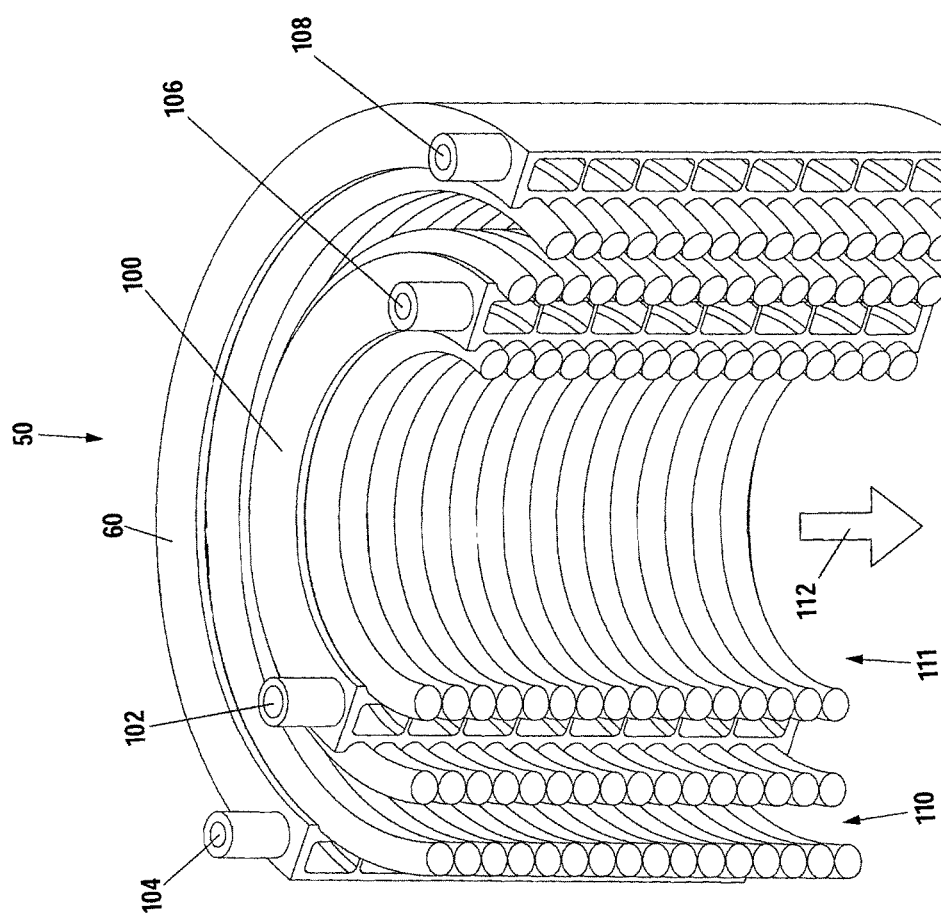

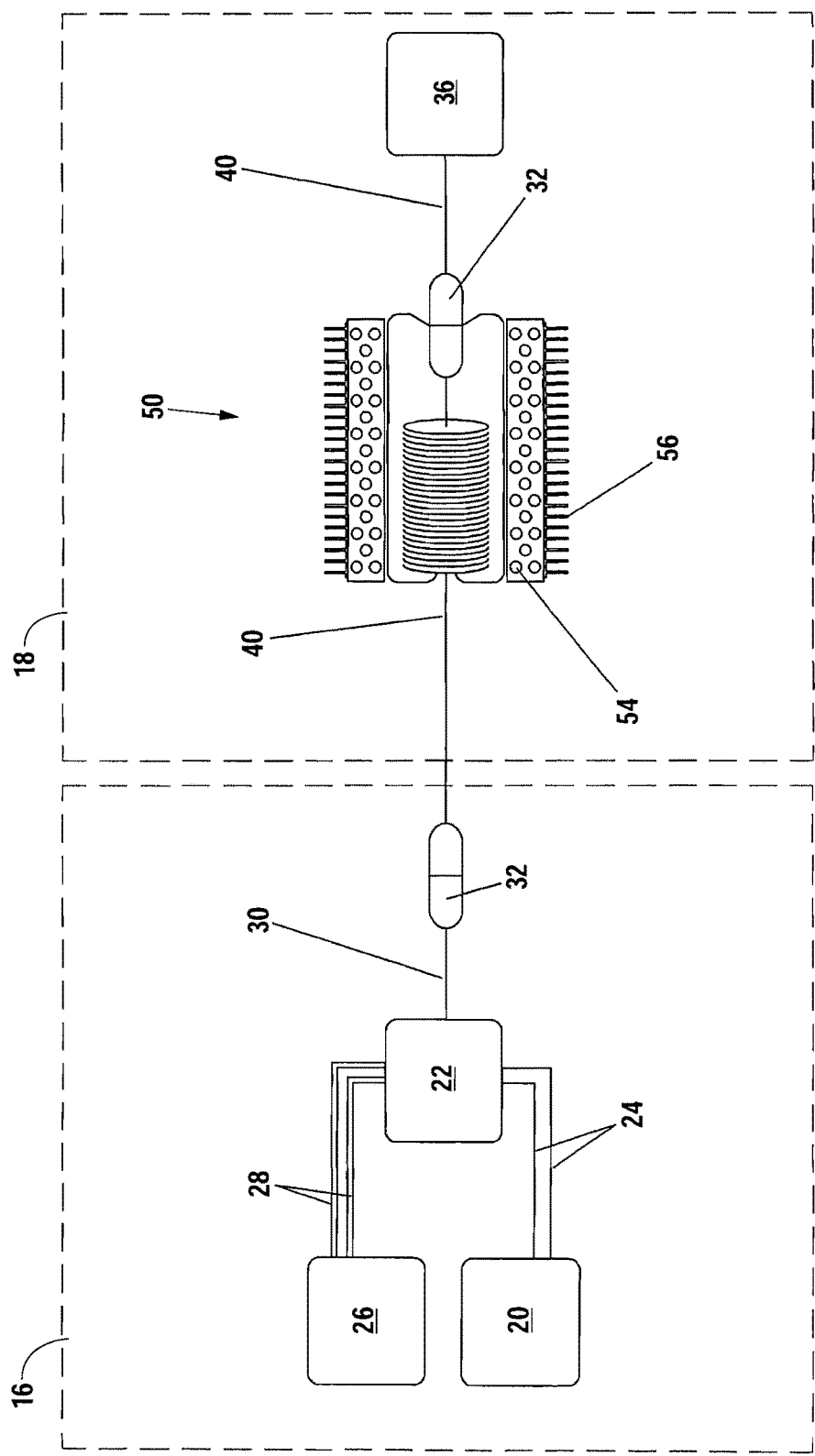

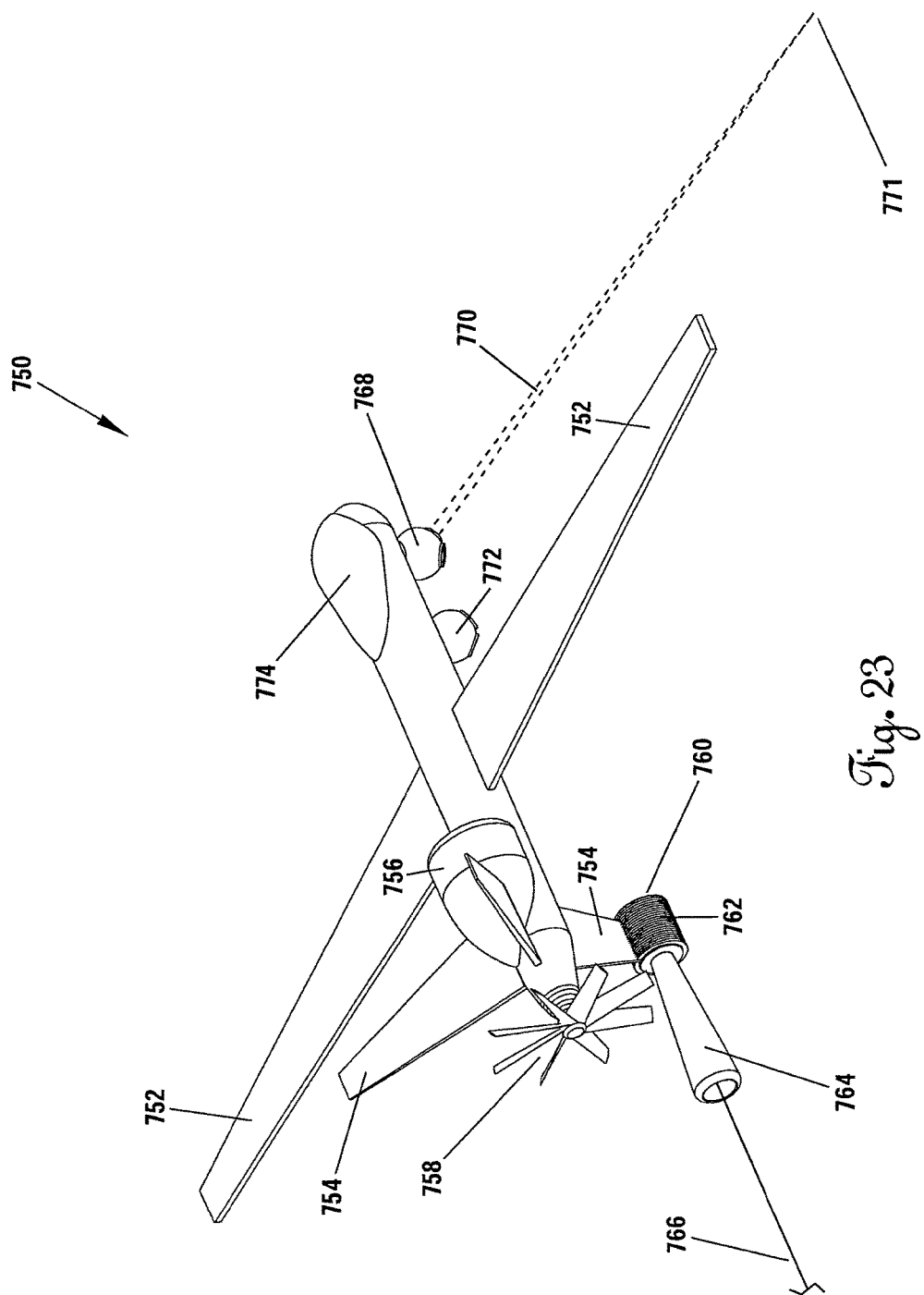

NON-LINE-OF-SIGHT OPTICAL POWER TRANSFER SYSTEM FOR LAUNCHING A SPACECRAFT INTO LOW EARTH ORBIT

CROSS REFERENCE TO RELATED APPLICATIONS

This is a continuation application claiming priority to and the benefit of U.S. application Ser. No. 13/303,449, filed Nov. 23, 2011, which claims priority to and the benefit of U.S. provisional application Ser. No. 61/416,676, filed Nov. 23, 2010, both of which are hereby incorporated by reference herein.

STATEMENT REGARDING FEDERALLY SPONSORED RESEARCH OR DEVELOPMENT

This invention was made with Government support under Grant No. NNX10AE29G awarded by NASA. The Government has certain rights in the invention.

BACKGROUND OF THE INVENTION

1. Field of the Invention

The present invention relates to power systems. More specifically, the present invention is a system for the transfer of optical energy to a remote location and subsequent conversion of the transferred optical energy to another form of energy such as heat, electricity, or mechanical work.

2. Description of the Related Art

It has been known in the telecommunications industry for several decades that light, or optical energy, can be sent down a relatively small diameter (e.g., twenty-five micron) glass optical fiber, modulated, and used to send large amounts of low-noise data or voice channels in a manner superior to traditional metal conductors. The range (i.e., distance) over which an un-boosted signal can be sent down such a glass fiber is controlled by a number of physical phenomena along with the geometry of the fiber and the materials used in its construction.

As light travels down the fiber, a portion of the injected energy is lost due to several mechanisms including Rayleigh scattering, OH absorption, imperfection loss, and infrared absorption. First, Rayleigh scattering is a function of the wavelength of the injected laser light and of the fiber material (frequently silica glass). Aside from selecting a low impedance fiber, the only way to reduce Rayleigh scattering is to select the wavelength of light that produces the least power loss per unit length of fiber. Second, OH absorption loss can be controlled or reduced by constructing fibers with ultra low OH content and avoiding wavelengths that coincide with wavelength-specific OH loss peaks. Third, imperfection loss can only be reduced by use of a fiber with minimal or no manufacturing imperfections. Often this is an issue of quality control of raw materials and manufacturing processes that draw the fiber slowly so as to not introduce imperfections. Finally, infrared absorption loss is a function of wavelength and material. Aside from material selection and improvement infrared loss can only be minimized by choosing an optical frequency that minimizes the losses.

In addition to the optical transmission loss mechanisms just described, there are other potential power loss mechanisms including: thermal damage to fiber at very high temperatures (whether externally or internally produced); non-linear effects such as SRS (stimulated Raman scattering), and also "self-focusing." Self-focusing has been predicted to potentially limit actual power delivery in a fiber to four or five megawatts regardless of fiber diameter, based on current theoretical assumptions and predictions. However, as with many previous theoretical predictions relating to estimates of power and power density limitations for lasers, these estimates may also prove overly conservative in time.

FIG. 1A shows a plot of the theoretical composite attenuation limits for optical power transmission as a function of wavelength per kilometer of pure silica fiber. Other materials and fiber constructions (e.g., hollow, mirror-coated fiber) will have different attenuation characteristics. However, currently, pure silica fiber is the most readily available material to work with and obtain in long lengths (on the order of tens of kilometers). The composite attenuation is at a minimum at approximately 1540 to 1550 nanometers (nm) wavelength. This is due mainly because Rayleigh scattering decreases with increasing wavelength, but after a certain wavelength infrared losses begin to dominate, thus producing a distinct minimum attenuation, which is characteristic for pure silica. Other materials—and in particular, other doped optical materials—may exhibit different frequency response.

As a consequence of FIG. 1A, and for a wavelength of injected light between 1540 to 1550 nanometers with an initial injection power level of one megawatt, FIG. 1B shows the theoretical limiting optical power transmission as a function of the length of fiber, indicating that as far as one-hundred kilometers from the laser source, that an output power of approximately fifty kilowatts (kW) is achievable. This level of output power is significant, and sufficient to enable a host of novel applications.

FIG. 1B is a theoretical construct. Prior to the work of the inventors, fiber optics have been limited to low power data communications applications and limited "power over fiber" demonstrations at very low power levels (on the order of milliwatts) over standard telecommunications fiber. At the other end of the spectrum, industrial cutting lasers, many powered by fiber lasers, have used a very short (typically less than ten meters in length) "process" fiber for transfer of the laser energy to a local cutting head adjacent the laser and in the same building.

The concept of very high power transfer over very long distances had not been investigated. The inventors, in the fall of 2007, began investigating the concept of using optical fiber to send tens of kilowatts of optical energy to an ice penetrating robotic system as a means of enabling a test of a planetary ice-cap penetrating science vehicle for the investigation of the polar ice caps of Mars as well as the planetary ice cap of the Jovian moon Europa. The concept was driven by a need to achieve thermal power levels at the robotic system that were similar to those that would be developed by a systems nuclear auxiliary power (SNAP) thermal reactor (on the order of several tens of kilowatts) without the use of nuclear power, as the likely testing grounds for the system would be Antarctica, where present treaties prohibit the use of nuclear power.

In early July 2010, the inventors conducted a high power, long range laser power transfer test that utilized a twenty-kilowatt infrared (1070 nanometer) fiber laser wherein power levels from zero to ten kilowatts were incrementally injected into a 1050-meter long coil of multi-mode, step index, pure silica core, fluoride doped cladded with polyimide coating (400 μm core, 440 μm cladding, 480 μm coating diameters). The fiber numerical aperture (NA) was 0.22.

FIG. 2 shows the results of that test, which compare favorably with the theoretical attenuation limits shown in FIG. 1A. The fiber was coiled into a one-meter diameter spool which was water cooled in a static flow bath, the temperature of which was monitored. The power was ramped up from one hundred watts to ten kilowatts over an approximately one-hour period. After five minutes at ten kilowatts, the peak temperature of the fiber was fifteen degrees Celsius above ambient as monitored using a forward looking infrared (FLIR) camera. This test pushed new boundaries in terms of the injected power levels sent through an optical fiber but also contradicted traditional thinking in the high power process laser industry that the power would have been completely dissipated by the large number (334) of bends to the fiber in the process of fabricating the coil.

With this as a background, we now discuss some important recent factors that enable practical implementation of the systems that will subsequently be described below. FIG. 3A shows a plot of raw industrial laser continuous output in kilowatts versus year for a single mode fiber laser. These were laboratory curiosities in the early 1990s. In 2009, however, an output level of ten kilowatts was achieved for a 1070 nm industrial fiber laser. It is important to note that with fiber lasers it is possible to combine several single mode lasers by injecting their individual beams into a multimode fiber. To date, multimode fiber lasers have achieved power levels of fifty to sixty kilowatts through one multimode fiber, operating over a short distance of process fiber (less than ten meters) between the laser and its output optics.

An equally important measure of progress is that of power density, expressed in megawatts per square centimeter ($MW/cm^2$). FIG. 3B plots power density in $MW/cm^2$ since 1994. A more practical means of understanding what this graph means is presented in FIG. 3C, in which the LOG of power density is plotted. This plot indicates that, at the current pace of development, which has been sustained since 1994, the power density will increase by an order of magnitude every six years.

Finally, FIG. 3D shows the theoretical power that can be transferred through a fiber optic carrier as a function of fiber core diameter (in microns) using optical power densities achieved in 2009. A three-hundred fifty micron core fiber is capable, today, of carrying a megawatt of optical power. FIG. 1B, as previously discussed, shows the output power that could be expected as a function of distance from the laser for a contiguous fiber.

The data presented in the figures referenced supra presage the possibility of sending enormous amounts of optical power over very long distances using very small diameter, lightweight fibers and converting that optical power to a more usable form of energy. Importantly, because the fiber is carrying the power, it will not be attenuated by the environment surrounding the fiber nor by a situation wherein the consumer of the power is not in visible line-of-sight of the source laser. This has profound implications on the development of many systems heretofore not considered possible.

FIG. 4 shows the very basic premise of the transfer of coherent high power laser radiation between a laser source 22 and a remote system 36 in which a base power source 20 (e.g., a nuclear power plant, a fossil fueled power plant, a large diesel generator, a very large array of solar cells, etc.) is used to provide electrical power to the high power fiber laser 22 via electrical conductors 24. Currently, the best fiber lasers are on the order of thirty-five percent power conversion efficiency (i.e., for every ten watts of raw electrical power, three-and-a-half watts of coherent laser radiation can be produced). Because of this, the laser 22 dissipates a substantial thermal heat load. To counteract this, a cooling system 26 and heat transfer system 28 is used to maintain thermal control at the laser. All of this infrastructure takes up volume, has significant mass, and consumes large amounts of power. It is therefore best located in some fixed ground facility or a large mobile facility (e.g., a ship). From the laser 22, a high energy process fiber 30 leads to a high power optical coupler 32, to which any number of devices can be connected. Traditionally, the only items to be connected to this category of multi-kilowatt laser are focusing optics for use in materials handling—e.g., cutting metal plates or fabric. Because of this, the length of the process fiber 30, 34 are generally quite short—on the order of five to ten meters.

The present invention relates to a system and apparatus that enables the transmission and effective end-use of very large amounts of optical power (e.g., kilowatts to tens of megawatts) over relatively long distances (e.g., from a kilometer to as much as one hundred kilometers or more) to fixed, movable, or mobile platforms operating on the ground, undersea, under ice, in the air, in space, and on other planets. The invention is usable in non-line-of-sight conditions, which allows it to directly bypass severe problems that have plagued efforts to utilize laser power beaming over large distances through the atmosphere, underwater, and over terrain where the receiver is not within view of the optical power source. The present invention permits first kilowatt and then ultimately multi-megawatt optical power injection and utilization over the length of a long deployed fiber.

BRIEF SUMMARY OF THE INVENTION

The invention is an optical power transfer system comprising a fiber spooler and an electrical power extraction subsystem connected to the spooler with an optical waveguide. Optical energy is generated at and transferred from a base station through fiber wrapped around the spooler, and ultimately to the power extraction system at a remote mobility platform for conversion to another form of energy. An alternative embodiment of the invention further comprises a fiber optic rotary joint mechanically connected to the fiber spooler, with the fiber optic rotary joint positioned optically between the spooler and the power extraction system.

BRIEF DESCRIPTION OF THE SEVERAL VIEWS OF THE DRAWINGS

FIG. 4 shows the basic premise of high power laser radiation transfer between a plant fiber laser system and a remote system.

FIG. 5C is a detailed example of an embodiment involving a single exterior mandrel, precision-wound high energy optical fiber spooler.

FIG. 5G shows yet another variation on the high power axial fiber spooler 50.

FIG. 6 depicts an alternative embodiment of the system in which the fiber spooler is carried onboard a remote system or mobile system.

FIGS. 22-23 show an embodiment in use with an unmanned aerial system.

DETAILED DESCRIPTION OF THE INVENTION

Referring to FIG. 4, in the present invention, the length of the output fiber 34 is desirably a long distance—from a few kilometers to upwards of one hundred kilometers or more—and used for the purpose of providing, specifically, optical energy to a remote actuation system 36 that consumes the power in a variety of ways for the purposes of mobility, propulsion, raw thermal power utilization, electrical power conversion, mechanical power extraction or for the purpose of using the laser energy itself in a focused beam.

Figure 5A:
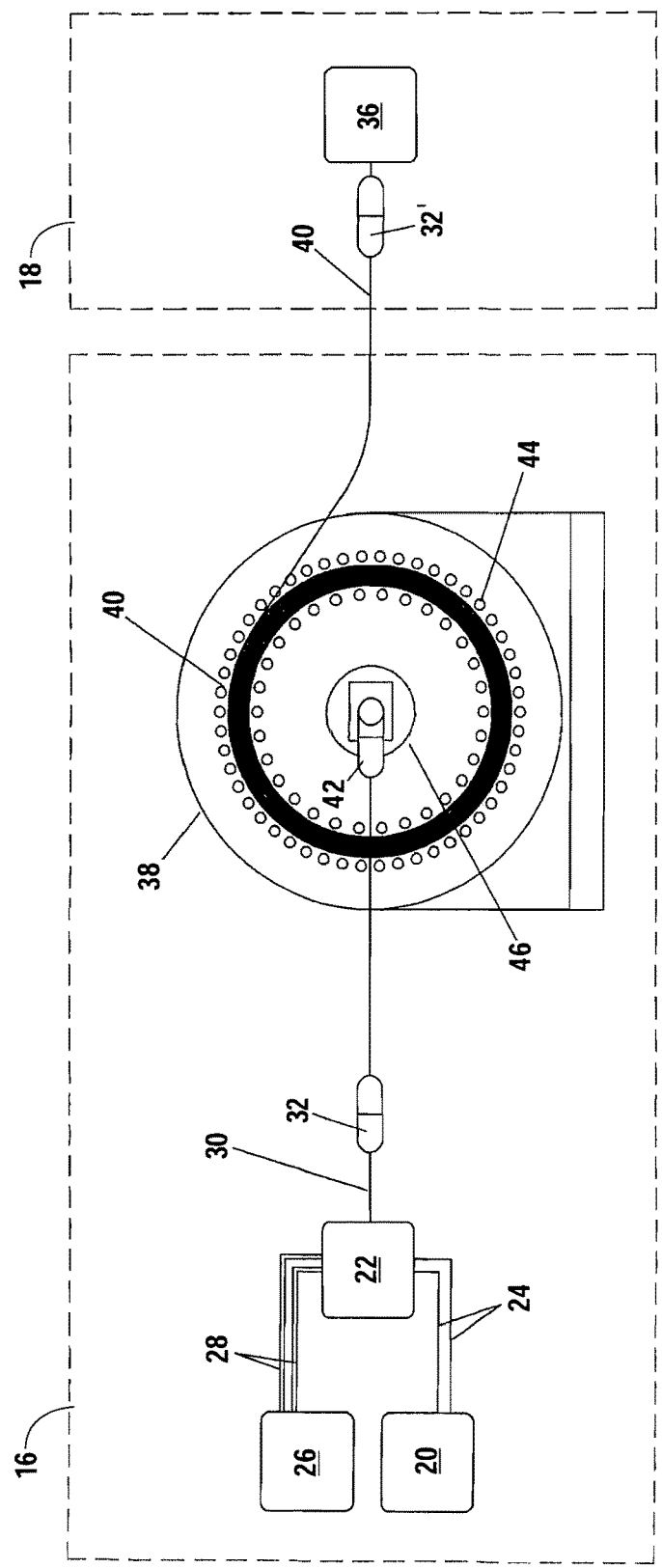
FIG. 5A shows a first variation on the optical, long-range power transfer invention of the present invention.

Referring now to FIG. 4 and FIG. 5A, one could conceive of setting up such a system whereby a truck is used to lay fiber 34 from the plant-based (fixed) fiber laser system 16 to a fixed actuation system or device 36 that uses the energy at some significant distance from the laser source 22. In general, this will have very limited utility because it would be, under most conditions, equally possible to use a local power source at the location of the remote system 36 and not pay the price for the power lost along the fiber 34. In other words, traditional electric power infrastructure will be more cost competitive than deploying a fixed infrastructure that depends upon power sent to it via an optical waveguide or fiber. This is not the case, however, when we wish to consider mobile systems that perform a variety of tasks and where it is entirely disadvantageous, if not impossible, for the mobile system to carry all of the extensive infrastructure needed to generate its own power.

FIG. 5A shows a first embodiment on the present invention in which the base station 16 comprises a servo-controlled large-diameter drum spooler 38 fabricated from a high thermal conductivity material (e.g., beryllium oxide, copper, or aluminum) to facilitate cooling. A large length (kilometers) of fiber 40 is rolled onto this spooler 38 prior to a mission in which the remote system 18 (e.g., a vehicle) is sent forth to do work. As the vehicle leaves the base—for example, a large sea going ship, where the vehicle is an underwater vehicle such as an autonomous underwater vehicle (AUV) or remotely operated vehicle (ROV)—the drum spooler 38 will rotate and feed fiber 40 out to the vehicle. This approach will work well in the restricted situation where there are no obstacles in the path of the vehicle that might serve to trap the fiber 40 and prevent return of the vehicle. For example, it would work well for sea-going operations and could potentially be made to work, using bare fiber, for aerial operations where the base station 16 was carried by a large lighter-than-air airship and the remote vehicle 18 was an unmanned aerial vehicle (UAV) connected to the airship via a bare optical fiber for weight reduction.

The drum spooler 38 has several important characteristics, including an actively-cooled high power laser coupler 42 that will permit easy maintenance of the drum spooler 38. Because of the high power levels involved, the spooler 38 must have an active cooling system 44. The reason for this is that not only will power be dissipated along the length of the fiber 40 by the normal Rayleigh scattering and infrared radiation, but it is also compounded by additional losses associated with the bend radius of the fiber 40. Bending losses are a function of the fiber construction (e.g., core, cladding, coating styles, and refractive indexes), the fiber diameter, the bending diameter, and the laser power conditions entering the bending section. Bending losses will be controlled by selecting a combination of fiber type, size, and construction along with an appropriate spooler diameter for the specific application. The cooling system 44 can consist of any traditional means for transferring excess heat away from the spooler 38, including, but not limited to, heat exchangers, convective, conductive, and radiative cooling mechanisms (see FIGS. 5C-5H).

Importantly, the drum spooler 38 is mechanically connected to a high-energy fiber optic rotary joint 46, as will be described in more detail with reference to FIGS. 9-10, in which a fixed fiber that transfers optical power at high levels through coupler 42 is channeled to the core of the spooler 38 which rotates freely relative to the fixed coupler 42. This is required to avoid unacceptable twisting that would ultimately lead to failure of the fiber 40. The design of a viable ultra-high-power fiber optic rotary joint is a complicated undertaking.

The drum spooler 38 is desirably of large diameter to limit power loss associated with bending of the fiber to form the cylindrical (or other similar object of revolution) spool. Power loss associated with bending can be minimized by using a large bend radius, using smaller diameter fiber, and fiber with a high numerical aperture (NA). Preferably, the diameter of the spooler 38 needs to be large enough that the power losses due to the bending of the fiber do not heat the fiber excessively for the given cooling conditions and they are an acceptable percentage of the total power (i.e., within acceptable losses).

The diameter and all other bending loss parameters are designed to keep the bending losses at an acceptable level. The level of loss will depend on cooling requirements of the particular application: some applications with good cooling and no need for high efficiency can have large losses and thus possibly smaller diameters, while systems with poor cooling and needs of very high efficiency will require lower losses and thus typically larger diameters. This is extremely complex and based on many variables. Bending losses are a function of the fiber construction (e.g., core, cladding, coating styles, and refractive indexes), the fiber diameter, the bending diameter, and the laser beam conditions entering the bending section (beam NA multimode/single mode/specific mode content for multimode, etc.)

The selection of the fiber 40 is based on several criteria: it should have low losses associated with Rayleigh scattering, Raman scattering, and infrared radiation; it should have an ultra-low OH content; preferably have a high NA; have high tolerance to external heat load; be able to operate in fluids without degradation to the fiber's ability to transmit power; be free of imperfections in the manufacturing process; and have a durable cladding that permits reasonable handling toughness both during the winding and out-spooling events. A preferable fiber has a pure fused silica core, with doped silica cladding to give a change in the index of refraction, which allows the light to be guided with a NA between 0.22 and 0.37.

Bare or armored fiber 40 exits the drum spooler 38 and thence communicates with the remote system 18, which could be any device, vehicle, or apparatus that is either self-propelled or is carried by a secondary mobility platform either on land, under the sea, in the air, in space, or on Earth or another planet. Desirably, the remote system 18 is equipped with a high power fiber optic coupler 32' so that it can be desirably disconnected from the power plant 16 for maintenance and transport between missions. The fiber internal to the mobility system 18 then terminates in a fixed actuation system or device 36 that makes use of the optical power by converting it to another form of energy.

Figure 5B:
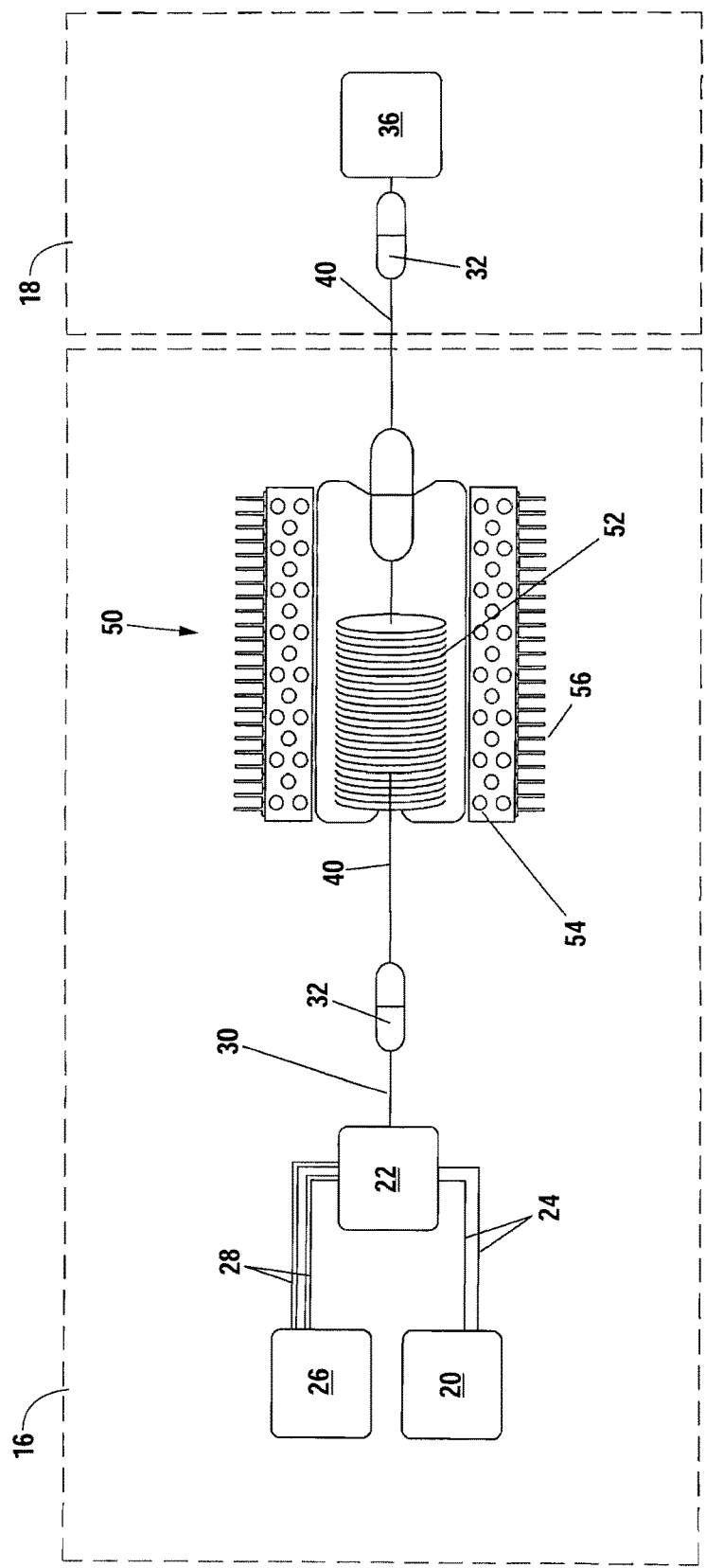
FIG. 5B shows a second variation of the invention incorporating an axial precision-wound spooler.

FIG. 5B shows a variation of a power plant 16 incorporating a precision-wound axial spooler assembly 50. Instead of a drum spooler (as shown in FIG. 5A), the axial spooler 52 is one in which the fiber 40 is pre-wound in such a fashion that it may be pulled out parallel to the axis of the winding without causing the fiber 40 to twist or hockle. Typically, this requires precision winding equipment that inserts a pre-twist of a certain amount per wrap such that the fiber 40 can pull free in the direction of the axis without twisting.

The nature of the winding must be special for a high power application in which large amounts of energy are transmitted through the fiber 40. These details are discussed with reference to FIGS. 5C-5H. At a minimum, however, a high energy axial fiber spooler assembly 50 will require an active cooling system 54 that chills the fiber 40. An auxiliary passive thermal power dissipation system 56 may be desirable to further transfer unwanted heat to the environment (whether underwater, on the ground, in air, or in space).

A plant-based fiber spooler can be quite large in diameter and therefore limit bending losses. In general, axial spoolers are considered one-time-use devices because there is no reliable nor economical field method for re-spooling and making re-use of the fiber in the fashion that would be possible for a ship-based drum spooler working with jacketed (armored) fiber. Similar to the drum spooler 38 described with reference to FIG. 5A, the axial spooler 50 contemplates high power optical couplers 32 on opposing sides so that it may be field-connected to the laser 22 and to the remote system 18.

FIG. 5C shows a detailed example of one embodiment of a single exterior mandrel 60 referenced with respect to FIG. 5B. A hollow or solid winding mandrel 60, which is preferably made of a high thermal conductivity material (e.g., beryllia, copper, aluminum), has bare optical fiber 62 wound upon its radially exterior diameter in such a fashion that direct axial pull out parallel to the mandrel axis 64 is possible without introducing twists to the fiber 62. This can be achieved by pre-twisting the fiber 62 during the precision winding process. The bare fiber 62 exits the rear of the spooler 50 and trails in the direction of the laser power source 22. The vehicle moves in an opposite direction 66 along the same axis. The fiber 62 is preferentially attached to mandrel 60 by a high thermal conductivity adhesive (e.g., materials consisting of a base synthetic polymer system containing thermally conductive fillers) such that the adhesive transmits heat directly to the mandrel 60 in an efficient manner and also lightly binds the fiber 62 to the mandrel 60 so that it does not unspool without a constant tension being applied by the exiting fiber 62, said allowable tension level being specific to a particular fiber design and diameter, but with the general characteristics of both binding the fiber 62 to the mandrel 60 so that individual fibers do not slide freely relative to one another and yet not so high as to impede the free spool out of the fiber 62 to a degree wherein it may stress the fiber 62 to a point at which it either breaks under tension or adversely affects the transmission of power (e.g., by cross-sectional thinning under tension). Examples of appropriate adhesives are ResinLab EP 1121-4, Dow Corning SE4450, and the like.

The mandrel 60 will require active cooling for high power applications. To achieve this, internal flow channels 68 are disposed circumferentially through mandrel 60 and are fed by an inlet 70 and exhausted by an outlet 72. The coolant, which may be either actively pumped or passively fed through the channels 68, can be drawn: from the ambient environment in the event that that fluid has a high heat conduction capacity; from a reservoir of high heat conduction capacity coolant (e.g., water, liquid metals etc.) that is actively chilled (and thermal power dissipated non-local to the spooler 50); or from a reservoir of cold material (e.g., cryogenic liquids). In addition, coolant can be caused to flow through the center of the mandrel 60 to provide further heat removal from the spooler 50.

The spooler 50 has an exterior protective housing 74 that also functions as a thermal radiator. The housing 74 may preferentially have a thermally absorbing coating applied to the radially interior surface 76 such that any heat radiated from the spooled fiber 62 is preferentially absorbed by the housing 74 and thermally-conductive coating. The housing 74 further may desirably have internal coolant flow channels 78 that may receive fluid flow from any of the aforementioned coolant sources. The housing 74 may furthermore be advantageously equipped with exterior radiation panels 80 extending along the length of the housing 74. The thermally absorbing coating has good absorbing ability in the infrared spectrum.

Yet another means for removing heat from spooler fiber 62 is that of directed flow of a coolant via inlet ducts 82 that direct the cooling fluid to pass lengthwise down the axial assembly via a fiber feed channel 84 formed between the mandrel 60 and the housing 74, and from which the fiber 62 ultimately exits the spooler 50.

One purpose of all of these features is to maintain the fiber 62 within a working temperature range that will not affect the material or function of the fiber 62 for the transmission of high power optical energy. Silica, and most materials suitable for the purpose of optical power transmission down a small diameter fiber, has a very low thermal conductivity so it acts to impede cooling of adjacent fibers through contact. For this reason, and as shown in FIG. 5C, the most efficient fiber spooler for high power optical energy transmission is one that contains only a single layer, or only a few layers, of bare fiber 62. Depending on the power levels involved, additional layers may be added and the flow of coolant through channels 68 and other coolant communication paths adjusted accordingly to maintain fiber temperature within the specifications for the selected fiber.

Not shown on this drawing, but of significance to the operation of this system, is a network of surface-mounted temperature sensors that can be used to detect an impending hot spot that may cause the fiber 62 to fail locally or regionally. In this case, these temperature sensors can be tied to the active thermal control system as well as to the laser for a pre-emptive beam shut down in the event of an uncontrollable buildup of heat in any particular section of the assembly.

For reference, a single wrapped axial spooler mandrel that is two-tenths of a meter in diameter by one-half meter in length can carry 1.3 kilometers of 250-micron fiber in a single layer; 2.6 kilometers in a double layer; 3.9 kilometers in a three-layer wrap, etc. There are means for building much longer, high power axial spoolers, as will be subsequently described below.

Figure 5D:
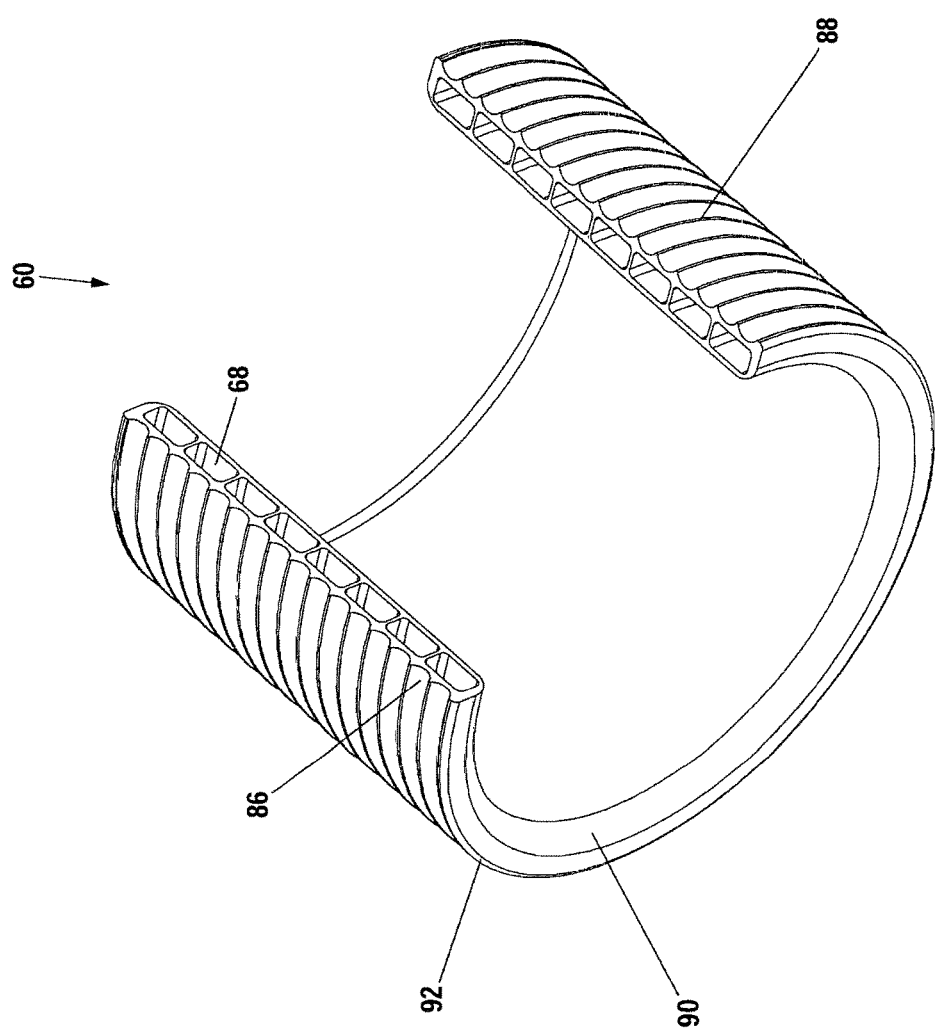
FIG. 5D shows a cut-away detail of the exterior wrapped mandrel of FIG. 5C.

FIG. 5D shows a cut-away detail of the exterior wrapped mandrel 60 from FIG. 5C. Desirably, for improved heat conduction, the exterior surface of the cylindrical mandrel 60 will contain a smooth, form-fitting groove 86 designed to precisely mate with the chosen bare power delivery fiber. The groove 86 would be preferentially manufactured using a precision machining system or other method of creating a spiral, continuous groove 86 the local radius of which either precisely matches or is slightly larger than that for the chosen power fiber. The degree of machining depth will represent the minimum needed for secure fiber location. For very high power applications, the spacing (pitch) between individual coils of the groove 86 should be such that the adjacent fibers do not touch each other. Further, the edges 88 between the respective grooves 86, as well as the groove surfaces, preferably are polished and have a smooth transition radius such that there are no sharp edges anywhere on the face where the fiber is to be wound. Similarly, the interior trailing edge 90 and the exterior trailing edge 92 have a smooth radius and are polished to prevent fiber damage on spool-out. An alternative to the spooler design shown in FIG. 5D would involve the use of a smooth polished cylindrical external winding surface (replacing the polished grooves 86 and 88 in FIG. 5D), or one that is slightly tapered (with or without alignment grooves 86) toward the direction of fiber spool out so that the diameter of the tapered, truncated conical annulus is less at the point of fiber departure (64 in FIG. 5C) than it is at the opposing end (in the direction of vehicle motion, 66 in FIG. 5C). In both cases, the fiber is adhered to the smooth, polished surface by means of a thermally conducting adhesive means and, desirably, the fiber spacing is such that adjacent fibers do not touch. Multiple fiber layers, held together by a thermally conducting adhesive means, are possible on mandrels as shown in FIG. 5D (and as described in this paragraph), however the ability to effectively cool the multiple wraps will be diminished relative to a single-wrap mandrel and careful thermal design will be required to determine the maximum number of over-wraps for a given power transmission level, mandrel wrapping radius, and diameter of the transmission fiber, among other things.

Figure 5E:
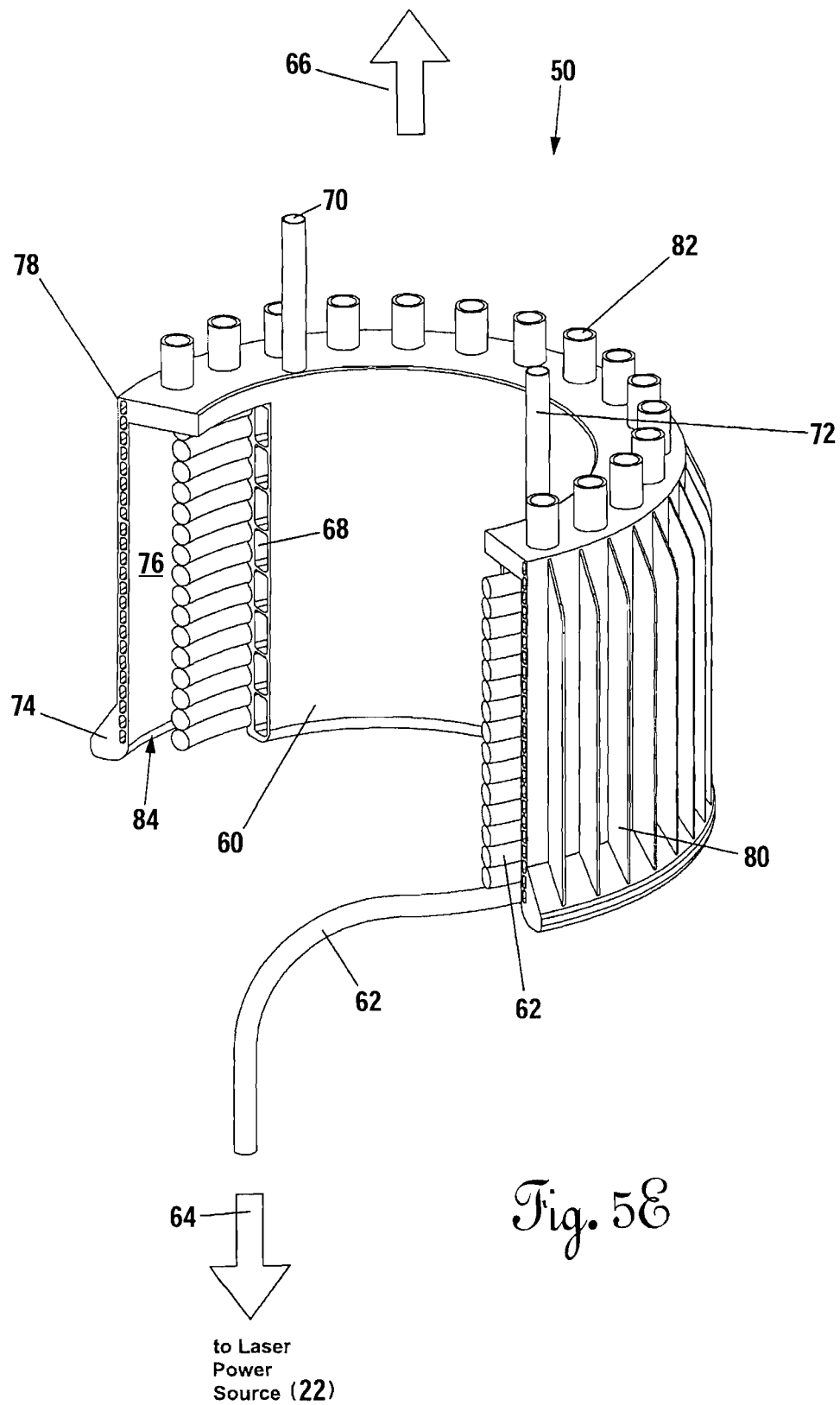
FIG. 5E is a top isometric view of the same external fiber spooler and protective shell system described with reference to FIG. 5C.

FIG. 5E shows a top isometric cutaway view of the same external fiber spooler 50 and protective housing 74 described with reference to FIG. 5C. Importantly, the direct axial flow cooling fluid inlet ducts 82 are notional representations only. For travel through a fluid medium (e.g., water or air) there can be present computer-controlled, servo panels that open to permit either water or air to be drawn into the vehicle as it moves forward and to channel that fluid down into the fiber feed channel 84 for the purposes of cooling the radially exterior surface face of the fiber 62. Because the fiber 62 must freely trail out from the channel 84, any cooling fluid that passes into inlet ducts 82 will exit the fiber feed channel 84 after one pass and not be able to be re-used. Contrarily, any fluid or coolant pumped through circumferential channels 68, 78 can be re-cycled and sent to an alternate location in the vehicle either for the purpose of refrigeration of the coolant or potentially for pre-heating of a working fluid or propellant.

Figure 5F:
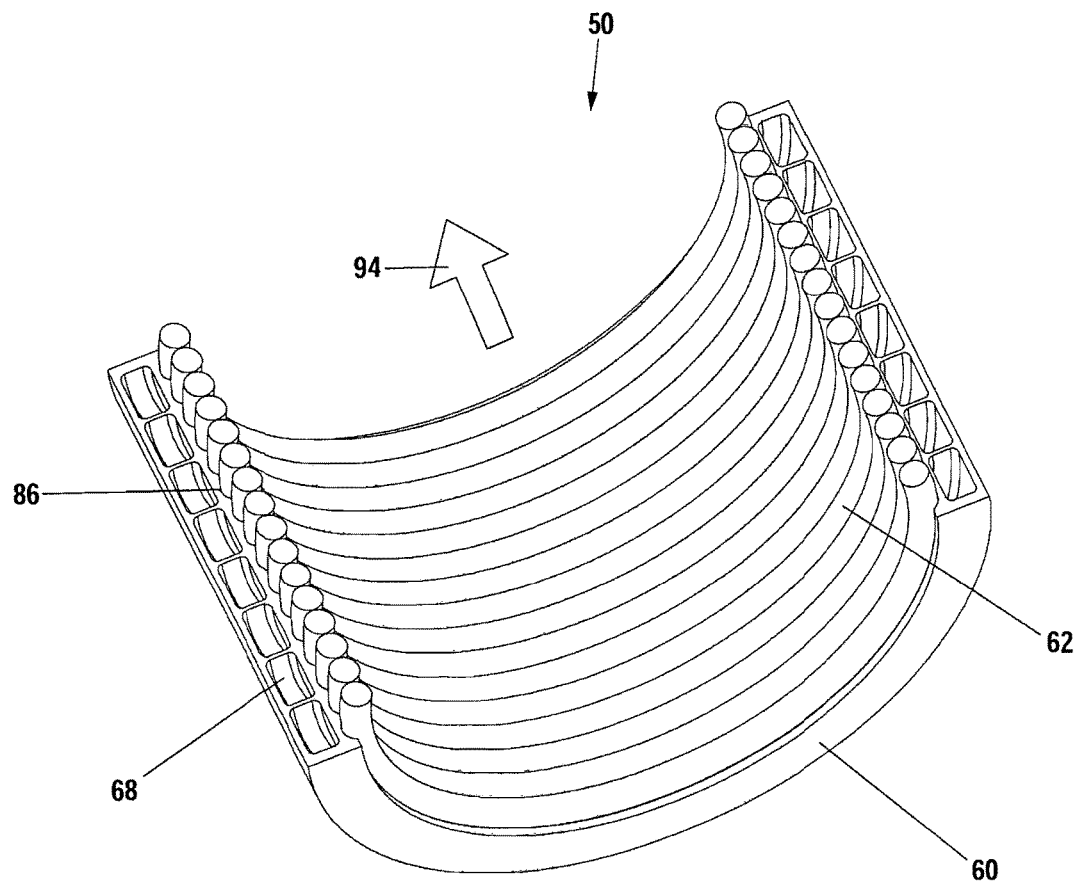
FIG. 5F is a variation on the axial high power fiber spooler 50 in which the mandrel 60 defines winding grooves 86 on the interior surface.

FIG. 5F shows a variation on the axial high power fiber spooler 50 in which the mandrel 60 defines winding grooves 86 on the interior surface. All other aspects of this design remain the same as for those shown in FIGS. 5C-5E, including the presence of circumferential cooling channels 68. Importantly, such a winding pattern depends on the use of the thermally-conducting adhesive to lightly attach each fiber to the groove 86 as the fiber 92 is precision-placed. The groove 86 forms a continuous spiral (helix) and the fiber 62 pays out linearly in a direction parallel to the center axis of the cylindrical mandrel 60. As discussed supra, for the highest power applications, it is desirable to have a single wrap of fiber 62. For lower power applications it will be possible to have several layers of wrapping.

An alternative to the spooler design shown in FIG. 5F would involve the use of a smooth polished cylindrical internal winding surface (replacing the polished grooves 86 in FIG. 5F), or one that is slightly tapered (with or without alignment grooves 86) toward the direction of fiber spool out so that the diameter of the tapered, truncated conical annulus is greater at the point of fiber departure (64 in FIG. 5C) than it is at the opposing end (in the direction of vehicle motion, 66 in FIG. 5C). In both cases, the fiber is adhered to the smooth, polished surface by means of a thermally conducting adhesive means and, desirably, the fiber spacing is such that adjacent fibers do not touch. Multiple fiber layers, held together by a thermally conducting adhesive means, are possible on mandrels as shown in FIG. 5F (and as described in this paragraph), however the ability to effectively cool the multiple wraps will be diminished relative to a single-wrap mandrel and careful thermal design will be required to determine the maximum number of over-wraps for a given power transmission level, mandrel wrapping radius, and diameter of the transmission fiber, among other things.

FIG. 5G shows yet another variation on the high power axial fiber spooler. An exterior mandrel 60 of this spooler 50 is the same as shown in FIGS. 5C-5E. The inner mandrel 100 is a variation of the mandrel shown in FIG. 5C and FIG. 5F in which the fiber is wrapped on grooved surfaces on both the radially interior and radially exterior surfaces of the inner mandrel 100. All winding surfaces shown are smooth and tapered in the direction of fiber spool out, 112, with the fiber being held in place and positioned with the use of a thermally-conducting adhesive as described above. Each mandrel 60, 100 is independently cooled via coolant inlet ports 102, 104 and outlet ports 106, 108, which serve to send a recyclable coolant through cooling channels in the inner mandrel 100 and outer mandrel 60. Chilled ambient environment fluid (e.g., water, air) can be routed into the exterior fiber channel 110 or through the hollow central core 111 for additional fiber cooling. The exhaust for such coolant, following one pass through the spooler 50, is in the trailing direction 112. The exterior mandrel 60 may additionally contain passive thermal dissipaters (e.g., radiation panels) as shown in FIG. 5C and FIG. 5E. The mandrels 60, 100 are supported at one end only. The fiber is pulled off the free end.

In the design shown in FIG. 5G, up to three single-layer, individually-cooled fiber layers can be combined into a compact spooler to increase the range of the vehicle. The nested mandrel, actively-cooled spooler concept can be extended to several annular ringed mandrels embedded within one another. All fibers are desirably retained in their grooves by the use of a thermally-conducting adhesive or similar means that achieves the same intent. For lower power operations, multiple wraps can be applied to each winding face, both interior and exterior. Each wrap desirably contains an element of pre-twist to prevent hockling upon pullout during a mission. The fiber from one ring layer is desirably passed to the next layer while maintaining the maximum possible bend radius on the fiber. Desirably, the trailing edges (not shown) of mandrels 60, 100 should have smooth, polished, radiused surfaces to as to present no sharp edges to the trailing fiber nor to the cross-wrap fiber leading from one wrapping face to the next.

Figure 5H:
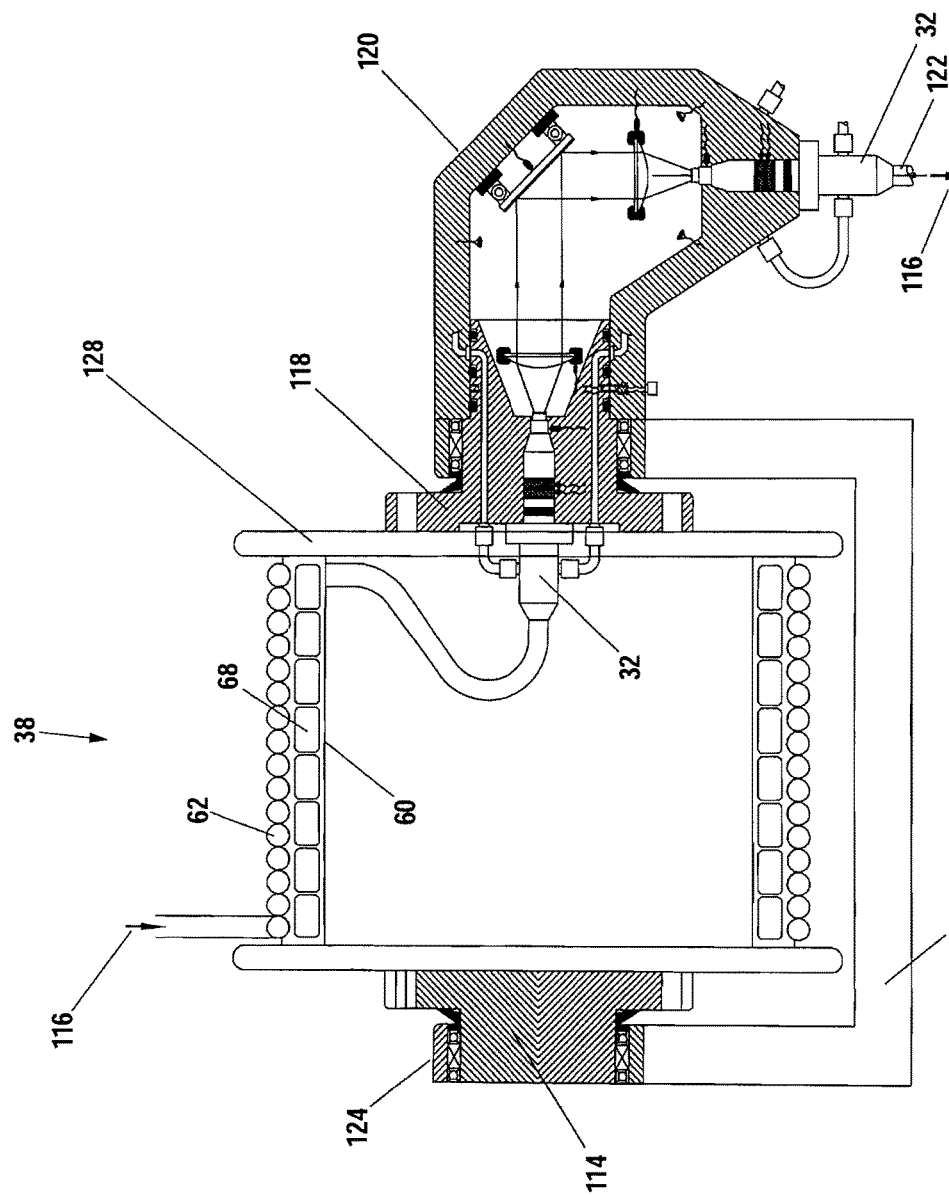
FIG. 5H shows a cross sectional detail of an embodiment of a drum-type high energy fiber spooler such as shown in FIG. 5A.

FIG. 5H shows a cross sectional detail of an embodiment of a drum-type high energy fiber spooler such as shown in FIG. 5A. For some applications, particularly those involving low speed mobility platforms (e.g., underwater and ground vehicles), it will be possible to use a drum spooler on the mobility platform (vehicle). The advantage of a drum spooler is that it simplifies the winding process and does not require precision winding and fiber pre-twist to assure a straight pull out as the mobility platform moves away from the laser power source. It is therefore likely to be less costly than an axial precision-wound spooler. For very high energy transmission, the drum spooler must be cooled in a manner analogous to that previously described for an axial spooler. The mandrel 60 will necessarily contain coolant flow channels 68, whether interior to the mandrel body or as a bonded set of thermally conducting flow channels (e.g., a helical tube coil made of copper that is either soldered to the mandrel 60 or bonded to it with heat conducting material). The coolant that flows through channels 68 can be from a closed-cycle system that continuously chills the refrigerant while dumping the waste heat elsewhere, desirably into a power conversion system for use onboard the mobility platform. For applications where the mobility platform will be working in water or air, either passive or actively forced flow of the ambient fluid (e.g., water, air) can be passed over and around the exterior of the mandrel 60 to further remove heat from the fiber. As with the axial spoolers previously described, for ultra-high energy optical power transmission it is advantageous to have only a single wrap of fiber 62 on the mandrel 60. A greater number of wrap layers is possible for lower power levels or for environments where the ambient environment fluid has significant heat conduction capacity to allow further layers (e.g., ice water for deep ocean, or sub-glacial lake work). The drum can either passively feed fiber 62 out (possibly with tension maintaining mechanisms) or actively with the use of sensors and servo drives 114 that match the rate of fiber pay out to the vehicle forward velocity.

Energy 116 from the base-located laser (not shown) is fed into the drum spooler 38 and the drum spooler 38 unwinds as the mobility platform moves away from the laser. The fiber 62 from the drum spooler 38 terminates at a high energy optical coupler 32 where it enters the rotating element 118 of a high power fiber optic rotary joint (FORJ) 120.

Figure 9:
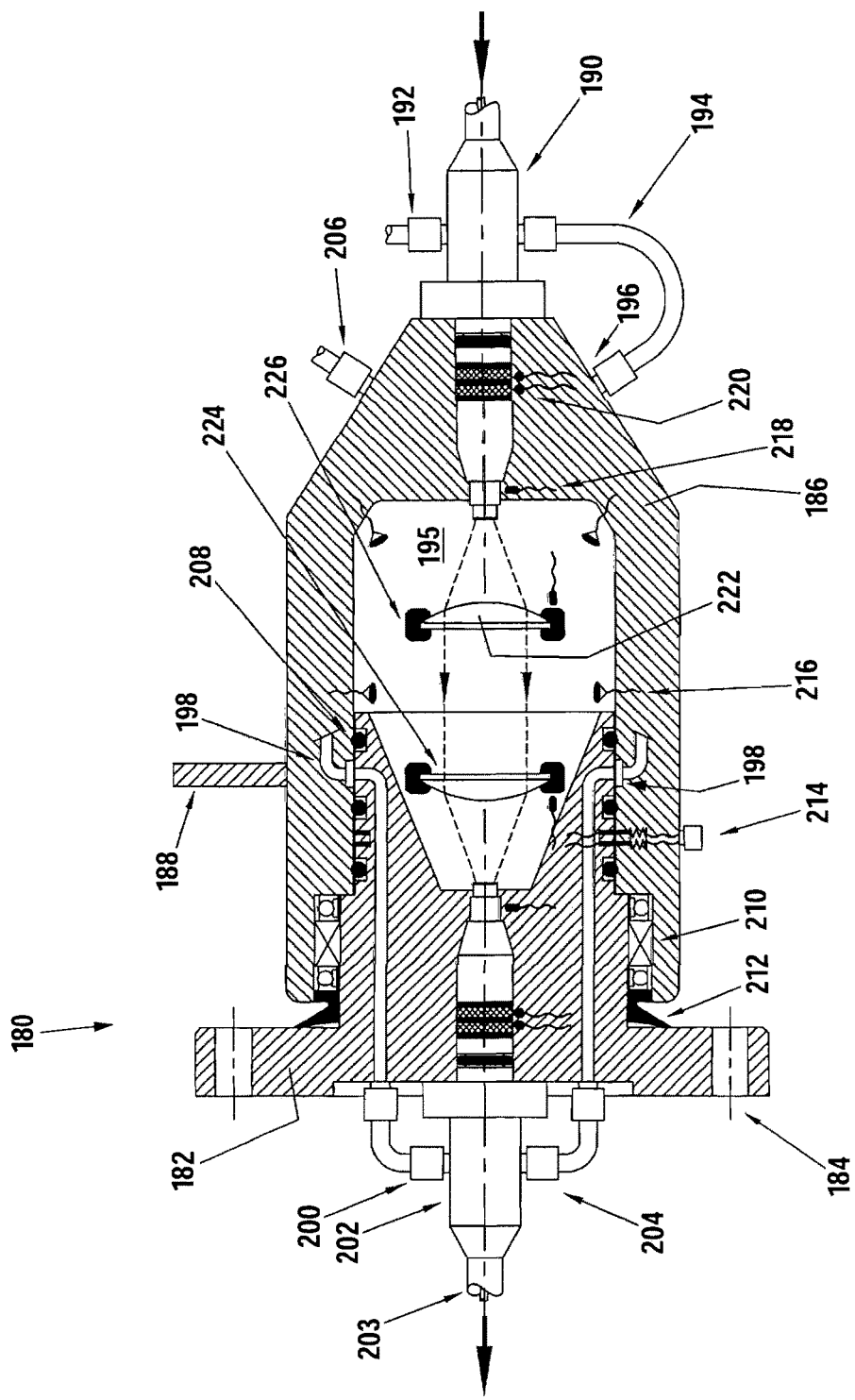
FIG. 9 is a sectional view of an embodiment of a fiber optic rotary joint (FORD) that can be used with the present invention.
Figure 10:
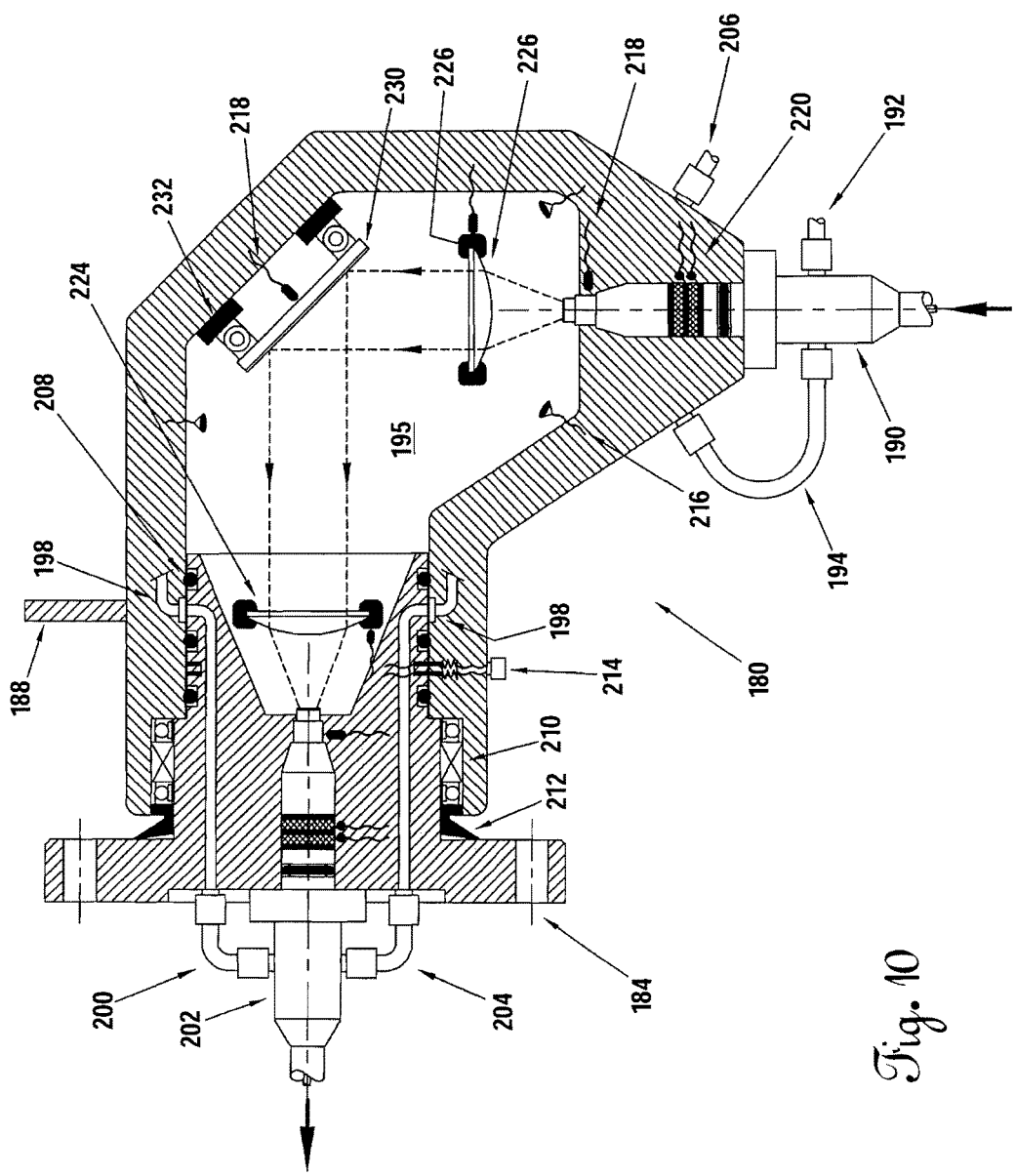
FIG. 10 is a sectional view of another embodiment of a FORD that can be used with the present invention.

The FORJ 120 is described in detail hereafter with reference to FIGS. 9-10. Briefly, this device allows the optical energy 116 to be transmitted between two adjacent fibers while allowing for one half of the FORJ 120 to rotate relative to the other. By this means, the drum spooler 38 may rotate freely without twisting the fiber 62. The output side of the FORJ 120 leads to a second coupler 32 and fiber section 122 that transports the coherent optical energy 116 to the vehicle for further use. The drum spooler 38 is supported by bearings 124 on one or both sides. The bearings 124 are held in place by a drum frame 126 that is fastened to the body of the mobility platform. Both the drum frame 126 and drum sidewalls 128 may have optional internal cooling channels depending on the power levels involved. The fiber 62 is preferably a bare fiber, since a much greater length can be stored in a given-size drum spooler 38, but there is nothing preventing a jacketed fiber to be used, provided the jacket and cladding and any other protective or strengthening elements have high thermal conductivity. Notably, bare fiber always has cladding and almost always has a coating of tens of microns that is not a jacket but nonetheless protects the fiber to a degree.

FIG. 6 depicts an alternative embodiment of the invention wherein the power spooler 50 resides on the mobile remote system 18. All elements in FIG. 6 are identical to that of FIG. 5B with the exception that the fiber spooler 50 is now mounted on the vehicle. This architecture, wherein massive amounts of optical power are transferred to the vehicle over a fiber optic link over long distances with the vehicle carrying, and laying, its own power line, is the key to enabling a class of mobile, autonomous systems that could never have previously existed owing to limitations of weight and power generation or storage capability. As an explicit example, the range (both horizontal distance and depth rating) of a ship-tethered ROV (industrial class remotely operated vehicle) of the type commonly used in the petroleum industry is severely limited by the excessive size and mass of that electrical-power tether, which grows larger with distance (because higher voltages must be used and this then begets further electrical insulation requirements) and is significantly affected by ocean current drag. There are thus practical limits today to where ROV systems can operate. By contrast, a 1 mm diameter jacketed fiber optic laser power tether would scarcely be affected by currents and the vehicle could receive useful optical power as far as 100 kilometers from a ship-carried power supply.

Figure 7:
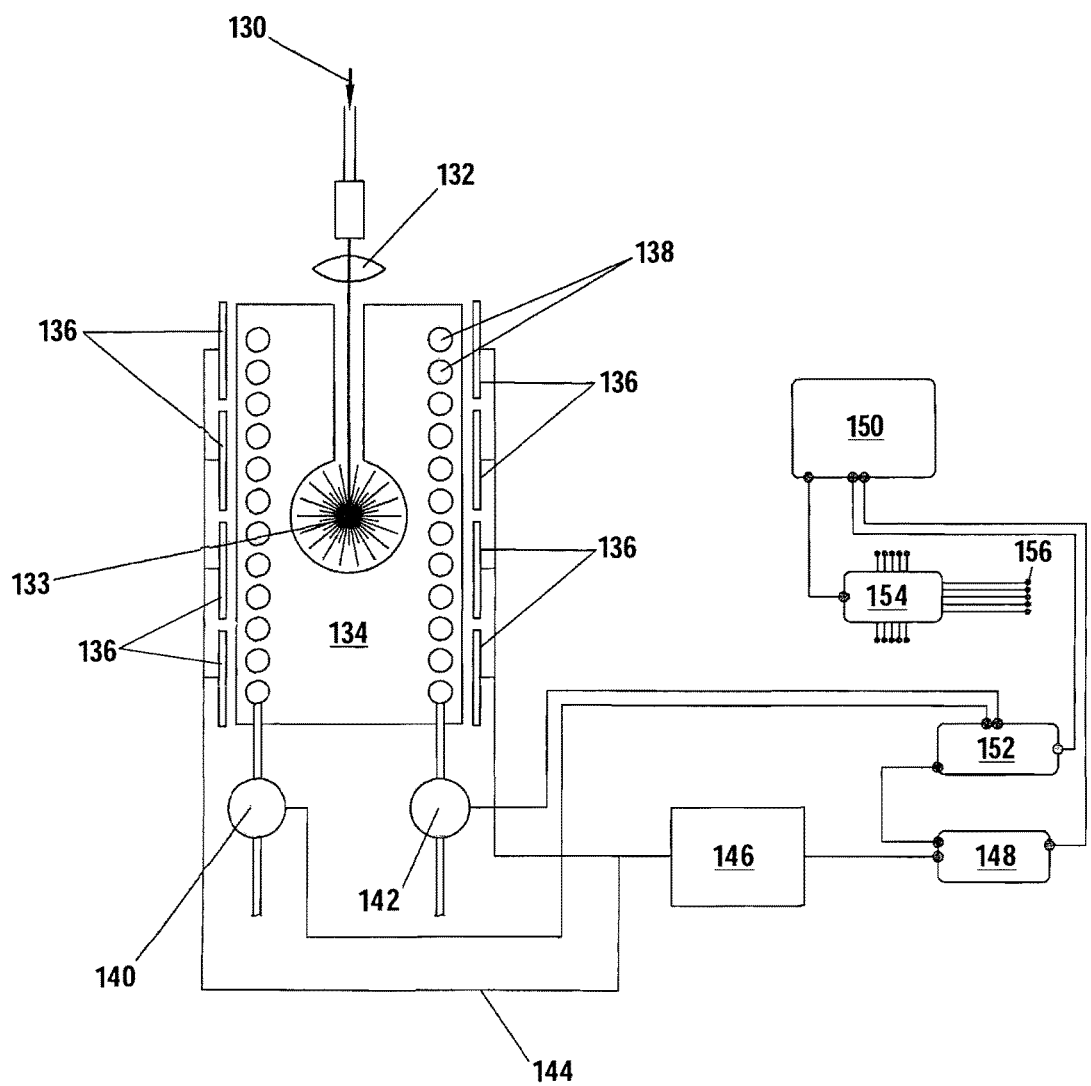
FIG. 7 is a system diagram of the electrical power extraction subsystem of the system.

In FIG. 7, we explain the first of several high power energy extraction methods to be employed on the remote system 18 of FIG. 6. The coherent energy 130 coming from the onboard fiber spooler (not shown) is injected into one or more sets of passive or actively controlled beam forming optics 132 comprising lenses, fiber assemblies, mirrors, prisms, etc, all types of optical manipulating devices. The energy 130 is expanded and directed toward a refractory target 133 such that diffuse laser radiation illuminates a beam dump 134. The beam dump 134 is a body preferably made of a refractory material (e.g., beryllium oxide (BeO)) that can tolerate sustained high temperature operation. Other high-temperature compatible, highly conductive materials (e.g., certain metals) could also be used as the beam dump. The core of the beam dump 134 is desirably surrounded by an array of thermoelectric converters 136 whose interior side contacts with or is exposed to the hot beam dump 134. The exterior side of the thermoelectric converters 136 is advantageously exposed to a cold environment or to a heat sink means that is either actively or passively chilled to create the greatest temperature difference across the thermoelectric converter mechanism. Additional heat exchanger channels 138 may be run through and around the beam dump 134 to extract heat for further directed use throughout the vehicle or for further power generation by additional thermoelectric arrays or other means.

One such direct heat use for coolant coming through the heat exchanger system would be that of heating melt water to high temperatures and pressures and using that with a pump 140 to form of a hot water jet for hot water drilling through a thick ice cap—for example the three-kilometer thick ice cap of Antarctica. Another use would be to supply hot working fluid through a pump 142 for thermal management of a mobility platform (e.g., to keep a planetary robotic rover's mechanisms and science payloads from freezing). The thermoelectric converters 136 send electrical power to the onboard control system via a power bus 144, which is regulated by a power management sub-system 146. Electrical power is subsequently stored in one or more regenerative electrical power storage means 148 (e.g., a Lithium-ion battery stack, a fuel cell stack, etc.), which serves both as the primary continuous power source for the main onboard computer control processor 150 and controls for peripherals such as the pump actuators 152 that control the hot water jet pump 140, thermal management pump 142, mobility motors, and the like. The mobility system is desirably equipped with a sophisticated sensor network 154 that continuously scans dozens of process sensors 156—thermal, pressure, and optical—for overall management of the vehicle.

Figure 8:
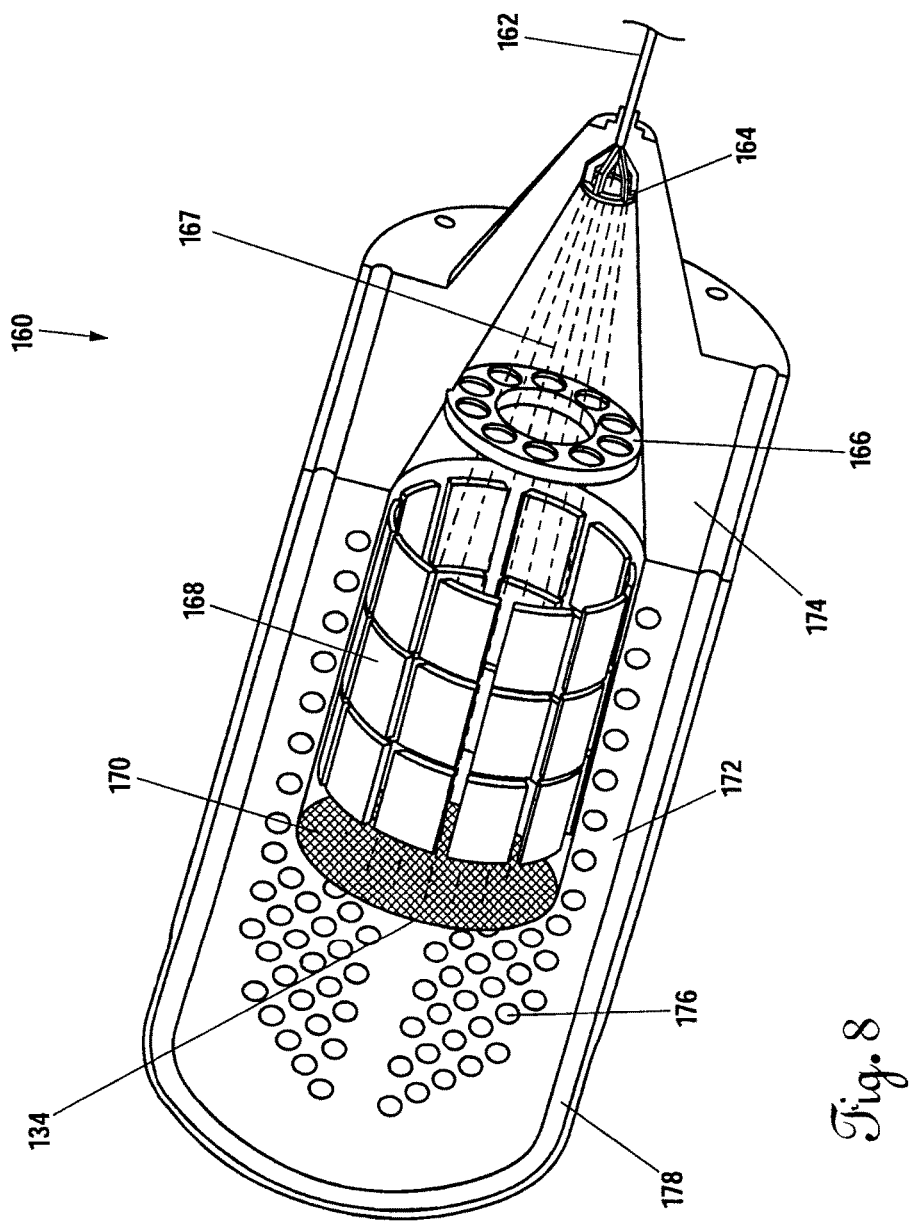
FIG. 8 is a isometric view of mobility system power head 160 implementing the invention.

FIG. 8 shows a physically realizable mobility system power head 160 that can receive very large amounts of optical power (e.g., tens of kilowatts to low megawatts) and thence convert and simultaneously direct that energy in several useful ways to further the purpose of the mobility platform of which it forms the heart. Optical power is delivered to the power head 160 via fiber 162 from an axial or drum type spooler as previously described and located on the mobility platform. The beam is first partially expanded via primary beam forming optics 164 and then via forward beam forming optics 166 to form a diffuse beam 167 that impinges on beam dump 134, thus heating the entire body of the power head 160 to high temperature. As previously described, a thermoelectric converter array 168 may be positioned around the beam dump 134 for direct generation of electrical power for use on the vehicle. This array 168 can be located anywhere around the power head body where heat will be radiated onto one face of the thermoelectric converter chips (TEC) while a lower temperature surface can be created on the opposite side (e.g., the TEC array could be located either inside the beam dump cavity and cooled on their outward side by heat exchanger channels 176 or by mounting the TEC array on the outside of the beam dump as shown in FIG. 7 where it would be chilled by the ambient environment or other external heat extraction system). A second primary means of direct electrical power generation is possible by directly impinging the expanded optical beam 167 onto an array of photovoltaic cells 170 that are tuned to generate electricity efficiently at the wavelength of the incident laser radiation. The body of the power head 160, comprising forward housing 172 and rear housing 174, can be equipped with internal heat exchanger channels 176 and heat pump channels 178 that can be used to transport heat to other locations about the vehicle for thermal control in cold environments or to power such direct thermal power consumers as hot water drills and the like.

FIG. 9 shows one embodiment of a high power (e.g., kilowatts to low megawatts) FORJ 180 as generally described with reference to FIG. 5A-5H. The housing of the FORJ 180, in this case an axial design, comprises two concentric elements: a rotating element 182 that rotates freely and is mounted to the rotating fiber drum (not shown) by flange 184 and a fixed element 186 that is fixed to the drum holding frame (not shown) and is prevented from rotating by torque arm 188. The rotating element 182 and fixed element 186 together define an optics chamber 195.

Optical power enters the axial FORJ 180 through a first connector 190, which is cooled by coolant that enters at inlet port 192, cools the connection and exits at outlet 194. However, at this point coolant flow is subsequently routed to housing inlet 196 where it cools the fixed element 186 and then, by means of a rotary cooling water coupling 198, allows the flow to continue into the rotating element 182 without entering into the optics chamber 195. Water temporarily exits the rotating member 182 and connects to a cooling inlet 204 of a second connector 202, cools the second outlet connector 202, and exits the second connector 202 at an outlet port 200 and then re-enters and re-cools the rotating element 182, passes back through the rotary water coupling 198, passes through the fixed element 186 and then exits to return to the cooling system via outlet port 206. Many variations on this approach are possible, but the concept is to efficiently cool both the rotating element 182 and fixed element 186 of the FORJ 180 as well as both fiber connectors 190, 202 using the same coolant system for economy. O-ring radial and face seals 208 are used to ensure that water does not enter the optics chamber 195 or optical elements of the FORJ 180 nor to leak at any place while advantageously transporting heat away from both housings elements 182, 186.

The rotating element 182 is supported and centered within fixed element 186 by bearings 210, which are kept clean and sealed by a shaft seal 212. Electric slip ring contacts 214 are used for connector safety interlocks and are connected to a safety control system by external wires (not shown). The purpose of the safety interlocks is to prevent accidental separation of the FORJ 180 while power is on. Additional safety sensors comprise a plurality of photodetectors 216 for sensing stray light that might predict the onset of failure of the optics that would lead to a catastrophic melt down of the system if left unchecked. Similarly, a temperature sensing network 218 is distributed throughout the rotating element 182 and fixed element 186 for the same purpose of early detection of a failed optical control system that may be leading to melt down of the FORJ 180. Similarly, isolated electrical contacts 220 for connector integrity lock are provided to ensure both the first and second connectors 190, 202 are properly inserted and locked in place.

The optics of the axial FORJ 180 are complex. The incoming beam from the first connector 190 will diverge at its end at the fused silica block at a divergence angle defined by its numerical aperture (NA). The diverging beam is collimated by first collimating optics 222. The beam then theoretically travels across the evacuated optics chamber 195 and impinges on second collimating optics 224 where the beam is focused and impinges on the fused silica block of the second connector 202 where the beam is injected into the output fiber 203.

Despite the best efforts at precision machining, there will exist alignment errors between connectors 190, 202 and their respective collimating optics 222, 224. Minor variances in this alignment could result in substantial amounts of power being dissipated in the optics chamber 195 and, if left unchecked, could lead to meltdown and loss of the device. While fine-tuned optical bench solutions might be developed for laboratory versions of such a device, that will not be sufficient for the high power industrial mobility inventions previously described herein.

To resolve the issues of alignment both due to axial and angular errors as the rotating element 182 rotates relative to fixed element 186, actuators 226 are affixed to the first and second collimating optics 22, 224 for interactively, and with fine precision, moving these respective lenses in real-time under computer control. Alignment means 226 may comprise of a plurality of active control elements affixed to each lens such that each lens can be both moved in three degrees-of-freedom (e.g., X, Y, and Z translations) as well as rotated in three degrees of freedom (yaw, pitch, and roll) in order to both actively change both the focus point as well as the pointing of each lens.

The connectors 190, 202 will have limited alignment possibility, other than that determined by the precision of the concentricity of rotating and fixed elements 182, 186 and the degree to which fabrication errors and tolerances permit motion other than rotationally about the common centerline. For this reason, the actuators 226 must handle all of the correction. The actuators 226 may desirably be arrayed radially about the perimeter of the lens and a minimum of three such elements per lens would be needed to provide a full six degrees of freedom. Alternatively, the lens could be held by an external servo controlled stage that allowed for X-, Y-, and Z-translation of the lens while other servo actuators provided for the yaw, pitch and roll orientation. The lens actuator means could employ both slow and fast elements—fast elements being comprised of such technologies as piezoelectric stacks with or without displacement amplifiers; MEMS-based actuators for micro-fine tuning; acoustic SAW wave linear actuators; electromagnetic and voice coil type actuators, to name a few. Importantly, these actuators are all driven by an onboard embedded computer processor that is local to the FORJ 180 or immediately adjacent the FORJ 180 so that each FORJ 180 is independently responsible for its own real-time alignment. The alignment cycle begins at low power and a system identification mapping is performed at specified rotation angles of rotating element 182 relative to the fixed element 186. At each system identification angle, an optimization is performed in which the delivered power to the output connector is maximized while minimizing the optical and thermal feedback from internal sensor networks 216, 218. The positions of the collimating elements 222, 224 are then noted and the next angular alignment proceeds automatically until a full revolution has been logged. A smoothed mapping is then mathematically defined between the discrete calibration points and this mapping then forms the basis for an initial estimate of the real-time alignment system at any given angle—the relative rotation angle between the rotating element 182 and fixed element 186 is determined by a high precision angular encoder (not shown) that reports that angular position to the embedded control system processor. With these initial seed alignments as a function of relative rotation angle the embedded processor then initiates a real-time optimization control of the collimating alignment motors and actuators for both lenses as power is ramped up to full industrial levels and the fiber is spooled out from the spooler drum.

FIG. 10 shows another embodiment of an FORD 180 that can be used with the present invention: a right-angled, high power FORT 180 in which all elements are the same as for FIG. 9 and further comprises a high power actively cooled laser mirror 230. The mirror 230 is mechanically connected to highly responsive servo-controlled mirror alignment motors and actuator means 232 sufficient to control three orthogonal translations and three rotations (yaw, pitch, roll) of the mirror 230 relative to collimating optics 224, 226. These actuators and motors 230 are, as before, connected to the onboard embedded processor which seeks to optimize the amount of optical power being transferred through the FORT 180 for any given rotation angle. This is in many ways superior to the pure axial design presented in FIG. 10 in that it allows for extremely fast adjustment of a light-weight, cooled mirror (as opposed to glass optics which have substantially more mass). Furthermore, the addition of the servo-aligned mirror has the capability to compensate for translational misalignments between the axes of the assembled FORT connectors 190, 202. This additional alignment was not possible in the axial FORT of FIG. 9 because the relative beam input angles are pre-determined by the machining precision of the connector entries. In the FORT 180 of FIG. 10, this machining precision error can be completely compensated, leading to reduced losses and at higher response speed. The same initialization alignment system identification and radial optimization will be conducted, but with the addition of the degrees of freedom of the mirror added to the optimization algorithm.

Figure 11:
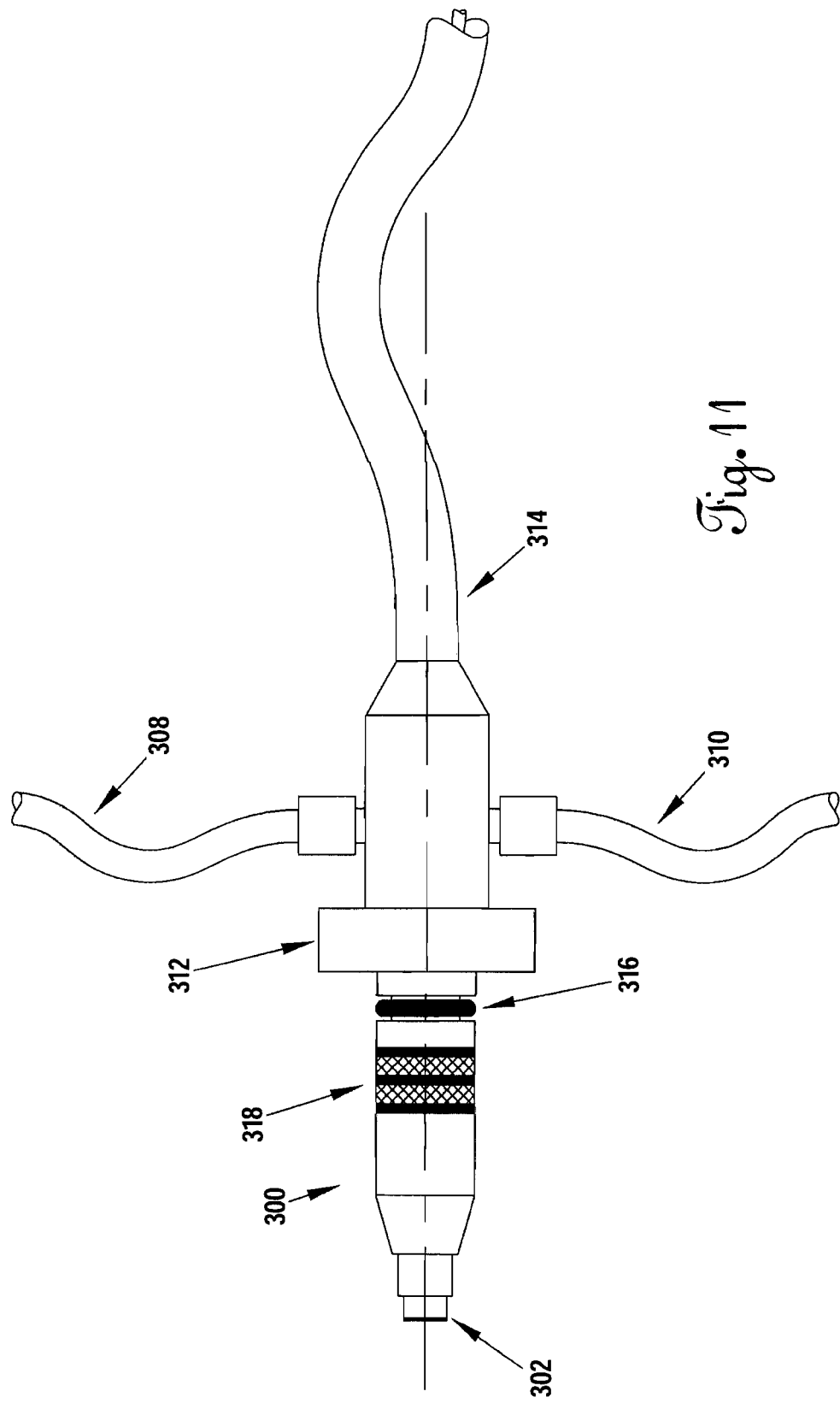
FIG. 11 shows an exemplary laser connector suitable for use in the present invention.

FIG. 11 shows an exemplary optical connector 300 suitable for use in the present invention. The connector 300 has a fused silica beam expansion block 302 with a wavelength-specific anti-reflective (AR) coating contained inside an optical fiber cable assembly 314 with multi-layer armored jacket. Because power is lost in the connector 300, water cooling is fed through the connector by water cooling inlet line 308 and water cooling outlet line 310. The connector is typically equipped with a mating flange 312 for a bolted connection. A dust-intrusion o-ring 316 prevents dust particles from entering the optical pathway and potentially causing a localized thermal buildup by blocking the beam. Two radial contact isolated electrical contacts 318 provide for a test of cable interlock integrity.

Figure 12:
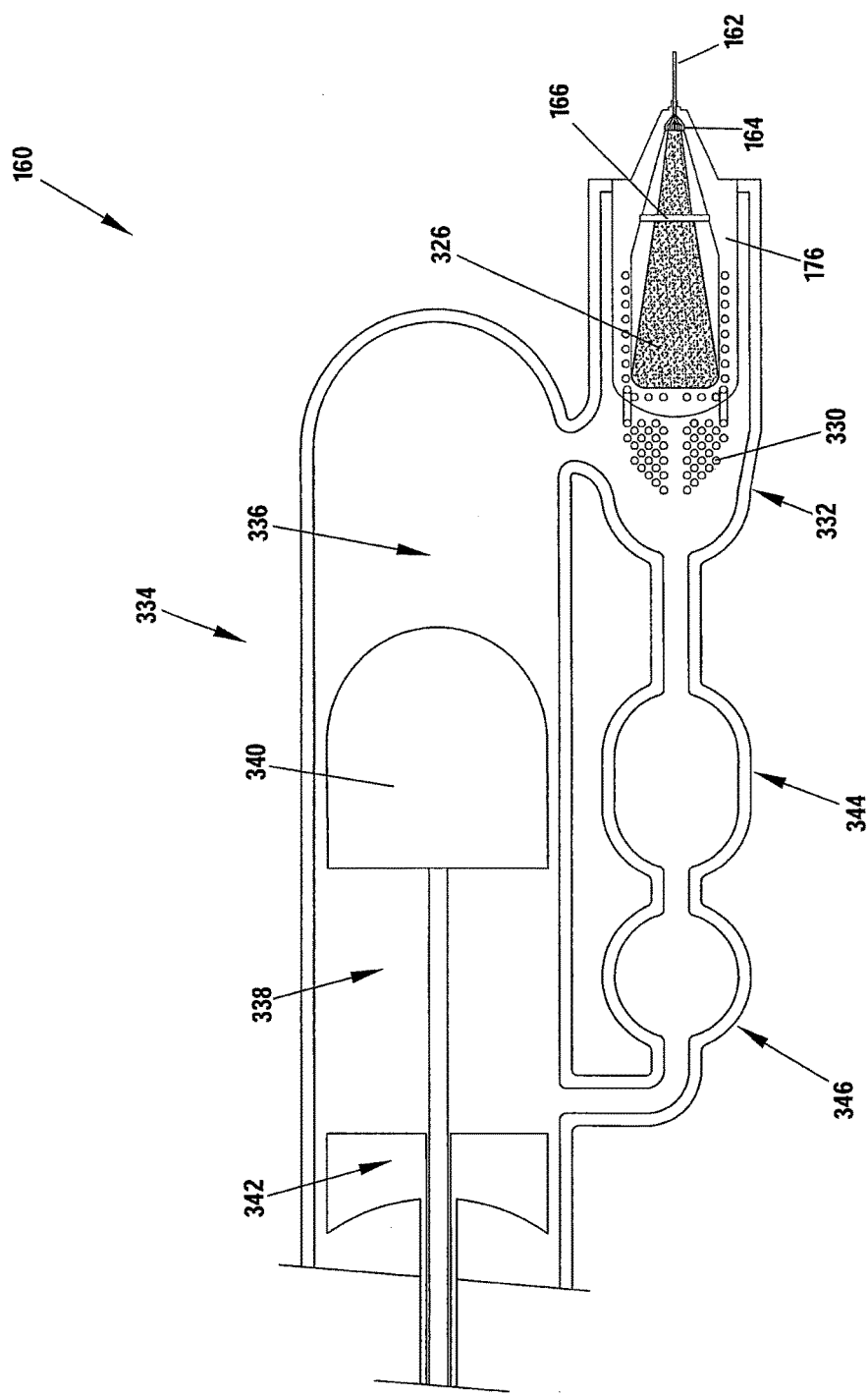
FIG. 12 shows an embodiment of the system in use with Beta-type Stirling engine.

FIG. 12 shows the heat engine 160 described with reference to FIG. 8, the heat engine 160 comprising a high temperature housing 320 and an internal beam dump 176. The laser power enters the heat engine via fiber 162 coming from the power spooler (not shown). The beam is expanded through primary optics 164 and secondary optics 166 into diffuse beam 326, which is directed into refractory beam dump 328. Heat can either be transferred directly through the walls of the beam dump 328 or via an external heat exchanger 330 that cycles an effective thermal transfer fluid (e.g., liquid sodium) through the beam dump 176 and back into a high-power heater 332.

A beta Stirling engine 334 is driven by the heater 332. The engine 334 comprises an expansion volume 336, a compression volume 338, a displacer 340, a power piston 342, a regenerator 344, and a cooler 346. The expansion volume 336 and compression volume 338 are preferably filled with a working gas, which is typically air or helium. This working gas is sealed within these volumes by the power piston 342 and moved between the hot and cold spaces by a displacer 340. The gas is recycled through the cooler 346 and through regenerator 344 prior to re-entering the heater 332. The linkage driving a power piston 342 and displacement piston 340 will move such that the gas will compress while it is mainly in the cool compression space and expand while in the hot expansion space. Because the gas is at a higher temperature in expansion space 336 relative to the compression space 338, and therefore at higher pressure, more power is produced by the movement of piston 342 during expansion than is reabsorbed during compression. This net excess power is the useful output of the engine. There are no valves or intermittent combustion, which is the major source of noise in an internal combustion engine. The same working gas is used over and over again, making this a sealed, closed-cycle system. All that is added to the system is steady high-temperature heat, and all that is removed from the system is low-temperature (waste) heat and mechanical power. The piston 342 can be used to drive a plurality of electrical generation means. This design, using ultra-high laser-delivered power, forms the basis for a unique power generation mechanism that is non-collocated with the source of the energy.

The power levels being dissipated in heater 332 can range from the low kilowatt level to a dozen megawatts using a single fiber. Electrical power conversion efficiencies for a properly designed Stirling engine can reach thirty percent. A megawatt of laser input power could be converted to five-hundred horsepower of electrical drive power. Ten megawatts, feasible with an eight-hundred micron fiber, would yield five-thousand horsepower, which is sufficient to run heavy machinery, such as to conducting mining operations eleven kilometers below the surface of the ocean at the bottom of the Marianas Trench, powered by a ship-board diesel power system driving the laser, or to power a fleet of remotely operated lunar regolith harvesters extracting ice on the Moon, powered by a lunar base nuclear power system using a similar Stirling converter to power a laser. Both of these, as well as many other extreme environment applications, ideally favor this approach as the cooler 346 can easily extract cold from the environment. All of these systems can be operated at tens of kilometers from a static power base using the approaches described herein.

Figure 13:
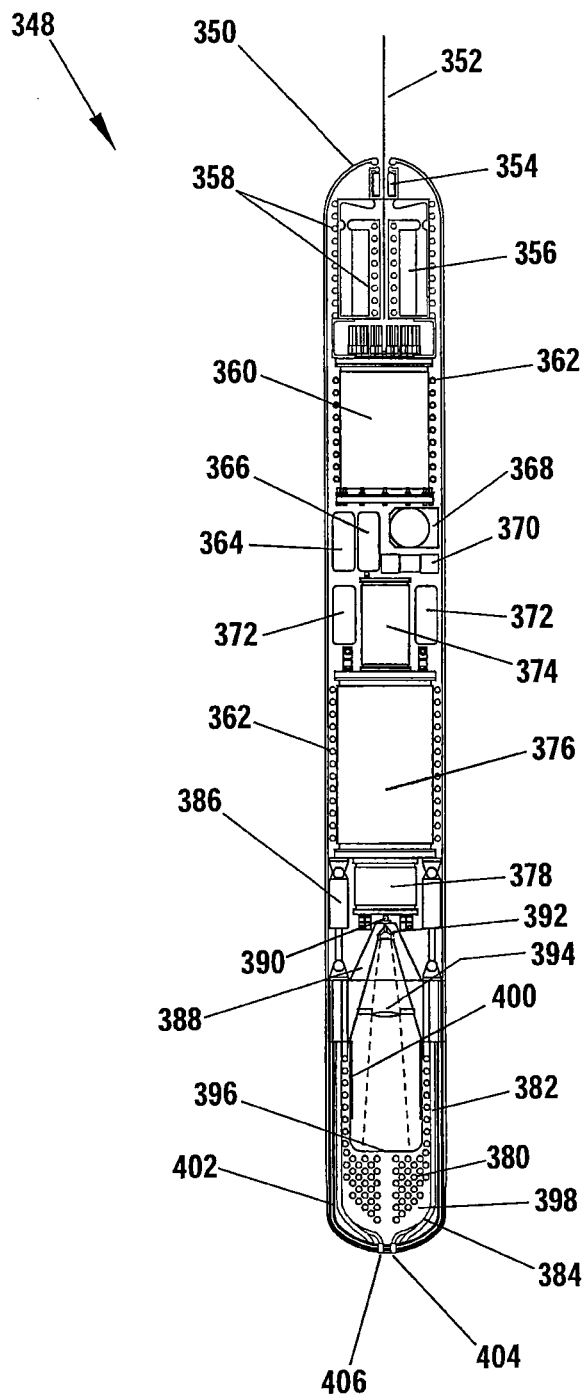
FIG. 13 shows an embodiment of the system in use with an autonomous underwater vehicle.

FIG. 13 shows a robotic device 348 (a "cryobot") designed to autonomously penetrate extremely deep glacial ice caps (e.g., the Antarctic ice sheet over Lake Vostok, the South Pole Lake, Lake Ellsworth, other such sub-glacial lakes, or even the ice caps of Mars or the surface ice cap of the Jovian moon Europa) by melting a path ahead of the vehicle as it descends. Prior to this disclosure, no attempt at the construction of a practical cryobot has succeeded, largely because of two factors.

First, prior attempts at using electricity (in a device known as a Philberth Probe) all failed at slightly over a kilometer of depth. For practical reasons—namely, the ice cap freezes behind the probe as it melts its way down—the vehicle must spool out its connection to the power source from the vehicle. This requires a large spool of wire on the vehicle. Because of resistive losses, the voltage must be increased the further the vehicle descends until eventually arc-over limits the range.

Second, political restrictions on the use of nuclear power sources in Antarctica. While a small SNAP reactor could power such a device, it would never be tested in a deep ice cap on Earth.

A laser-powered cryobot, such as the cryobot 348 disclosed in FIG. 13, changes that. Enough fiber can be carried on the vehicle to permit not only a descent through the deepest known ice caps on Earth—four thousand meters at Vostok—but also to permit a sample return mission by inverting the cryobot and melting its way back to the surface.

The advantages of such a system are further enhanced by environmental restrictions imposed by the international community regarding entry into such subglacial lakes. Planetary Protection restrictions require extensive testing, certification, and lengthy approvals that can take years to decades to approve access using hot water drilling from the surface, which is the only other known technology that can reach these lakes.

With a cryobot, the vehicle can be sterilized to acceptable levels in the laboratory, sealed in a sterile container, and inserted into the ice cap in a sterile condition. Because the melt hole re-freezes only a few meters behind the vehicle, forward contamination is prevented.

The design of a cryobot is governed almost entirely by the diameter of the vehicle and the desired descent rate through the ice. This, along with the temperature of the ice, determines the input power requirements. For example, a one-quarter meter diameter by two-meter long cylindrical cryobot with hemispherical end caps, similar to the cryobot 348 depicted in FIG. 13, working in ice with a temperature of minus five degrees (C.) will descend at a rate of fifteen to twenty meters per day when powered by a five-kilowatt fiber laser. Doubling the diameter (e.g., to accommodate larger science payloads) will reduce the descent rate by a factor of four under the same input power.

FIG. 13 discloses one embodiment of a viable, deep ice cryobot 348 having a cylindrical shell 350 with hemispherical ends. Power is delivered via a bare optical power fiber 352 to the rear (top) of the vehicle. Data may be modulated and extracted via the power fiber 352 so that a surface-based mission control center could maintain a high-bandwidth data link with the cryobot 348 throughout the mission. The cryobot 348 may be equipped with an auxiliary (second) co-linear axial spooler 354 having an auxiliary fiber of smaller diameter than the power fiber 352 for the purposes of maintaining a dedicated communications link. This is of considerable value for the purposes of supervised autonomy in which a surfaced-based scientific or industrial team could interpret real-time data and override local autonomous behavior code for such purposes as collecting a sample from the adjacent ice column or for potentially causing the vehicle to deviate from a direct vertical descent. A primary power fiber spooler 356 is surrounded by actively-controlled chill water heat exchangers 358 that melt water from the front of the vehicle. When a cryobot melts through an ice cap, the bubble of water that surrounds it sees the hydrostatic pressure of the ice mass above it, such that by the time it penetrates a sub-glacial lake at, say, four kilometers depth, all of the sealed components within the vehicle will see four hundred bar (forty MPa) applied external pressure. The design must therefore include provision for either structurally resisting that pressure or for allowing compliant equalization of pressure (through the use of oil filling and a compliant accumulator). Pressure housing 360 houses the primary onboard control computer, and guidance, navigation, and thermal management electronics. Its temperature is maintained within a functional band by heat exchanger 362.

A science or sample bay resides at the center of the vehicle and can include, among many possibilities, water sampling pumps 364; water sampling router valves 366; a lateral ice wall sampling system 368; a lateral ice wall imaging system 370; and potentially a lake floor sediment sampling system. Preferably, the cryobot 348 includes one or more regenerative power storage systems 372. A pump 374 provides both heated and chilled water as needed to the various heat exchangers throughout the vehicle. Science sample carosel 376 can be used for storage of a score or more of filtered water samples. A high-pressure jet pump 378 draws hot water from hot water heat exchangers 380 and drives the heated water through hot water first stage jet feed lines 382 to hot water jets 384 located at the nose of the vehicle. Selective transfer of hot water to different jets (there may be as many as needed) for the purpose of auxiliary or primary steering of the vehicle for the purpose of obstacle avoidance maneuvering. Melt head actuators 386 provide primary or auxiliary steering of the melt head, also for the purpose of obstacle avoidance maneuvering.

As previously discussed, optical power reaches the refractory melt head via fiber and passes into a melt head housing 388 through a fiber junction block 390 and primary and secondary optics 392, 394 that diffuse the beam and cause it to impinge uniformly on a beam dump 396, where it heats the refractory material 398 to high temperature. Electrical power can be extracted in several ways, the most effective for this low power (electrical) operation being a thermoelectric array 400 that takes advantage of the exterior cold (melt water) environment.

Importantly, the nose of the vehicle contains a synthetic aperture radar (SAR) 402 antenna (the electronics for which are located in the pressure housing 360) that is tuned to one or more frequencies (operated independently or synchronously) optimally chosen for penetration of ice. Because of the relatively slow, uniform rate of descent, it is possible using SAR to build a high resolution map of what is ahead of the vehicle (including both liquid voids and solid objects) and to take appropriate evasive action to avoid those features if necessary. This behavior can be programmed as a robotic function onboard the vehicle and can operate without human intervention. In order for the SAR system to operate, the material of the beam dump and melt head material 398 must be made of a radar-transparent material. A suitable example, which is also a refractory material, is beryllium oxide. The front of the vehicle advantageously also contains a miniature, pressure-proof fiber video or still camera 404 for the purposes of documenting the ice in front of the melt head. Fiber cam illumination may include pressure proof array of high intensity LEDs 406 or other compact illumination source.

Figure 14:
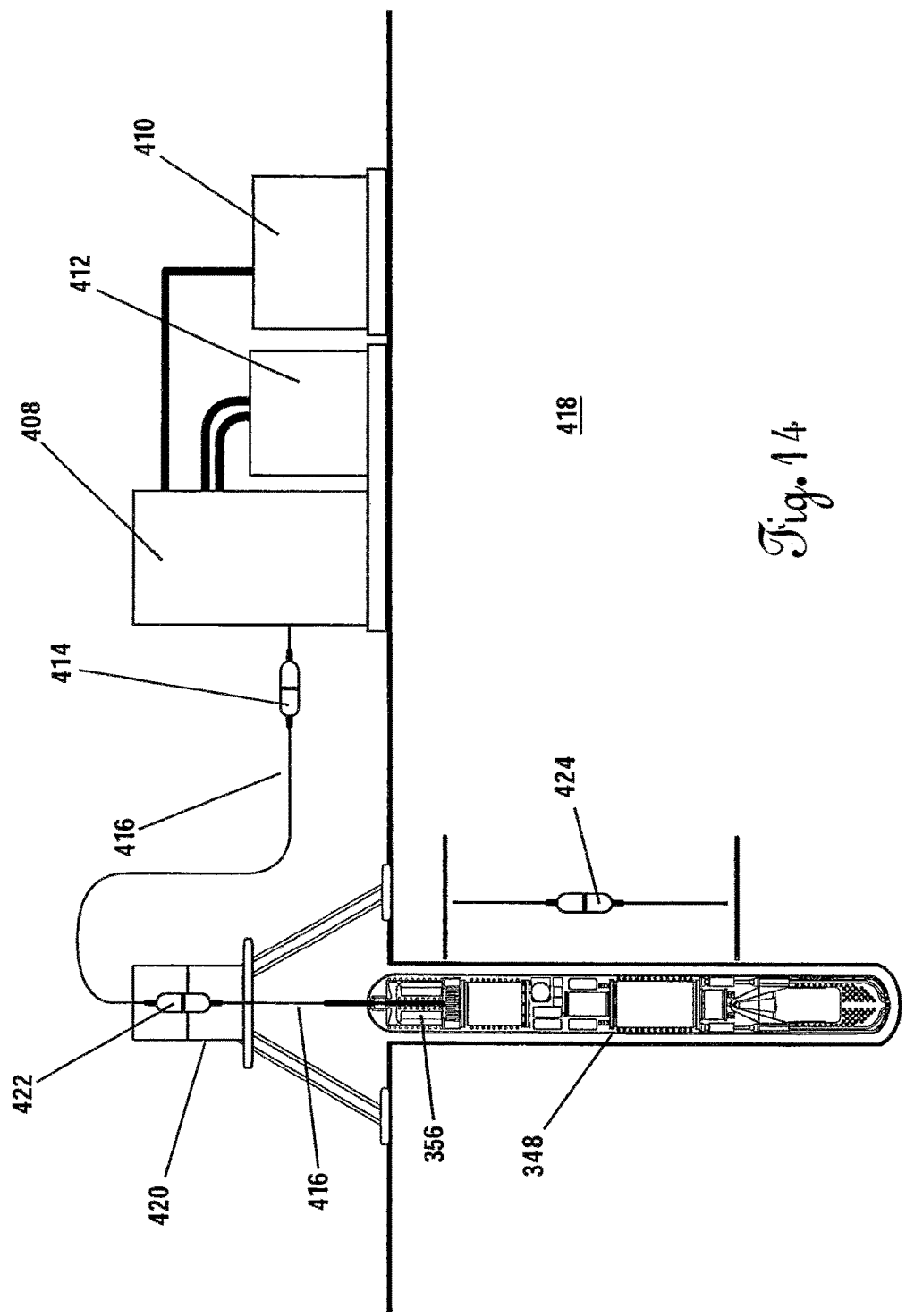
FIG. 14 depicts a mission configuration for the autonomous vehicle shown in FIG. 13.

FIG. 14 shows the field setup for a laser-powered cryobot mission. A high power fiber laser 408 is electrically operated through power supplied by a diesel generator 410. The diesel generator 410 also provides electrical power for operation of a pumped chill water coolant system 412, which provides chilled water for thermal control of fiber laser 408. A high power in-line coupler 414 connects laser 408 to a modular high power process fiber 416, which carries the laser energy over land over some intermediate distance (preferably as short as possible) to provide flexibility in the location of the laser power generation source away from the cryobot injection point into glacier 418. At the injection point, a melt hole entry cab 420 serves to lower the cryobot 348 into the glacier during the initial insertion until the vehicle is submerged into a hole, which is pre-melted so that liquid water is available for system cooling. The entry cab 420 also contains a high power laser fiber coupler 422 that allows the vehicle to be transported to the entry melt hole in a modular fashion, independent of the surface segment of the laser transmission system. The cryobot 348 is also equipped with a high power laser fiber coupler 424 at the melt head. This allows the high power laser fiber spooler 356 to be modularly replaced in the field.

Figure 15:
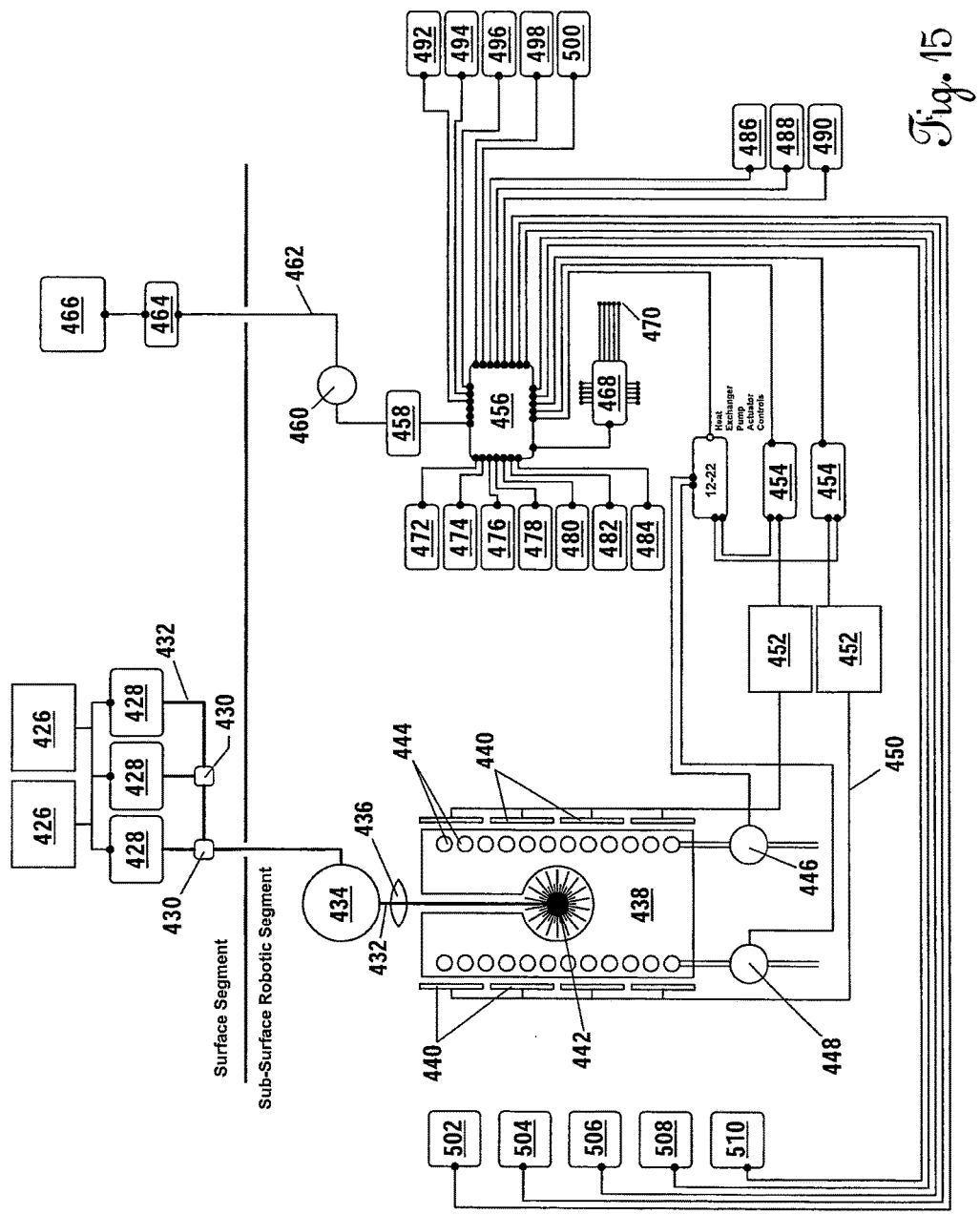
FIG. 15 shows a system schematic for an autonomous cryobot.

FIG. 15 shows a detailed system schematic for a physically-realizable cryobot capable of reaching the South Pole Lake (located twenty-eight hundred meters directly beneath the United States scientific outpost at the south pole) in thirty days, descending through the lake to its bottom, changing its attitude to that of a horizontally-oriented AUV, collecting a sediment sample from the bottom of the lake, and then inverting to a melt-head-up orientation, making itself positively buoyant, and thereby allowing it to melt its way back up through the ice cap in a similar thirty-day egress mission. The objective is to provide the sediment sample return without the use of hot water drills.

The surface segment consists of two one-hundred kilowatt diesel generators 426 that supply three twenty-kilowatt fiber lasers 428. The output of each twenty-kW laser is fed to a matched coupler 430 through an approximately three-hundred micron diameter bare fiber core 432. Approximately eight kilometers of this bare transmission fiber are wrapped on high power fiber spooler 434, which resides inside the tail cone of the cryobot. Laser input power from the fiber 432 is fed into beam forming optics 436 where the beam is expanded into beam dump 438 that is surrounded by thermoelectric converter arrays 440. The impinging beam 442 could, contrarily, be focused to create a stable plasma in a working gas at the center of the refractory thermal flywheel. The result is the same: the conversion of coherent laser energy into radiant heat. This heat is extracted directly for mechanical tasks by heat exchanger 444 and this hot water may be both used to control other parts of the vehicle using thermal management pumps 446 that can be made to pump both heated and cold melt water to locations where needed. The hot water from heat exchanger 444 is also desirably sent directly to high pressure pumps 448, where it can be directed to hot water jets for the purpose of enhancing the rate of vehicle descent.

The raw electrical power generated by arrays 440 is fed through power bus 450 to a series of power management modules 452 with redundant elements present to provide increased mission assurance. Regulated power from modules 452 is sent to regenerative power storage means 454, which can store power in the form of lithium-ion batteries, fuel, cells and the like. These electrical power storage systems provide the standard power bus for all cryobot onboard systems.

The main system executive resides on computational processor 456, which in turn communicates with the surface via data conversion switch 458 that converts electrical data communications impulses into light impulses which are then fed into communications fiber spooler 460 which contains eight or more kilometers of smaller diameter fiber 462 than that used for power transmission. This is then re-converted to a digital signal on the surface via converter box 464 (e.g., a fiber optic to Ethernet switch) and thus provides a common data feed to mission control 466 for monitoring and control of the mission.

The main processor 456 also communicates with a real-time vehicle sensor net 468 that reads scores of environmental state sensors 470 (e.g., thermal, pressure, optical) that are used to provide input into the vehicle thermal management and safety override sub-systems. The processor 456 also communicates and controls the Trajectory Diversion and Attitude Control System, which is composed of a flux gate compass 472; vehicle roll sensor 474; vehicle pitch sensor 476; melt head pitch sensor 478 and actuators: longitudinal center of gravity shifter 480; radial center of gravity shifter 482; and melt head pitch drives 484. These systems and sensors allow the vehicle to not only allow deviation of the vehicle trajectory from a direct, gravity-driven vertical descent through the ice, but also permit the vehicle to fully invert—a process that takes time, but is feasible with the stated systems for moving the vehicle mass centroid to an eccentric position. This allows for enhanced obstacle avoidance and also a sample return or abort to surface.

The vehicle contains an auto-egress system that works in conjunction with the center-of-gravity shifters. This includes a variable buoyancy engine 486; an emergency ballast drop system 488; and an "ice tractor" system 490. The cryobot begins its mission in a head down position (as shown in FIGS. 13-14) and maintains this orientation, assuming no obstacle avoidance is required, until it reaches a sub-glacial lake. It then uses the longitudinal center-of-gravity shifter 474 to cause the vehicle to rotate ninety degrees up to a horizontal attitude; the radial center-of-gravity shifter 476 allows the vehicle to roll to a preferred pointing direction so that formerly lateral-looking science payload sensors can be made to look directly at the lake bottom. The variable buoyancy engine 486 can be used to cause the vehicle to descend and hover at a specified altitude over the lake floor while a sediment core sample is taken. The complete science payload can contain, for example, imaging systems 492; environmental sensors 494; lake bottom sediment core sampler 496; lake bottom sonar profiler 498; and water samplers, including filter samplers 500.

At the conclusion of the data collection phase of a mission (and the acquisition of the desired core and water samples) the variable buoyancy engine 486 is caused to dump ballast (sterile water). The center-of-gravity shifters invert the vehicle to a head up position and the vehicle begins to melt its way upward, using the positive buoyancy of the vehicle to drive it upward in a bubble of water. An optional, emergency ballast drop-weight (made of a neutral, non-corroding, sterile material) system 488 may be activated if there is a failure in the variable buoyancy system 486 fails on ascent. Lastly, an optional "ice tractor" 490 can be employed to assist in ascent by providing a ratcheting mechanism that allows the vehicle to mechanically force itself forward (i.e., upward). This can comprise direct lateral spur gears that can be extended from the body of the cryobot and driven either by pumped water or electrical motors or it could be of a form consisting of a temporary lateral locking mechanism (e.g. a pressure cylinder and blade pressed against the ice laterally) and a translational ratchet that advances a specified distance up the body of the vehicle, locks to the wall (using a similar lateral force application mechanism means) and then releases the lower latch and a draw motor (e.g. a linear actuator, or gear driven linear track means) pulls the vehicle forward. The intent of the ice tractor 490 is to maintain contact between the melt head and the advancing ice column.

Importantly, the vehicle also contains an Obstacle Avoidance and Navigation System, which contains a forward-looking ice-penetrating low frequency radar (e.g., 100 MHz) 502; a forward looking mid-frequency ice penetrating radar (e.g., 400 MHz) 504; a depth sensor 506; a high precision gravimeter 508; and an odometer 510. The ice-penetrating radar (IPR) system forms a part of the SAR system previously described and can be used to dramatically enhance the ability of the vehicle to detect large objects as far as a kilometer ahead of the vehicle and small (centimeter-scale) objects as far as fifty meters ahead of the vehicle. Further, for Arctic and Antarctic operations on Earth, the top roughly fifty to one-hundred meters of ice is not solid. This is a transition zone between fresh, loose snow and solid ice known as the "firn" layer. Because it is not made of solid ice, a cryobot returning to the surface using positive buoyancy will eventually not be able to cause the vehicle to rise to the surface because air content in the firn will cause a bubble of air to form at the head of the vehicle. The ice tractor 490 will overcome some of this and a cryobot of the type described here will be able to rise to within fifty meters of the surface before both buoyancy and lateral ability to hold load will fail. At this point a surface-based recovery procedure is needed that employs a hot water drill to penetrate to the vehicle. An auto-docking and latching system can be created to retrieve the vehicle at that point. Knowing where to drill, however, is a critical part of this recovery procedure and for this the SAR radar now is used as a directional beacon for the drilling system.

Figure 16:
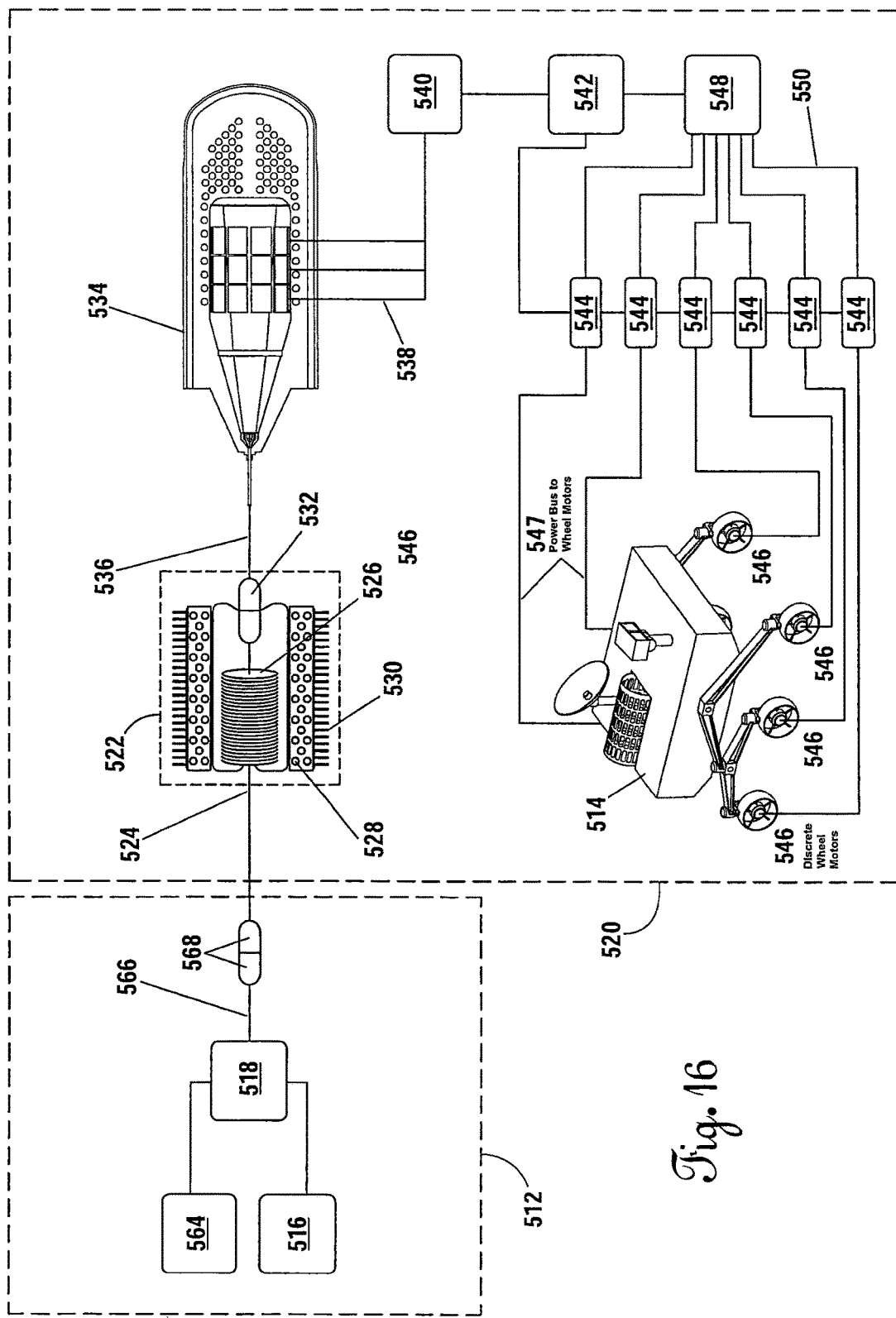
FIG. 16 shows an embodiment in use with an exploration and science rover.

FIG. 16 shows another embodiment of the invention in which a laser power generation system 512, residing on a planetary lander system, is used to remotely power an exploration and science rover 514. The advantages of this approach are significant in that the rover 514 can be made much more lightweight and agile—and therefore survivable—in a rugged, unknown environment. Furthermore, it allows for the costly, heavy power generation equipment to remain with the lander (or planetary base) and therefore reduce the risk of losing that precious resource were there to be an accident with the rover 514. This approach can be used to either power multiple rovers from the same power source or to allow many long range missions by a single rover. The concept can be further extended to one in which a fixed planetary base—for example, a lunar polar base in a deep, sun-less cold crater mining water ice—can use a common central planetary (nuclear) power supply generating power in the five-hundred kilowatt to multi-megawatt range to operate a remote, distributed fleet of large industrial regolith harvesters that scoop up the surface dust and extract water through direct heating.

The planetary lander laser power system 512 generally comprises the elements previously described. The power supply 516 for laser 518 is preferably provided by a compact radiothermal generator (RTG) for lightweight initial robotic missions or a planetary high power (nuclear fission) thermal source for industrial operations, either of which are subsequently converted to electrical power using any of the means previously described and then used to drive the laser. Photovoltaics could also be used to provide power but this is not an option for outer planet exploration and resource extraction (due to insufficient solar flux).

The mobility system 520 comprises the common power train previously described, which includes a rover-based fiber spooler system 522 that receives laser energy via inlet fiber 524, which is trailed out behind the vehicle as it moves from onboard fiber spool 526. The fiber spool 526 is cooled by actively controlled heat exchanger and chiller 528 and passive heat dissipation system 530. A high power fiber coupler 532 allows connection of a beam dump 534 via process fiber 536. Thermoelectric arrays (or other electrical power generation means previously described) send electrical power via power bus 538 to a power management system 540 which charges or recycles a regenerative energy storage system 542. Direct controlled power from the regenerative power storage system 542 can be delivered at high current capacity to individual motor or actuator controllers 544 that can be used to drive discrete wheel drive electric motors 546 via power bus 547. Onboard computer system 548 makes behavioral decisions either autonomously or scripted and sends digital control signals via digital links 550 to operate the discrete motor or actuator controllers 544. All systems composing rover mobility system 520 are carried onboard the actual rover 514.

Figure 1A:
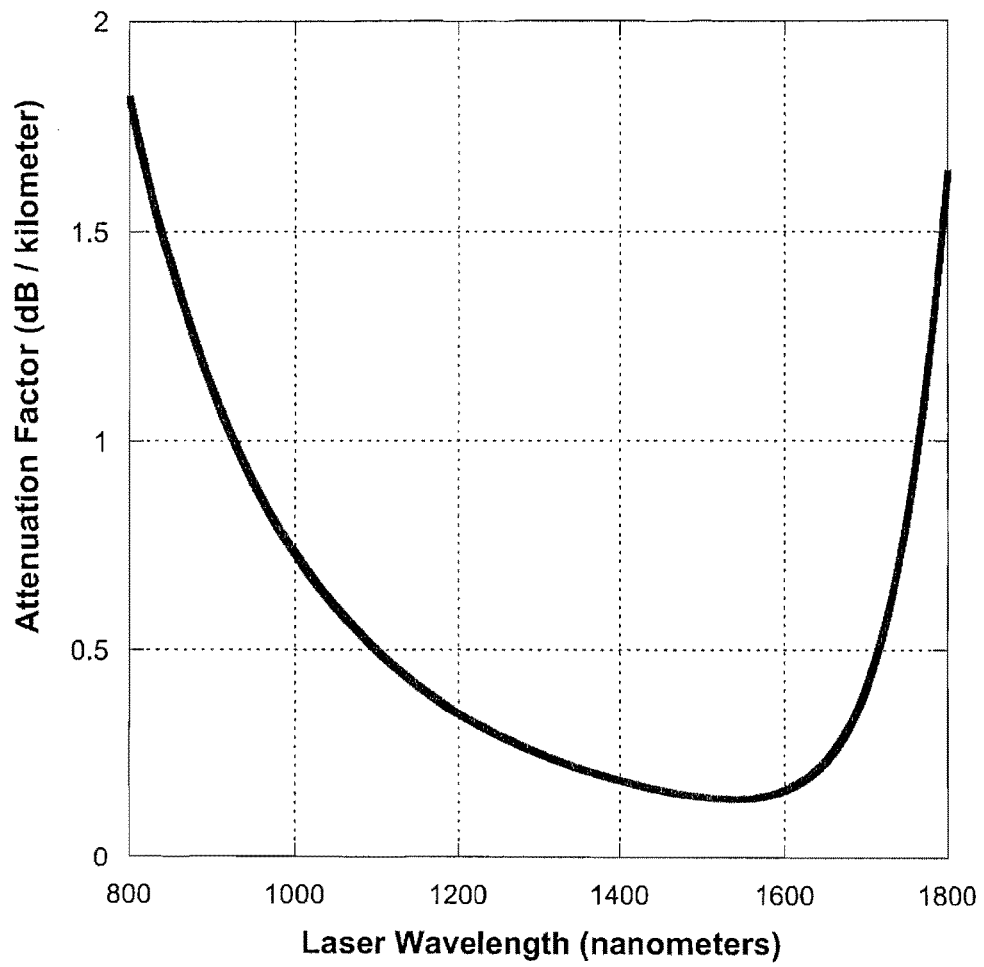
FIG. 1A shows a plot of the theoretical composite attenuation limits for optical power transmission as a function of wavelength per kilometer of pure silica fiber.
Figure 1B:
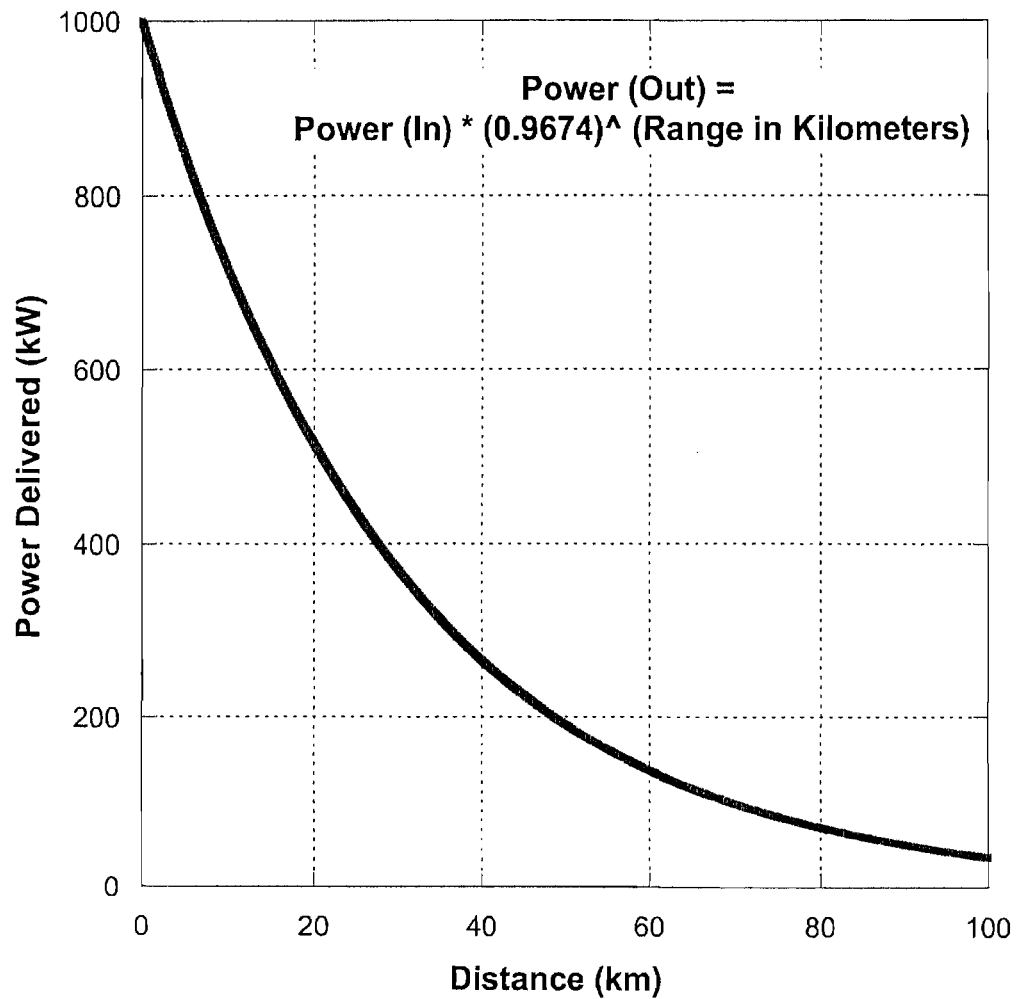
FIG. 1B shows a plot of the theoretical limiting optical power transmission as a function of the length of fiber.
Figure 2:
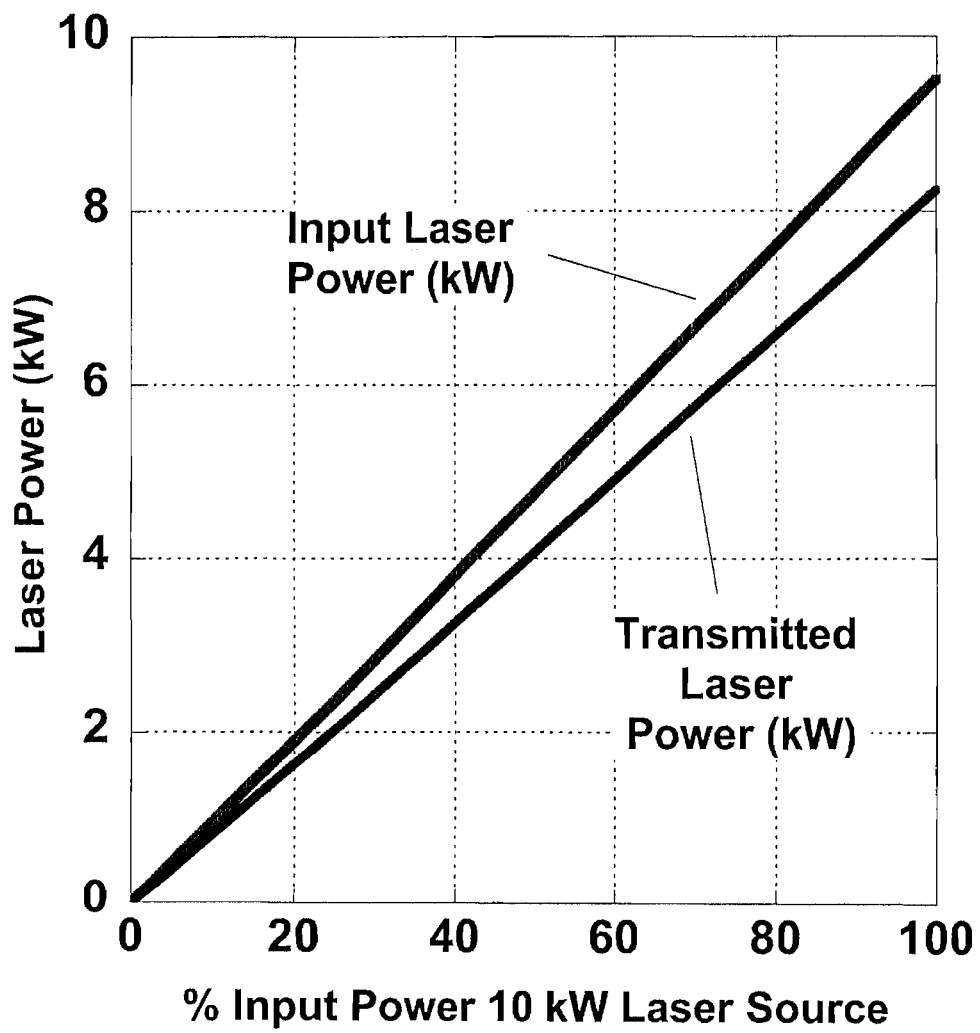
FIG. 2 is a plot of a high power, long range laser power transfer test.
Figure 3A:
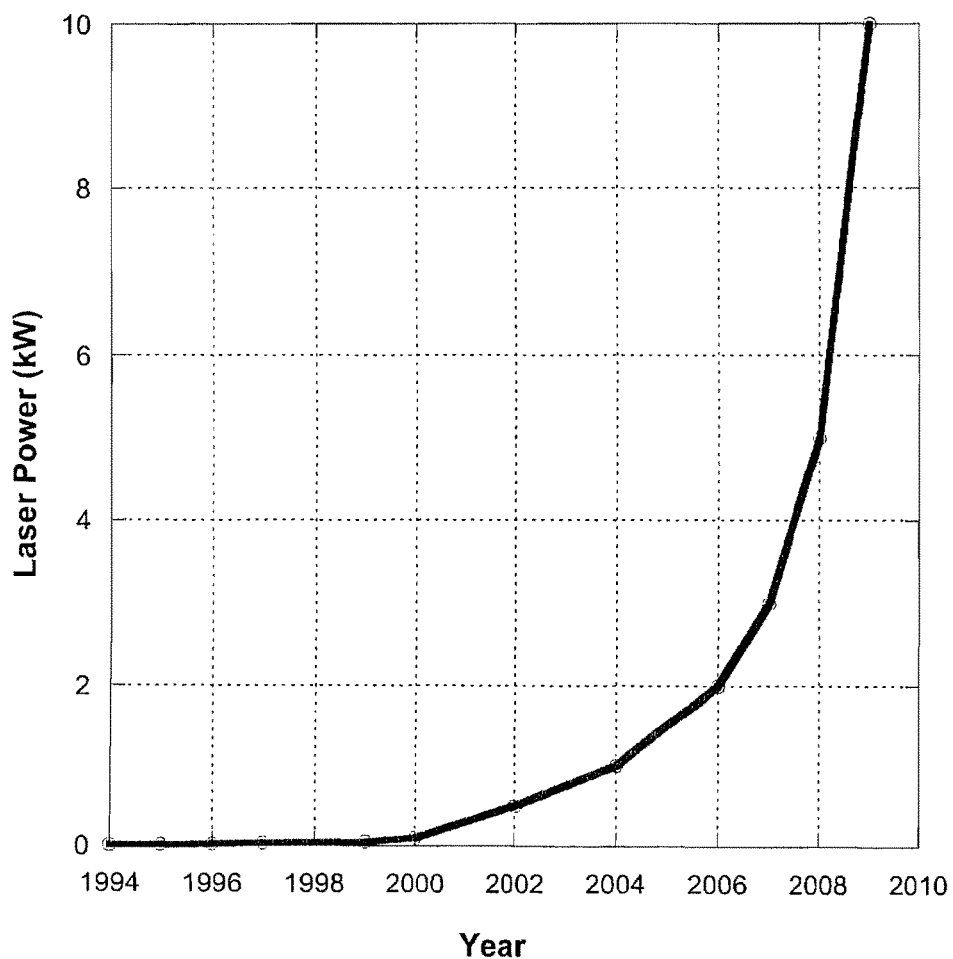
FIG. 3A shows a plot of raw industrial laser continuous output versus year for a single mode fiber laser.
Figure 3B:
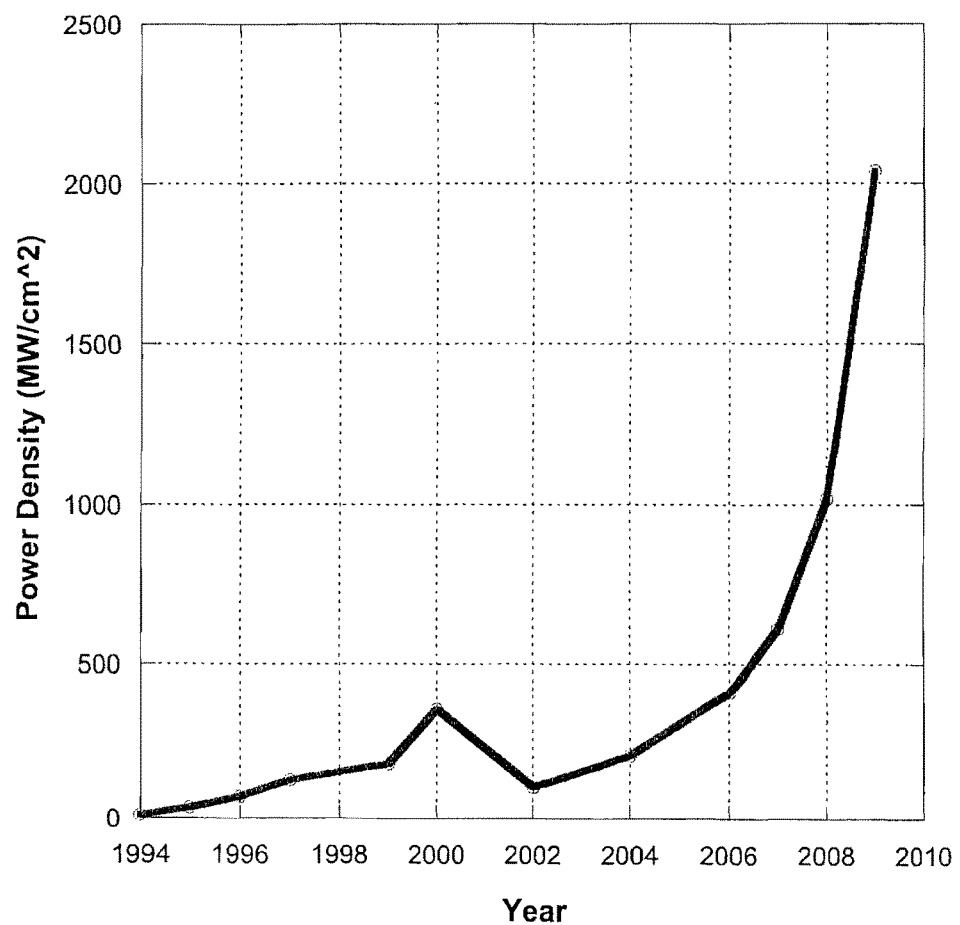
FIG. 3B plots power density in $MW/cm^2$ since 1994.
Figure 3C:
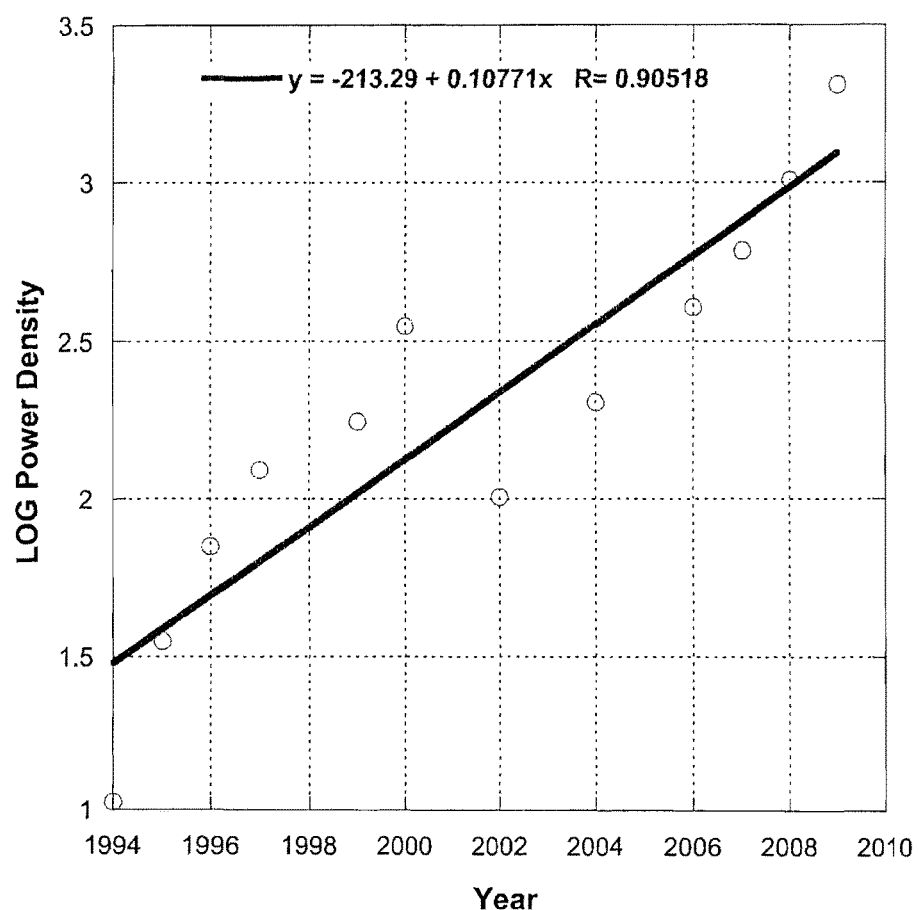
FIG. 3C plots the log of the power density of FIG. 3B for a single mode fiber laser.
Figure 3D:
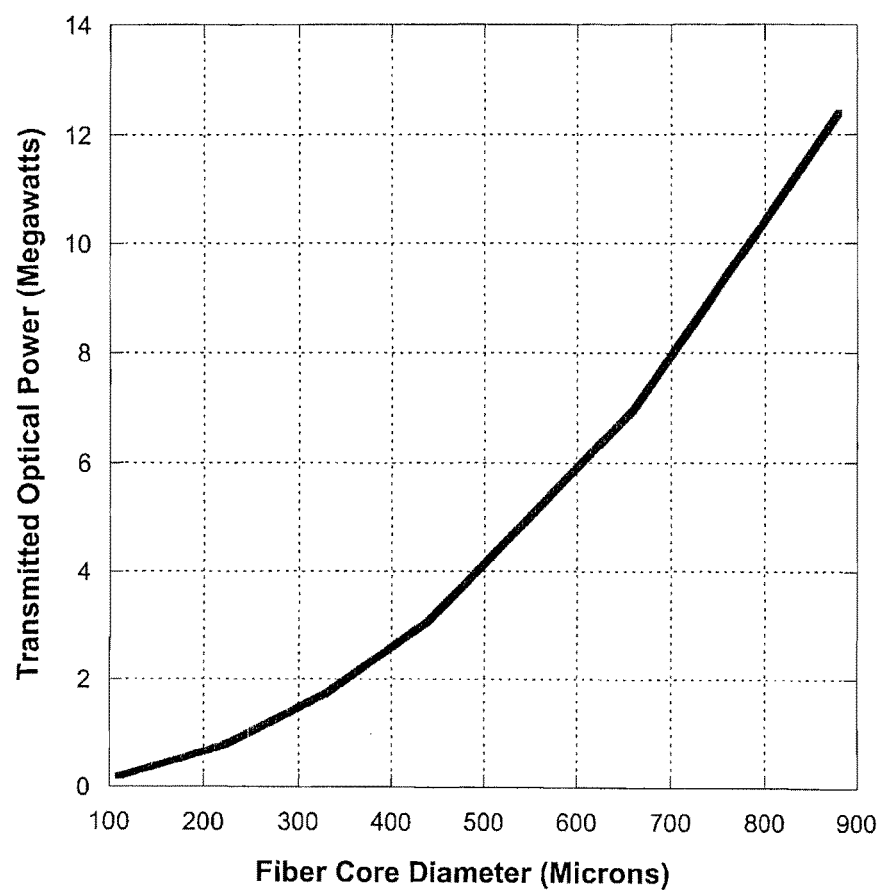
FIG. 3D shows a plot of the present optical power transmission as a function of fiber core diameter.
Figure 17:
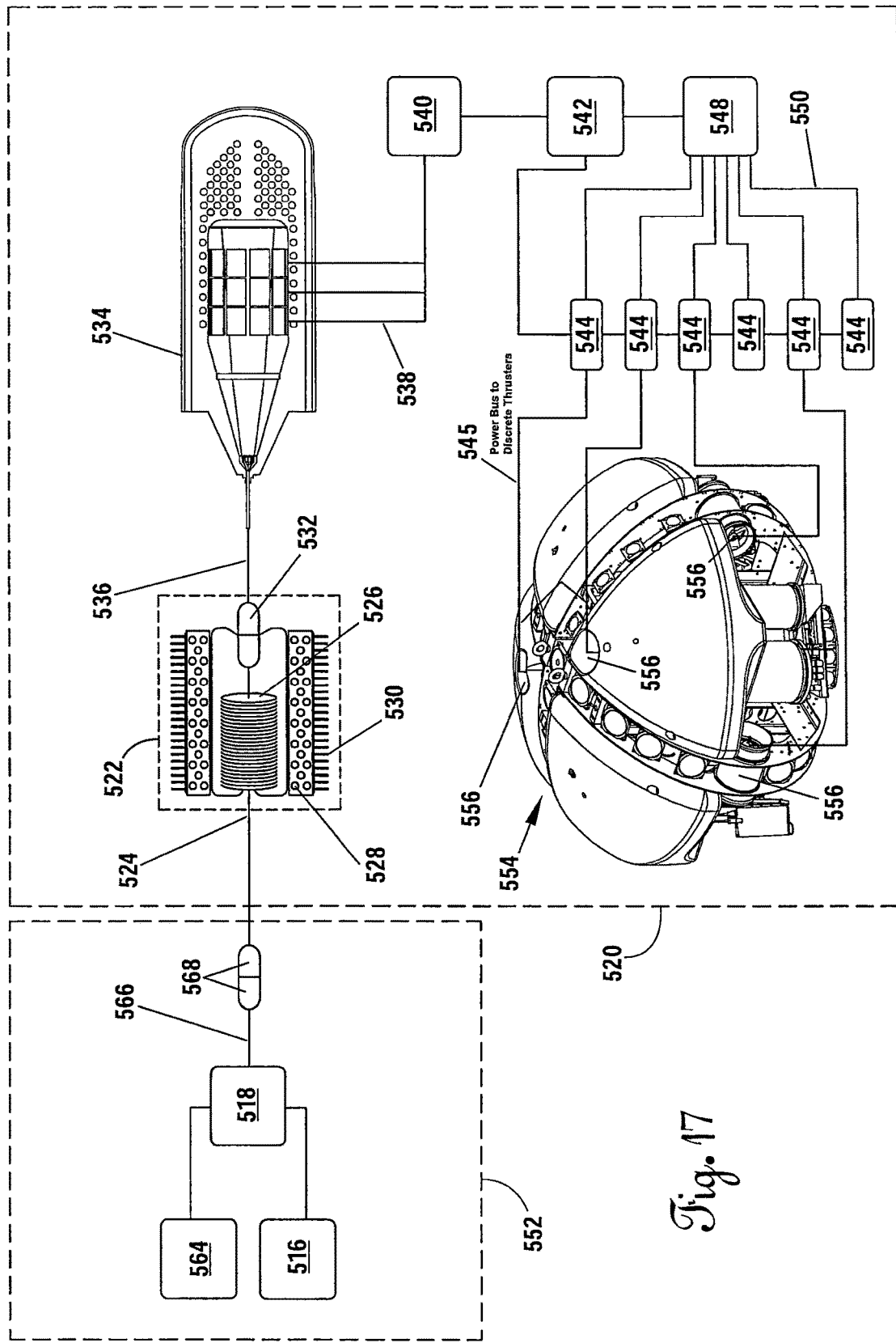
FIG. 17 shows another embodiment in use with an underwater vehicle.

FIG. 17 depicts another direct variation of the invention in which an unmanned underwater vehicle receives power in a directly analogous fashion as that described in FIG. 16. There are two noteworthy differences in FIG. 17 vis-a-vis FIG. 16. First, the laser and laser power supply are based on a floating platform (e.g., an offshore oil rig or complex) or a ship as part of a ship-based power system 552. Either mission-specific, dedicated diesel-electric power can be provided or the onboard power plant for the ship or platform itself (likely either diesel or nuclear) can be used to provide an essentially unlimited amount of input power to the laser. This is an important factor as it permits (unlike an RTG-powered planetary lander, for example) industrial power levels to be optically transmitted to the underwater vehicle. For the same reasons as discussed earlier, there are severe limits to the amount of power an electrically operated underwater vehicle can receive from the surface. The design of a high powered ROV for work at three kilometers depth, for example, is a complicated undertaking and the management of the cable alone is a major logistical cost and serious burden which limits the class of ship that can be used to conduct the work. While there are line losses associated with laser power transmission (see FIG. 1B), and further losses associated with conversion of the delivered energy into electrical power, those are relatively small issues where there is plentiful electrical power on the surface. The laser-powered AUV 554 or ROV can competitively be operated against the mechanically inefficient current state of industrial ROVs being used for the offshore oil industry. Further, with the laser-powered approach shown in FIG. 17, it becomes realistically feasible to conduct high power industrial operations anywhere under the ocean, to full ocean depth (eleven kilometers).

The mechanism for power conversion for underwater vehicle applications shown in FIG. 17 will likely be a heat engine (e.g., Stirling cycle) as this can be efficiently, and economically scaled to very large, continuous power levels (thousands of horsepower). Unlike the planetary robotic landers, regenerative electrical power storage systems 542 will largely be for clean (low electrical noise) operation of onboard control, sensing, and communication and for limited emergency maneuvering. The actuators (e.g., main thrusters 556) will be driven via power bus 545 directly from the electrical power output (generator) driven by the heat engine. The architecture shown in FIG. 17 creates an entirely new design space for underwater vehicles. Because the power fiber can be very small in diameter (e.g., one megawatt through an eight-hundred micron fiber) and because the vehicle has control of its own trajectory (because of the onboard fiber spooler), it becomes logical to run not only traditional surface-controlled ROVs, but also AUVs with this method, regardless of the degree of human intervention with a preprogrammed mission that may be carried out autonomously in these last two cases. The ability to ditch the majority of the vehicle batteries means less requirement for expensive syntactic (ocean depth rated floatation foam) and the entire vehicle becomes able to be reduced to its key functions of high power mobility and its designated mission task (e.g. repairing a deep pipeline; harvesting manganese nuggets off the deep ocean floor, etc.).

Figure 18:
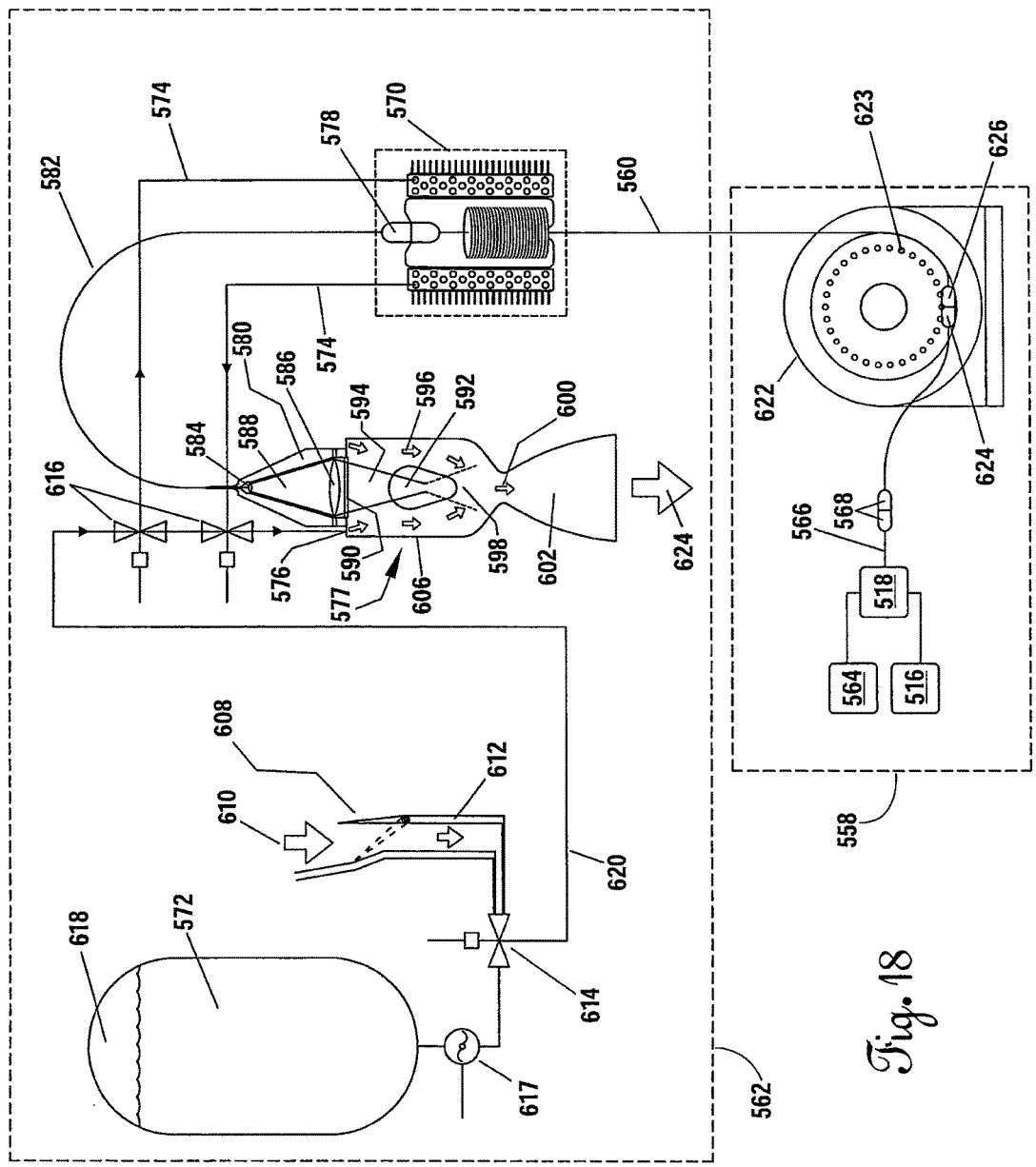
FIG. 18 shows an embodiment in use with a launch vehicle.
Figure 19:
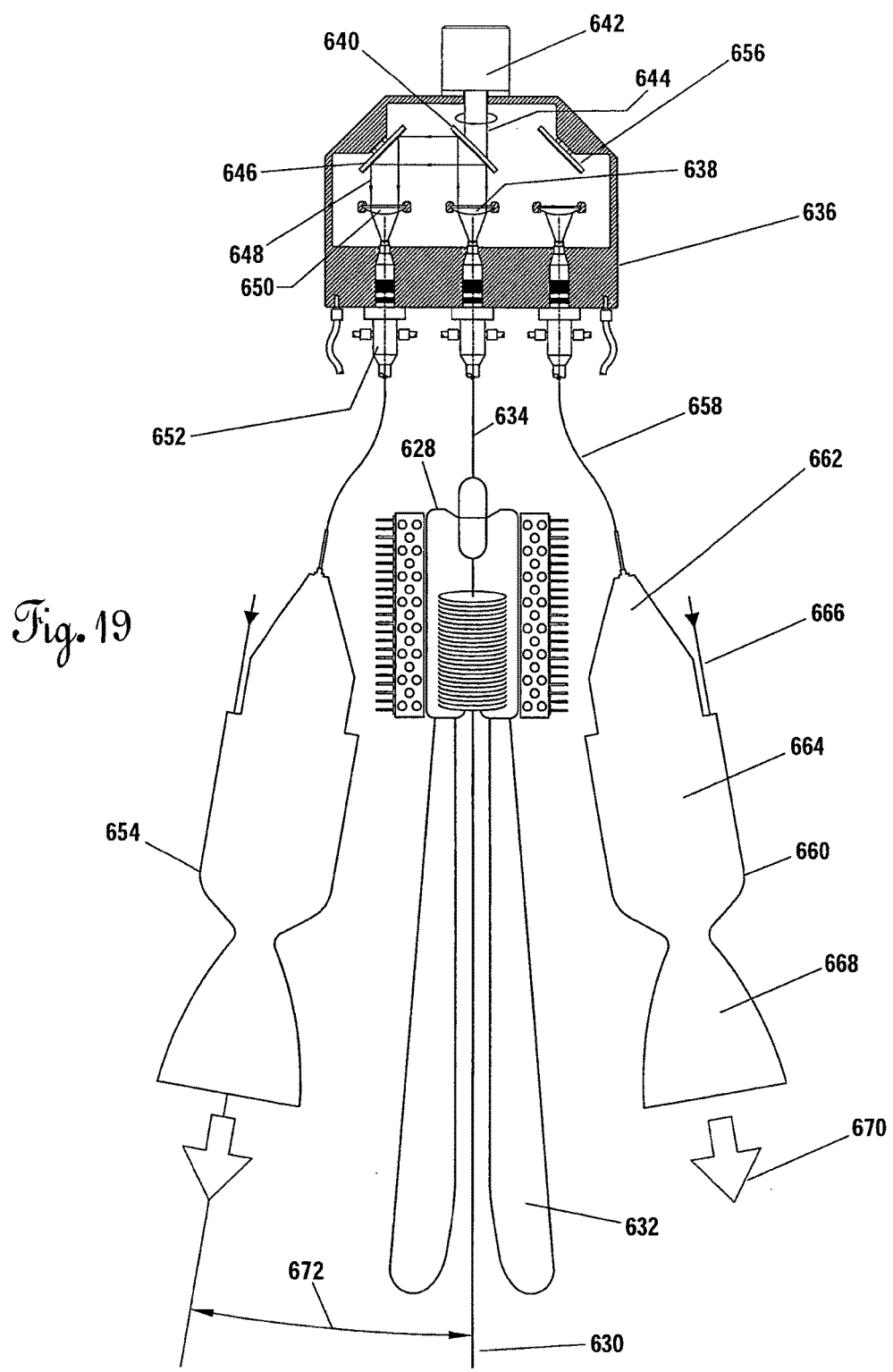
FIG. 19 shows an embodiment having a central spooler in use with multiple thrusters.
Figure 20:
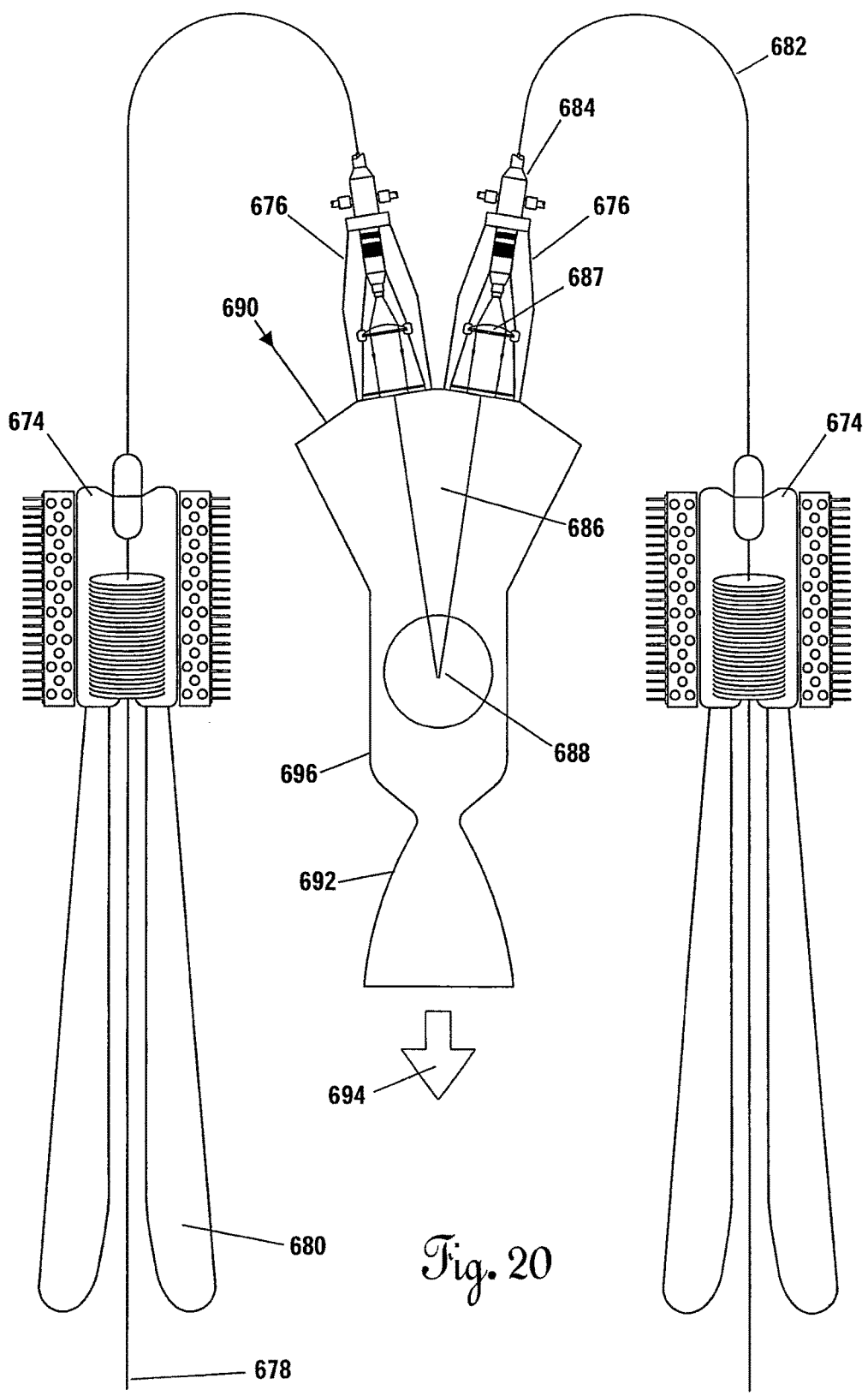
FIG. 20 shows an alternative arrangement of the system of FIG. 19.

A dramatic variation of the invention is shown in FIGS. 18-20. For nearly three decades, intense research has been conducted on the subject of laser or microwave powered launch of spacecraft from the ground to Low Earth Orbit (LEO). These concepts involve direct beaming of a laser, or banks of lasers, at a target launch vehicle in order to either directly ablate an expendable material on the back side of the spacecraft to create thrust or to heat a working fluid within the vehicle, generally using mirrors on the periphery of the vehicle to reflect the light towards a reaction chamber where the working fluid is to be heated, and then expand the working fluid through a nozzle to create thrust. Regardless of the method chosen, all of the approaches thus far attempted with laser launch have failed for three primary reasons: atmospheric attenuation of the beam; atmospheric distortion of the beam; and line-of-sight limitations. For an object to reach a stable orbit in LEO, it must reach an altitude of approximately three-hundred kilometers or more, but more importantly, it must accelerate to a tangential velocity of approximately eight kilometers per second. The launch trajectory is thus curved and carries the vehicle a substantial distance horizontally away from the launch site before orbital insertion parameters are met. Tracking of the vehicle and attempting to keep the beam locked onto it becomes a daunting task. Schemes have been proposed to have multiple beaming stations around the Earth to deal with the problem of not being able to keep a single beam locked onto an ascending vehicle when it goes over the horizon, but these would represent wasteful duplication of expensive laser power generation systems. Similar drawbacks apply to microwave power beaming. Both approaches are significantly degraded by weather.

FIG. 18 presents the generic concept of fiber laser launch. Similar to the previous discussions, a ground-based laser power generation station 558 provides very large amounts of power into fiber 560, which is spooled out from a launch vehicle 562. The ground station consists of power source 516; laser chilling station 564; laser 518; high energy process fiber 566; and inline couplers 568. A spooler 570 on the launch vehicle 562 is chilled by any of the means previously identified, but in the case of laser launch an additional coolant could be in the form of a cryogenic working fluid (e.g., liquid hydrogen, liquid nitrogen) that is stored in chamber 572 and fed regeneratively via channels 574 through a heat exchanger through fiber spooler 570 to pre-heat the working fluid before entry into the working fluid injection ports 576 into a gas expansion chamber 577. Importantly, the output of spooler 570 goes through an optional coupler 578 and is then connected to a laser injection interface structure 580 by fiber 582 where the output proceeds through beam forming optics 584, 586.

There are two general approaches available at this point to create thrust, both of them efficient. In the first idea, the beam forming optics 586 focus the beam 588 of laser energy through a laser window 590 on the back side of the gas expansion chamber 577 and bring the beam to a point inside the gas expansion chamber 577, creating a stable central plasma core 592. Working fluid enters the gas expansion chamber 577 via fluid injection port 576 or other entry means. The working fluid can be any molecule that forms an expansive gas when heated—thus it could be cryogenic liquids (e.g., liquid nitrogen, liquid hydrogen, liquid air, liquid argon, $CO_2$, etc.), compressed gases of any type (e.g., nitrogen, xenon, hydrogen, argon, air etc.), or liquids of any type (e.g., water, methanol, or the like that, when heated, dramatically expands in its gaseous phase).

As the working fluid enters the gas expansion chamber 577, it is preheated in the focusing zone or optically heated expansion cavity 594 and begins to expand, passing around the central plasma core 592 via path 596. A convective mixing zone 598 exists beyond the plasma centroid 592 and at this point the hot, expanded gas passes through nozzle throat 600, through high temperature expansion nozzle 602 and creates thrust 624. Alternatively, plasma core 592 can be replaced by a series of heat exchangers where an expanded (as opposed to focused) beam impinges, with all other facets remaining the same. The purpose of the heat exchanger is to impart the energy of the beam into the working fluid, rapidly creating superheated gas in reaction chamber 577 whereupon, as before, the gas is expanded through nozzle throat 600 and into high temperature expansion nozzle 602 (i.e., exhaust) creating thrust 624. It is the purpose of the method described to emulate the manner in which a normal mono- and bi-propellant rocket engine creates thrust, but importantly allowing the use of inert fuels (working fluids) which will lead to much safer launch and operation—unlike traditional rocket launch, the termination of the laser beam would immediately cease thrust and there would be no danger of an exploding booster should a guidance system fail during launch. The reaction chamber or gas expansion chamber 577 is desirably designed to minimize radiative heat loss through the chamber walls 606.

Importantly, the working fluid can be from several sources. During initial flight through the atmosphere, a ram air scoop 608 in the open position on the side of the vehicle allows atmospheric air 610 to be compressed and taken into the vehicle. This atmospheric air 610 can then be sent through a ram air intake structure 612 and through flow selector means 614, and through bypass valves 616. Bypass valves 616 can optionally send the working fluid to the heat exchanger located in the fiber spooler 570 for preheating to improve the efficiency of use of all heat being delivered to the vehicle via the fiber laser power system. At approximately twenty to thirty kilometers altitude, the atmosphere will be too thin to provide effective quantities of working fluid to be expanded to create thrust. A gradual transition will take place, where working fluid may be drawn both from the atmosphere as well as from the chamber 572. Eventually, at sufficient altitude, classed as "exo-atmospheric" flight, the vehicle 562 will need to rely solely on stored onboard working fluid (i.e., propellant). Chamber 572 carries that exo-atmospheric working fluid, which is preferably one of liquid hydrogen, liquid nitrogen or other liquefied gas, but alternatively could be a stable fluid such as water and other liquids and compressed gases (see above) as well as traditional monopropellants used for spacecraft maneuvering. The logic for using liquid water is that the most logical micro payload (the class of launch vehicle most likely to be powered by this concept in the one to one-hundred kilogram payload range) is, in fact, water because it is a dense, acceleration-insensitive material that is of great demand in low earth orbit (LEO). Other payloads might include dense consumables and acceleration resistant electronics, sensors, and other high-technology re-supply items that may be needed in LEO. The working fluid contained in chamber 572 can be forced into the gas expansion chamber 577 by several means, including vehicle acceleration; an optional turbopump 617; or an optional gas blow down system 618 that utilizes an inert pressurized gas to force the fluid through channel 620 to the reaction chamber (i.e., gas expansion chamber 577).

The length of optical fiber needed to achieve orbit is variable as the launch vehicle can carry an independent small propulsion and guidance system for final orbital insertion. From a practical standpoint, however, a fiber length on the order of one-hundred kilometers could be considered a limiting value as attenuation along the length of the fiber will eventually reduce the effective power received at the vehicle. During the highly energetic initial phase of the launch, a properly designed vehicle should be able to make use of the majority of the heat delivered as the power loss over the fiber deployed behind the vehicle will be small. Regenerative pre-heating of the working fluid, using channels 574, represents one of several means for extracting heat both from the coherent or focused element of the delivered laser energy (via the beam focusing optics) and from the power dissipated in the fiber spooler 570. The spooler 570 could advantageously be placed within the working fluid flow path or reservoir prior to the fluid being injected into the focusing zone or optically heated expansion cavity 594. Both sources (coherent optical and non-coherent radiative heat from the spooler) will viably contribute to the overall thrust of the system.

Because the objective of fiber laser launch is to dramatically reduce the cost of placing small kilogram-level payloads (1 to 100 kg) into LEO, the vehicle design must be as efficient as possible. Thus, measures such as using the lightest weight materials for the vehicle structure and propulsion and guidance systems and striving for economy of scale are important. An important facet of economy will be that of fiber recovery. A one-hundred kilometer bare optical fiber will cost, in 2010 dollars, between twenty and thirty thousand dollars depending on its characteristics and core diameter. This price may be reduced significantly with large quantity purchases and improvements in long-fiber extrusion manufacturing techniques. Nonetheless, it will remain essential for commercial launch operations to reuse that fiber as many times as possible. A bare one-hundred kilometer fiber extended in a typical parabolic launch trajectory will take a substantial time to fall through the atmosphere (on the order of more than an hour from the highest point) owing to its small diameter and low descent terminal velocity. A large, servo-controlled drum spooler 622 can be used to engage the fiber immediately after launch and reel the fiber back in before it can hit the ground. The physics for this are well within the limits of current mechanical systems design and available materials. The drum spooler 622 is not used during launch; it is strictly used for retrieval of the fiber after launch and does not engage nor wrap any of the launch fiber until it has been fully spooled out by the launch vehicle. In the notional example shown in FIG. 18, the high power fiber 566 coming from the laser 518 can be advantageously latched to drum 622 at high energy connector 624, which mates to connector 626 which is rigidly affixed to drum 622. Following a launch, connector 626 can be disconnected from connector 624 and the drum 622 will be free to begin the fiber retrieval process. With proper design, the fiber can be post-processed, cleaned, and re-wound for a subsequent series of launches.

FIG. 19 shows an embodiment in which one or more fiber spooler assemblies 628 reside on the centerline of the launch vehicle. The fiber 630 connected to the laser source not shown is protected by fiber guide 632, which protects the fiber 630 from direct thruster plume impingement that might otherwise damage the fiber 630. The fiber 634 from the inboard side of the fiber spooler 628 connects to high power fast rotary beam switch assembly 636 at its centerline. The beam is expanded through optical system 638 whereupon the beam impinges on the high speed indexed rotary mirror 640 at the switch centerline. Servo motor 642 is connected to a high speed, high stiffness rotary shaft 644, the rotational position of which is sensed by embedded rotational encoders. The rotation of shaft 644 causes high speed indexed rotary mirror 640 to direct the coherent laser energy to a plurality of fixed, static mirrors 646 and 656 arrayed radially around the central high speed indexed rotary mirror 640. When the beam is directed to the fixed, static mirror 646, the fixed, static mirror causes the laser energy 648 to be deflected to beam focusing optics 650, which in turn inject the beam into coupler 652 for subsequent transmission to thruster 654. If high speed indexed rotary mirror 640 is subsequently rotated until it aligns with high energy fixed, static mirror 656, the beam is then diverted to exit fiber 658, which carries the optical energy to thruster assembly 660. The light enters thruster assembly 660 via laser optics cavity 662, where the beam is either focused or defocused as previously discussed (with reference to FIG. 18) for the purpose of optimal heating of heat exchanger or plasma cavity 664. Working fluid 666 enters heat exchanger 664 and is subsequently heated and expanded through nozzle 668 to create thrust 670. In this fashion any number of axially centered fiber spoolers can deliver power to a radial array of thrusters. Advantageously, as will be described below, three or more thrusters equally distributed radially (for example, three thrusters would have one-hundred twenty degrees of angular spacing between them relative to the launch vehicle centerline) allow for a significant simplification of the vehicle while still enabling full thrust vector control during launch.

Thrusters 654, 660 are advantageously canted at a desired divergence angle 672 from centerline so as to further reduce the possibility of impingement of the exhaust plume from these thrusters with the trailing fiber. Further, by canting the thrusters 654, 660 and using three or more thrusters, it is possible to achieve active thrust vectoring of the launch vehicle with no moving parts associated with the thrusters 654, 660. The high power fast rotary beam switch assembly 636 is capable of rapidly transferring power to a specific thruster based on a desired vehicle direction. For direct, straight ascent, the laser is rapidly shifted between thrusters so that all thrusters receive equal amounts of power and, therefore, each nominally produces symmetric thrust and the vehicle will maintain the instant tangent trajectory that it was on. However, even with dissimilar (or physically identical but variably performing) thrusters, an onboard computer control system can rapidly generate a real-time vehicle state vector matrix and from that determine which thruster to favor in order to divert the vehicle to the desired trajectory.

FIG. 20 shows another preferred embodiment of the fiber laser launch concept. In this variant, a plurality of fiber spoolers 674 arrayed in a radial fashion about the centerline of the vehicle delivers power to a series of laser injection systems or assemblies 676. A high energy bare fiber 678 trails behind the vehicle during launch and connects to a ground-based laser (not shown). Fiber guides 680 protect the trailing fibers from direct exhaust plume impingement from the thruster. The spoolers 674 are connected via fiber 682 to actively cooled high power couplers 684, which inject the beam into the laser optics cavity 686 via laser injection assemblies 676. Beam forming optics 687 contained in each injection assembly 676 are independently controlled in real-time to provide either a focused or diffuse output into the heat exchanger or plasma zone 688 at the core of the laser optics cavity 686 wherein a working fluid, injected at port 690 is superheated and expands through expansion nozzle 692 to create thrust 694. In this embodiment, one or more thrusters 696 are centrally located either on centerline or arrayed symmetrically, radially, or otherwise about the vehicle centerline so as to create a central thrust capability. One or more of these thrusters may be additionally gimbaled so that its thrust vector can be modified under real-time computer control to maintain the vehicle on a desired ascent trajectory.

Notably, hybrid variants of the inventions described in FIGS. 18-20 are possible in which fast beam switches and beam splitters are used to combine many laser inputs and channel them to many thruster outputs. These techniques can be used to boost larger payloads. Telemetry from the vehicle to the ground, or conversely from radar tracking of the ascent vehicle, can be used to determine the instant state vector for the launch vehicle. This can be used as the basis of corrective algorithms for steering the vehicle back to a correct course. The vehicle can optionally have onboard a navigation system consisting of either purely inertial sensors, a GPS (global positioning system) receiver, or other methods for estimating the position of the vehicle at any point in time and that information can be sent back in real-time to a mission control computer either via radio (RF) telemetry or via modulated data signal superimposed on the laser power transmission fiber. This technique advantageously eliminates several systems from the mass of the launch vehicle and it allows for direct non-line-of-sight communications to the vehicle, possibly for over-ride of the onboard trajectory control or for range-safety termination of the launch.

Another variation on fiber laser launch is that of an intelligent autonomous battlefield delivery system. This is far more effective than, e.g., a GPS-guided artillery shell for several reasons. First, the range for a laser-powered payload is in excess of one-hundred kilometers and more likely on the order of two-hundred kilometers given that realistic fiber spoolers can be up to one-hundred kilometers long and, if the payload separates at apogee, then it will ballistically coast approximately that same distance. However, up until the point of fiber separation it will be possible, again via modulated data on the power fiber, or on a dedicated separately spooled fiber, to communicate with the payload and to cause it to be re-directed. A forward scouting team could provide such a system with real-time GPS coordinates (even if moving), which could be uploaded to the payload for real-time re-targeting. Further, there is no requirement for a maximum thrust flight nor for a ballistic trajectory. The fiber laser launch concept permits flight down to minimum stable flight speed as well as "loitering" in a vicinity—made possible because the power source is continuous and substantial, and located at a rear base of operations. This means that the flight vehicle's dwell (or "loiter") time in an area of operations could be made indefinite and the vehicle would not be required to carry with it any fuel (because at low altitude, atmospheric air can be the "working fluid" for propulsion). Because the flight speed can be made variable, and arbitrarily low if needed, sensitive supplies could also be sent to a forward operations team (human) with precision delivery capability.

Figure 21:
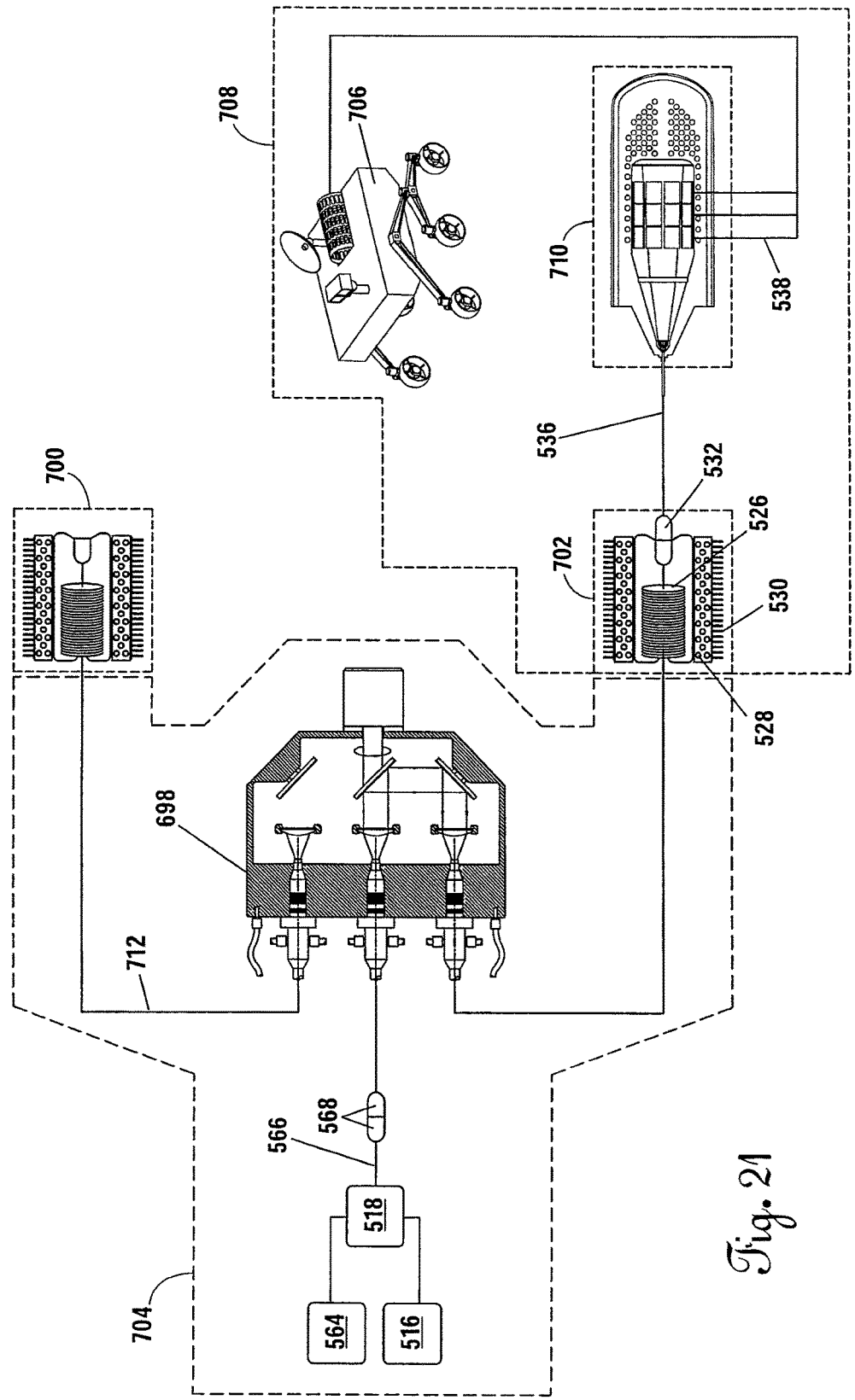
FIG. 21 shows an embodiment using a rotary beam switch with multiple spoolers.

FIG. 21 shows another variation of the invention in which a rotary beam switch 698 is placed between the laser source 518 and an array of two or more spoolers 700, 702. These spoolers 700, 702 are advantageously located on docking ports adjacent the central power supply and laser facility 704 such that a mobile autonomous vehicle 706 could return automatically following a mission (after having expended its one-use spooler) and dock with a port containing a full spooler. At that point the vehicle 706 could re-load a fresh spooler by removing it from the docking port and latching it onto a receiver port on the mobility system 708, thus re-enabling it for another mission.

As an example, the mobility system 708 would begin a mission using fiber spooler 702 which, as previously explained, is connected to a power conversion system 710, which generates electrical power or alternative power to cause the mobility system 708 to move. At the conclusion of a mission, mobility system 708 returns to the central power laser source 704 and discards spooler 702 and, while operating on residual onboard electrical power storage systems, moves to the docking port that contains a second spooler 700. It then acquires that spooler 700, connects to it, and notifies the laser that power can now be transmitted through that spooler. The main computer system at the laser source 704 then causes beam switch 698 to re-route the laser energy to the port that connects the power to spooler 700 with fiber 712. This is a viable multi-mission-enabling design that permits re-load of a single vehicle (e.g., a planetary robotic exploration vehicle returning to a lander) for subsequent missions while maintaining the heavy elements of the system (power source and laser) on the lander. However, this same approach can also be used to sequentially send power to a plurality of mobility systems (e.g., autonomous ground vehicles on a battlefield or forming a defensive perimeter around a forward base of operations).

Variations of this same theme are possible in which the mobility platform 708 carries multiple fiber spools and can autonomously connect to an available laser power docking station which contains an appropriate high power laser coupler. In this fashion, the vehicle could utilize the presence of multiple laser power sources and transfer from one to another while still having an operational radius with respect to each laser power source. An example of a situation where this may prove advantageous would be the exploration of the Ross Ice Shelf in Antarctica, where a surface-based traverse vehicle could carry a single laser source to a new location at the limit of the fiber spooler carried by the vehicle. By drilling a new access shaft and lowering a new laser coupler, the vehicle—temporarily operating on onboard stored power—could rendezvous and dock with the new coupler, activating a fresh spool of fiber carried by the vehicle, and, hence, begin a new period of exploration relative to the new location of the laser power source. Another application of the present invention contemplates a small array of such laser power stations located on floating buoys in the ocean with armored fiber cables carrying the beam to subsea docking stations wherein an underwater vehicle (autonomous or manned) could dock with the coupler and, using a new vehicle-carried spooler, continue on a new journey of science and exploration.

Figure 22:
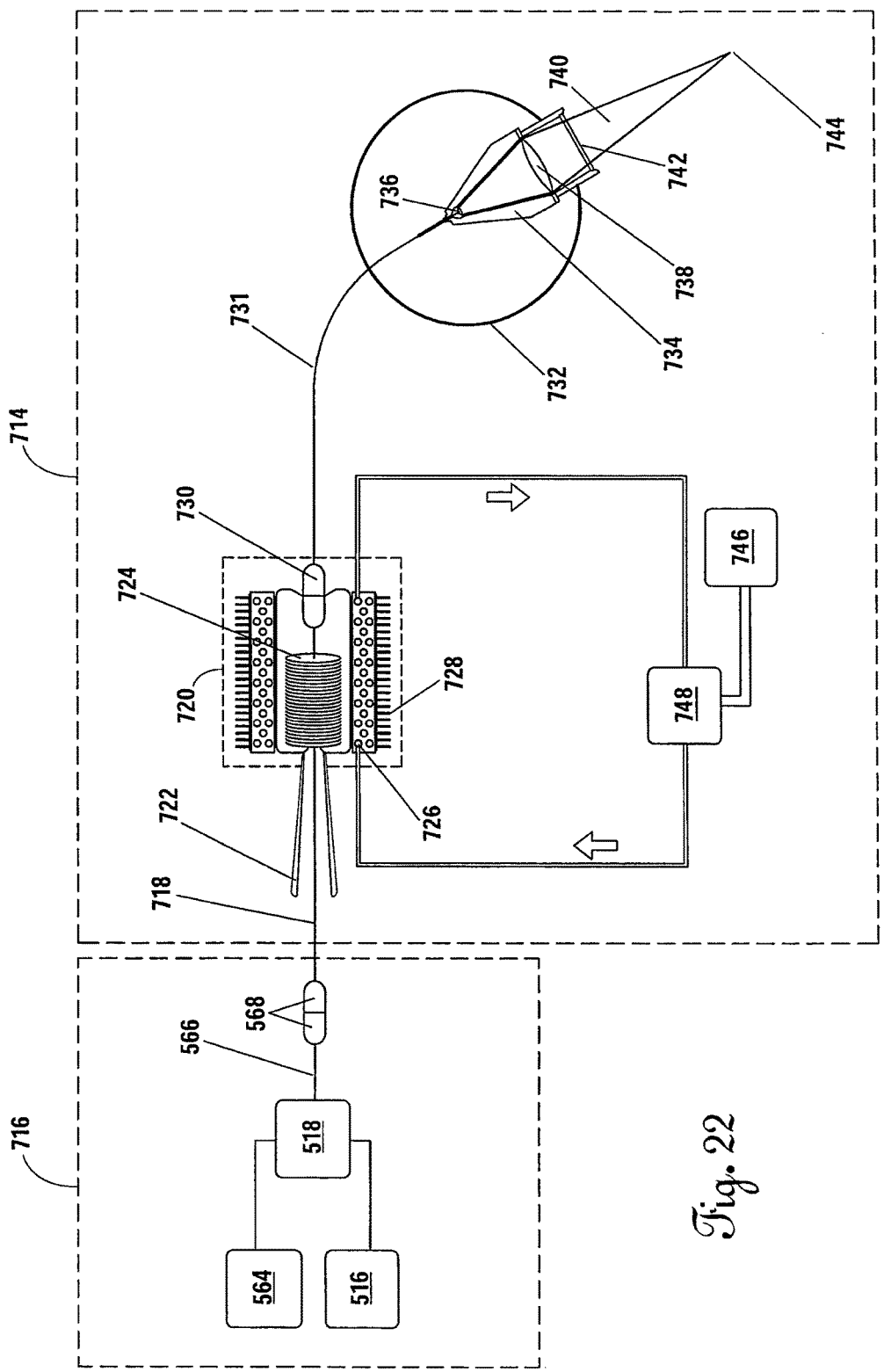

FIG. 22 presents another embodiment in which a remote mobility system 714 (which will be explained within the context of an unmanned aerial vehicle but it could also be an unmanned ground vehicle system, underwater system, or a manned variant of any of those) again receives coherent laser energy, generated by a forward base power system 716 comprising a power generation system 516 and a laser cooling system 564 connected by cooling and power delivery channels to a high power fiber laser 518; high power delivery fiber 566 and leading to fiber coupler 568. Bare fiber 718 from an on-vehicle spooler 720 trails out through fiber pay-out guard 722, which prevents the trailing fiber 718 from being damaged by vehicle locomotion means. The fiber spooler 720 contains, as previously described, a spool 724 (precision-wound axial for aerial operations and drum-spool wound for ground and underwater applications, preferably or any variant thereof using the previously described fiber payout means); an actively cooled heat exchanger 726; a passive heat radiator 728, and a high power fiber coupler 730 that connects the spooler 720 in a modular fashion to the vehicle.

In this embodiment, the primary power of the laser 518 is intended for industrial or military purposes and the output of the fiber spooler 720 is connected by output fiber 731 to a laser targeting ball 732. The targeting ball 732 contains a real-time active beam focusing structure 734 that contains a diverging lens means 736 and a real-time variable range focusing lens means 738, which causes high energy beam 740 to pass through optional laser window 742 and to be focused at a point 744 beyond the vehicle that is to be determined by other sensors onboard the vehicle. The vehicle carries an auxiliary power unit (APU) 746 that provides dedicated power to cooling system 748 that maintains the fiber spooler 720 within its optimal operating temperature range throughout a mission. Two or more parallel fibers may run to this vehicle: one carrying optical power for direct use by the laser targeting ball 732 and a second one for use in powering the locomotion of the mobility platform.

FIG. 23 shows an unmanned aerial vehicle 750 comprising of primary wing structures 752; stabilizer fins 754; propulsion air intake 756; and propulsion unit 758. The vehicle 750 is retrofitted with a lower stabilizer fin 754 towards the rear of the vehicle 750 that serves as a mounting post for high power fiber spooler 762 (although this mechanism may be mounted anywhere on the vehicle provided the mounting location prevents interaction or entanglement, and thus breakage, of the fiber with the propulsion means). The fiber spooler 762, as previously described, has a high thermal conductivity regeneratively cooled heat exchanger 760 and is equipped with a fiber pay-out guard 764 that prevents the trailing fiber 766 from being interfered or damaged by the propulsion unit 758. The fiber 766 from spooler 762 leads forward through the fuselage of the UAV 750 where it connects to laser head 768. Beam focusing optics cause laser radiation 770 to focus on point 771 external to the vehicle 750.

The vehicle 750 is assumed to be equipped with a reconnaissance, surveillance, and target acquisition (RSTA) ball 772 or its functional equivalent, which surveys the field of action using a variety of sensing technologies and conveys that information to onboard avionics control and targeting system 774. The targeting system, in turn, causes the laser targeting ball 768 to lock its orientation in real-time to the target point 771 designated by the RSTA ball 772. Feedback between these two systems can be used to actively re-target beam 770 in real-time pending live assessment by RSTA ball 772 and the vehicle onboard pose estimator (which produces real-time estimates of both position and attitude). Knowing all of these pieces of information allows for the beam to be targeted, and remain on target, to a geographical fixed position regardless of the vehicle platform's position and attitude.

While the vehicle 750 disclosed in FIG. 23 is largely a battlefield device, the same components installed in an autonomous underwater vehicle could be used effectively for removal of obsolete oil production platforms (by offering a precise means of cutting off large tubular steel column elements) without the need for dangerous commercial human diving operations, which is presently the rule for such work.

Other variants on this same theme include: 1) surface-based and subterranean mining operations (where a high intensity beam will cause rock to heat and fracture, making it possible to easily remove material of interest. While there have been attempts to use down-hole lasers in drilling operations, no one has attempted to have a mobile robot laying its own power fiber while it goes to work); 2) on mobile ground and aerial vehicles for military applications: a focused targeted beam can be used for local theater "shoot down" applications (e.g., defending against other drones while not having humans in the area); 3) on mobile ground, underwater, and aerial vehicles for salvage operations (e.g., cutting pieces off for removal); and 4) on mobile ground and aerial vehicles for demolition (e.g., collapsing an old and dangerous bridge or building).

The present invention is described in terms of a preferred illustrative embodiment and alternative embodiments of specifically-described apparatuses and systems. Those skilled in the art will recognize that yet other alternative embodiments of such apparatus and systems can be used in carrying out the present invention. Other aspects, features, and advantages of the present invention may be obtained from a study of this disclosure and the drawings, along with the appended claims.

We claim:

1. An optical power transfer system for launching a spacecraft into low Earth orbit comprising:
   a ground-based laser power generation station comprising:
      a high power source;
      a chilling station;
      a laser connected to said high power source and said chilling station;
      an optical fiber connected to said laser at a first end and to said launch vehicle at a second end; and
      at least one coupler connected to said optical fiber, said at least one coupler positioned inline between said laser and said launch vehicle; and
   a launch vehicle optically connected to said ground-based laser power generation station, said launch vehicle comprising:
      an actively cooled fiber spooler mounted on said launch vehicle;
      a length of fiber for transmission of high optical energy, said length of fiber circumscribing at least part of said actively cooled fiber spooler and wherein said optical energy received by said launch vehicle is converted to another form of energy usable by said launch vehicle;
      a thruster assembly optically connected to said actively cooled fiber spooler;
      an air intake in fluid communication with said actively cooled fiber spooler and with said thruster assembly; and
      a storage chamber in fluid communication with said actively cooled fiber spooler and with said thruster assembly; and wherein said optical connection between said launch vehicle and said ground-based laser power generation station may be direct non-line-of-sight communication.

2. The system of claim 1 wherein said ground-based laser power generation station is capable of generating high optical power in the range of kilowatts to tens of megawatts.

3. The system of claim 2 wherein said thruster assembly further comprises:
   a laser injection interface;
   a plurality of beam forming optics optically connected to said laser injection interface;
   a reaction chamber optically connected to said plurality of beam forming optics;
   a refractory target contained within said reaction chamber; and
   a nozzle connected to and extending distally from said reaction chamber, said nozzle directing thrust generated away from said launch vehicle.

4. The system of claim 3 further comprising an inline coupler optically connected to a second length of fiber, said inline coupler positioned between said actively cooled fiber spooler and said thruster assembly.

5. The system of claim 4 further comprising a working fluid.

6. The system of claim 5 wherein said working fluid is stored in said storage chamber.

7. The system of claim 3 wherein said refractory target is a plasma core impinged by a focused beam.

8. The system of claim 3 wherein said refractory target is a plurality of heat exchangers impinged by an expanded beam.

9. The system of claim 2 wherein said ground-based laser power generation station further comprises a drum spooler.

10. The system of claim 9 wherein said drum spooler is servo-controlled.

11. The system of claim 10 wherein said drum spooler is actively cooled.

12. An optical power transfer system for launching a multiple thruster spacecraft into low Earth orbit comprising:
   a high power laser source;
   a launch vehicle;
   at least one actively cooled fiber spooler mounted on said launch vehicle and optically connected to said high power laser source;
   a first optical fiber connected at one end to said high power laser source and at the other end to said at least one actively cooled fiber spooler, said at least one actively cooled fiber spooler having a length of said first optical fiber circumscribing at least part thereof;
   a fiber guide extending distally from said at least one actively cooled fiber spooler, said fiber guide radially enclosing a portion of said first optical fiber;
   a beam switch assembly optically connected to said at least one actively cooled fiber spooler;
   an inline optical coupler optically connected at one end to said at least one actively cooled fiber spooler and optically connected to said beam switch assembly at the opposite end; and
   a plurality of thruster assemblies optically connected to said beam switch assembly.

13. The optical power transfer system for launching a multiple thruster spacecraft into low Earth orbit, as recited in claim 12, wherein said beam switch assembly further comprises:
   at least one coupler optically connected to said at least one actively cooled fiber spooler;
   at least one beam forming optics for transmission of high optical energy transmitted from said at least one coupler;
   a rotary mirror centrally positioned to receive said high optical energy, said rotary mirror being angled to reflect said high optical energy received;

a plurality of fixed mirrors arrayed radially about said rotary mirror, said plurality of fixed mirrors angled toward said rotary mirror;

a rotary shaft connected to said rotary mirror; and a servo motor for actuating said rotary shaft to rotate said rotary mirror.

14. The optical power transfer system for launching a multiple thruster spacecraft into low Earth orbit, as recited in claim 13, wherein said at least one coupler is optically connected to said plurality of thruster assemblies.

15. The optical power transfer system for launching a multiple thruster spacecraft into low Earth orbit, as recited in claim 14, wherein said plurality of thruster assemblies further comprises:

a laser injection interface optically connected to said beam switch assembly;

a plurality of beam forming optics optically connected to said laser injection interface;

a reaction chamber optically connected to said plurality of beam forming optics;

a refractory target contained within said reaction chamber; and a nozzle connected to and extending distally from said reaction chamber, said nozzle directing thrust generated away from said launch vehicle.

16. The optical power transfer system for launching a multiple thruster spacecraft into low Earth orbit, as recited in claim 15, wherein said refractory target is a plasma core impinged by a focused beam.

17. The optical power transfer system for launching a multiple thruster spacecraft into low Earth orbit, as recited in claim 15, wherein said refractory target is a plurality of heat exchangers impinged by an expanded beam.

18. The optical power transfer system for launching a multiple thruster spacecraft into low Earth orbit, as recited in claim 15, wherein said plurality of thruster assemblies are equally distributed radially about a centerline of said vehicle, said plurality of thruster assemblies canted at a predetermined divergence angle from said centerline.

19. An optical power transfer system for launching a multiple thruster spacecraft into low Earth orbit comprising:

a high power laser source;

a plurality of fiber spoolers;

a first plurality of fiber having a first end connected to said high power laser source and a second end connected to said plurality of fiber spoolers;

a plurality of fiber guides extending distally from said plurality of fiber spoolers, said plurality of fiber guides partially enclosing said first plurality of fiber;

a plurality of laser injection assemblies in optical communication with said plurality of fiber spoolers;

a second plurality of fiber having a first end connected to said plurality of laser injection assemblies and a second end connected to said plurality of fiber spoolers;

at least one coupler positioned inline between said plurality of fiber spoolers and said plurality of laser injection assemblies; and at least one thruster assembly in optical communication with said plurality of laser injection assemblies; wherein said plurality of laser injection assemblies further comprises beam forming optics for directing optical energy received from said at least one coupler into at least one thruster assembly.

20. The optical power transfer system for launching a multiple thruster spacecraft into low Earth orbit, as recited in claim 19, wherein said at least one thruster assembly further comprises:

a reaction chamber optically connected to said beam forming optics;

a refractory target contained within said reaction chamber; and a nozzle connected to and extending distally from said reaction chamber, said nozzle directing thrust generated away from said launch vehicle.

21. The optical power transfer system for launching a multiple thruster spacecraft into low Earth orbit, as recited in claim 20, wherein said refractory target is a plasma core impinged by a focused beam.

22. The optical power transfer system for launching a multiple thruster spacecraft into low Earth orbit, as recited in claim 20, wherein said refractory target is a plurality of heat exchangers impinged by an expanded beam.

23. The optical power transfer system for launching a multiple thruster spacecraft into low Earth orbit, as recited in claim 20, wherein said plurality of fiber spoolers is radially arrayed about the centerline of the launch vehicle.

24. The optical power transfer system for launching a multiple thruster spacecraft into low Earth orbit, as recited in claim 23, wherein said at least one thruster assembly is positioned centrally about said centerline of said launch vehicle to create central thrust.

25. The optical power transfer system for launching a multiple thruster spacecraft into low Earth orbit, as recited in claim 23, wherein said at least one thruster assembly is arrayed symmetrically about said centerline of said launch vehicle to create central thrust.

26. The optical power transfer system for launching a multiple thruster spacecraft into low Earth orbit, as recited in claim 25, wherein said at least one thruster assembly is gimbaled.

* * * * *